(12) United States Patent
King et al.

(10) Patent No.: US 12,043,893 B2
(45) Date of Patent: Jul. 23, 2024

(54) MANUFACTURING PROCESSES TO SYNTHESIZE, FUNCTIONALIZE, SURFACE TREAT AND/OR ENCAPSULATE POWDERS, AND APPLICATIONS THEREOF

(71) Applicant: Forge Nano, Inc., Louisville, CO (US)

(72) Inventors: David King, Sudbury, MA (US); Arrelaine Dameron, Boulder, CO (US); James Trevey, Lafayette, CO (US); Paul Lichty, Louisville, CO (US); Andrew Argo, Westminster, CO (US); Kyle Bourgois, Arvada, CO (US); James Ragonesi, Denver, CO (US); Kyle Ingham, Denver, CO (US); David Jackson, Broomfield, CO (US); Ryon Tracy, Westminster, CO (US); Nghi Nguyen, Parker, CO (US); Adam Lyon, Lakewood, CO (US); Jose Villagomez, Erie, CO (US); Garrett Curry, Broomfield, CO (US)

(73) Assignee: Forge Nano, Inc., Thornton, CO (US)

( * ) Notice: Subject to any disclaimer, the term of this patent is extended or adjusted under 35 U.S.C. 154(b) by 1010 days.

(21) Appl. No.: 16/814,805

(22) Filed: Mar. 10, 2020

(65) Prior Publication Data

US 2020/0208266 A1   Jul. 2, 2020

Related U.S. Application Data

(63) Continuation of application No. 16/112,281, filed on Aug. 24, 2018, now abandoned.
(Continued)

(51) Int. Cl.
*C23C 16/455* (2006.01)
*B01J 2/00* (2006.01)
(Continued)

(52) U.S. Cl.
CPC ......... *C23C 16/45544* (2013.01); *B01J 2/006* (2013.01); *B22F 1/16* (2022.01);
(Continued)

(58) Field of Classification Search
CPC ............ C23C 16/45544; C23C 16/403; C23C 16/405; C23C 16/4417; C23C 16/442;
(Continued)

(56) References Cited

U.S. PATENT DOCUMENTS

| 4,990,371 A | 2/1991 | Dutta et al. |
| 6,428,861 B2 | 8/2002 | France et al. |

(Continued)

FOREIGN PATENT DOCUMENTS

| CN | 106086819 A | 11/2016 |
| EP | 2 767 337 A1 | 8/2014 |

(Continued)

OTHER PUBLICATIONS

International Search Report issued in PCT/US2018/047925, dated Nov. 15, 2018.
(Continued)

*Primary Examiner* — Kelly M Gambetta
(74) *Attorney, Agent, or Firm* — Frank Rosenberg

(57) ABSTRACT

A system, apparatus and method are provided for processing articles. The system includes subsystems for synthesizing, pre-treating, conducting a vapor phase coating process and post-treating articles in the form of powders and solid or porous workpieces. The apparatus permits vapor phase synthesis, treatment and deposition processes to be performed with high efficiency and at high overall throughput. The methods include converting solids, liquids or gases into gaseous and solid streams that can be separated or
(Continued)

exchanged with or without treatment and/or coating steps, and produce optimized composite articles for specific applications.

12 Claims, 17 Drawing Sheets

Related U.S. Application Data

(60) Provisional application No. 62/672,289, filed on May 16, 2018, provisional application No. 62/549,601, filed on Aug. 24, 2017.

(51) Int. Cl.
| | | |
|---|---|---|
| *B22F 1/16* | (2022.01) | |
| *C04B 41/81* | (2006.01) | |
| *C23C 16/40* | (2006.01) | |
| *C23C 16/44* | (2006.01) | |
| *C23C 16/442* | (2006.01) | |
| *C23C 16/52* | (2006.01) | |

(52) U.S. Cl.
CPC ............ *C04B 41/81* (2013.01); *C23C 16/403* (2013.01); *C23C 16/405* (2013.01); *C23C 16/4417* (2013.01); *C23C 16/442* (2013.01); *C23C 16/45555* (2013.01); *C23C 16/45561* (2013.01); *C23C 16/52* (2013.01); *B22F 2999/00* (2013.01)

(58) Field of Classification Search
CPC ........ C23C 16/45555; C23C 16/45561; C23C 16/52
See application file for complete search history.

(56) References Cited

U.S. PATENT DOCUMENTS

| | | | |
|---|---|---|---|
| 6,539,890 | B1 | 4/2003 | Felts |
| 6,602,547 | B2 | 8/2003 | Klinedinst et al. |
| 7,413,774 | B2 | 8/2008 | Kobrin et al. |
| 9,365,929 | B2 | 6/2016 | Dassel et al. |
| 9,546,424 | B2 | 1/2017 | King et al. |
| 2011/0236575 | A1* | 9/2011 | King ................ C23C 16/45555 118/712 |
| 2014/0162132 | A1 | 6/2014 | Ishii et al. |
| 2015/0075429 | A1 | 3/2015 | Park et al. |
| 2015/0125599 | A1 | 5/2015 | Lindfors et al. |

FOREIGN PATENT DOCUMENTS

| | | |
|---|---|---|
| JP | 2014170656 A | 9/2014 |
| JP | 6233219 B2 | 11/2017 |
| KR | 20090072438 A | 7/2009 |
| WO | 0196407 A3 | 12/2001 |

OTHER PUBLICATIONS

First Office Action from European Application No. 18765328 dated Oct. 6, 2021.
First Office Action from Chinese Application No. 201880069664 Aug. 4, 2021.
First Search from Chinese Application No. 201880069664 dated Jul. 26, 2021.
Machine translation of First Office Action from Chinese Application No. 201880069664, issued Aug. 4, 2021.
Office Action in Korean Application No. KR1020207008166A, dated Sep. 25, 2021.
Translation of Office Action in Korean Application No. KR1020207008166A, dated Sep. 25, 2021.
Office Action in Australian Application No. 2018320958 dated May 20, 2021.
Office Action in Japanese Application No. 2020532862, mailed May 11, 2021.
Search Report in Japanese Application No. 2020532862, dated Mar. 22, 2021.
Translation of Office Action in Japanese Application No. 2020532862, mailed May 11, 2021.
Machine translation of Description of KR20090072438A.
Machine translation of Description of JP6233219B2.
Machine translation of JP2014170656A.
Office Action in Japanese Application No. 2020532862 dated Mar. 15, 2022.
Machine Translation of Office Action in Japanese Application No. 2020532862 Mar. 15, 2022.
Office Action in Korean Application No. KR 10-2023-7016474, dated Jun. 12, 2023.
Translation of Office Action in Korean Application No. KR 10-2023-7016474, dated Jun. 12, 2023.
2nd Office Action in Korean Application No. 10-2023-7016474, dated Dec. 26, 2023.
Translation of 2nd Office Action in Korean Application No. 10-2023-7016474, dated Dec. 26, 2023.
Office Action in Japanese Application No. 2022-117180 date of mailing, Sep. 19, 2023.
Translation of Office Action in Japanese Application No. 2022-117180 date of mailing, Sep. 19, 2023.
Second Office Action in Japanese Application No. 2022-117180 date of mailing, Mar. 5, 2024.
Translation of Second Office Action in Japanese Application No. 2022-117180 date of mailing, Mar. 5, 2024.
Office action in U.S. Appl. No. 17/683,327 date of mailing Apr. 12, 2024.

* cited by examiner

Post-treatment Induced Diffusion

MANUFACTURING PROCESSES TO SYNTHESIZE, FUNCTIONALIZE, SURFACE TREAT AND/OR ENCAPSULATE POWDERS, AND APPLICATIONS THEREOF

CROSS-REFERENCE TO RELATED PATENT APPLICATIONS

This application is a continuation of U.S. patent application Ser. No. 16/112,281 filed Aug. 24, 2018, and claims the benefit of U.S. Provisional Application No. 62/549,601 filed Aug. 24, 2017 and U.S. Provisional Application No. 62/672,289 filed May 16, 2018, the disclosure of each of which is incorporated herein by reference in its entirety.

FIELD

The present technology generally relates to systems, apparatus and methods used for processing articles, and more particularly to the systems, apparatus and methods for depositing layers onto articles.

BACKGROUND

The incorporation of particles, powders and flowable objects from the millimeter-scale down to nanometers in size is ubiquitous in end-use products. A significant percentage of these materials used across all industries can be enhanced by upgrading or post-treatment processes that alter the surface properties of bulk materials without adversely affecting the properties of the bulk materials themselves. For a variety of reasons, each sector or industry has determined that the incorporation of coated particles, powders or flowable objects into the end-use product provides enough value-add in the performance of the product that the cost associated with each coating process is justified. Significant efforts have been undertaken over the past decades to increase the number and types of vaporizable precursors that can be available for such systems. However, there remain substantial challenges in delivering appreciable quantities of some of these materials into a synthesis or encapsulation unit operation in a reliable fashion.

The present technology is directed to overcoming these and other deficiencies.

SUMMARY

One aspect of many embodiments of the invention relates to an apparatus for treating the surface of a plurality of flowable articles with a vaporous precursor, the apparatus comprising a) a first chamber having at least one of each of a first solids phase inlet, a first solids phase outlet, a first vapor phase inlet and a first vapor phase outlet, b) a first solids phase valve or pump assembly in fluid communication with the first solids phase inlet of the first chamber, c) a first vapor phase valve or pump assembly adjacent to and in fluid communication with the first vapor phase inlet of the first chamber, d) a common signal hub, and e) at least one control system.

In at least one embodiment, at least one first solid phase inlet and at least one first solid phase outlet comprises a solid phase valve assembly or solid phase pump assembly having at least two actuation mechanisms configured for bidirectional control signal communication with a signal hub. In at least one embodiment, at least one first vapor phase inlet and at least one first vapor phase outlet comprises a vapor phase valve assembly or vapor phase pump assembly having at least one actuation mechanism, configured for bidirectional control signal communication with a signal hub. In at least one embodiment, said first chamber further comprises a first sensor network comprising two or more sensors, each sensor within said first sensor network configured for delivering one or more signals to a signal hub, said first sensor network configured to monitor the temperature, pressure and/or composition of a gaseous environment surrounding said articles. In at least one embodiment, at least one control system is configured for simultaneously sending a plurality of signals to, and receiving a plurality of signals from, one or more signal hubs, and provides a controllable unit for regulating material flows.

In at least one embodiment, the first chamber is configured to a) receive a solids phase comprising flowable articles having a definable specific surface area through one or more first solids phase inlets, b) dispense a solids phase comprising flowable articles having treated surfaces having a definable specific surface area through one or more first solids phase outlets, c) receive, create and/or accommodate a vapor phase comprising one or more reactive or non-reactive gases or precursors having a definable number of moles or molar flux through one or more first vapor phase inlets, and d) dispense a vapor phase comprising one or more reactive or non-reactive gases or byproducts having a definable number of moles or molar flux through one or more first vapor phase outlets.

In at least one embodiment, the apparatus further comprises at least one transport unit having one or more actuation mechanisms and configured for controlling the temperature, pressure and composition of a gaseous environment while regulating the material flow rate of a plurality of flowable articles. In at least one embodiment, the inlet of said transport unit is i) in fluid communication with at least one first solid phase outlet valve assembly or solid phase pump assembly, and ii) in bidirectional control signal communication with a signal hub, and one or more transport unit actuation mechanisms is configured for synchronous actuation with one or more first solid phase outlet valve assembly or solid phase pump assembly actuation mechanisms.

In at least one embodiment, the apparatus further comprises a second chamber comprising a) at least one of each of a second solids phase inlet, a second solids phase outlet, a second vapor phase inlet and a second vapor phase outlet, b) a second solids phase valve or pump assembly in fluid communication with the second solids phase inlet of the second chamber, c) a second vapor phase valve or pump assembly adjacent to and in fluid communication with the second vapor phase inlet of the second chamber, and d) a common signal hub. In at least one embodiment, at least one second solid phase inlet and at least one second solid phase outlet comprises a solid phase valve assembly or solid phase pump assembly having at least two actuation mechanisms configured for bidirectional control signal communication with a signal hub. In at least one embodiment, at least one second vapor phase inlet and at least one second vapor phase outlet comprises a vapor phase valve assembly or vapor phase pump assembly having at least one actuation mechanism, configured for bidirectional control signal communication with a signal hub. In at least one embodiment, said second chamber further comprises a second sensor network comprising two or more sensors, each sensor within said second sensor network configured for delivering one or more signals to a signal hub, said second sensor network configured to monitor the temperature, pressure and/or composition of a gaseous environment surrounding said articles.

In at least one embodiment, wherein at least one control system is configured for sending and receiving a plurality of signals simultaneously to and from one or more signal hubs and provides a controllable unit for regulating material flows.

In at least one embodiment, the second chamber configured to a) receive a solids phase comprising flowable articles having a definable specific surface area through one or more second solids phase inlets, b) dispense a solids phase comprising flowable articles having treated surfaces having a definable specific surface area through one or more second solids phase outlets, c) receive, create and/or accommodate a vapor phase comprising one or more reactive or non-reactive gases or precursors having a definable number of moles or molar flux through one or more second vapor phase inlets, and d) dispense a vapor phase comprising one or more reactive or non-reactive gases or byproducts having a definable number of moles or molar flux through one or more second vapor phase outlets.

In at least one embodiment, the apparatus further comprises at least one transport unit having one or more actuation mechanisms and configured for controlling the temperature, pressure and composition of a gaseous environment while regulating the material flow rate of a plurality of flowable articles. In at least one embodiment, the inlet of said transport unit is i) in fluid communication with at least one first solid phase outlet valve assembly or solid phase pump assembly, and ii) in bidirectional control signal communication with a signal hub, and the one or more transport unit actuation mechanisms is actuated synchronously with one or more first solid phase outlet valve assembly or solid phase pump assembly actuation mechanisms.

In at least one embodiment, the outlet of said transport unit is i) in fluid communication with at least one second solid phase inlet valve assembly or solid phase pump assembly, and ii) in bidirectional control signal communication with a signal hub. In at least one embodiment, one or more transport unit actuation mechanisms is actuated synchronously with one or more second solid phase inlet valve assembly or solid phase pump assembly actuation mechanisms.

In at least one embodiment, one or more transport unit actuation mechanisms is actuated synchronously with one or more first solid phase outlet valve assembly or solid phase pump assembly actuation mechanisms, and with one or more second solid phase inlet valve assembly or solid phase pump assembly actuation mechanisms.

In at least one embodiment, the apparatus further comprises a plurality of control systems and a master control system configured to simultaneously control said plurality of control systems.

In at least one embodiment, the apparatus further comprises a plurality of signal hubs and a common signal hub configured to aggregate the signals to and from said plurality of signal hubs.

In at least one embodiment, each actuation mechanism on a valve assembly or pump assembly comprises one or more of: i) an instantaneous opening, ii) an instantaneous closing, iii) the controlled opening over a programmable time constant, iv) controlled closing over a programmable time constant, v) the expansion of a subcomponent to reduce the conductance through the assembly, vi) the contraction of a subcomponent to increase the conductance through the assembly, vii) a concave or convex deflection of a subcomponent, viii) rotation of a subcomponent co-linear with the direction of solid material flow, ix) rotation of a subcomponent tangential to the direction of solid material flow, x) an instantaneous increase in conductance to a position less than fully open, xi) an instantaneous decrease in conductance to a position greater than fully closed, xii) the actuation of a piston or piston-like subcomponent, xiii) an actuation delivering a secondary phase to promote aeration, contraction or expansion of the primary phase unit volume, or xiv) an actuation mechanism initiated by the electrical application of a sinusoidal, dirac function, triangular or rectangular waveform over one or more programmable time constants.

In at least one embodiment, at least one actuation mechanism of any one or more solid phase valve assembly or solid phase pump assembly is configured to be initiated synchronously with any one or more actuation mechanism of any one or more vapor phase valve or pump assembly.

In at least one embodiment, at least one actuation mechanism of any one or more solid phase valve assembly or solid phase pump assembly of the first chamber is configurable to be initiated synchronously with any one or more actuation mechanism of any one or more vapor phase valve assembly or vapor phase pump assembly of the first chamber. In at least one embodiment, at least one actuation mechanism of any one or more solid phase valve assembly or solid phase pump assembly of the second chamber is configurable to be initiated synchronously with any one or more actuation mechanism of any one or more vapor phase valve or pump assembly of the second chamber. In at least one embodiment, at least one actuation mechanism of any one or more solid phase valve assembly or solid phase pump assembly of the second chamber is configurable to be initiated synchronously with any one or more actuation mechanism of any one or more solid phase valve assembly or solid phase pump assembly of the first chamber.

In at least one embodiment, the at least one control system is configured for machine learning.

Another aspect of many embodiments of the invention relates to a method for executing a first surface treatment process on a plurality of flowable articles comprising a) providing a plurality of flowable articles having a provided, estimated, measured or known specific surface area to a first chamber, and entering said specific surface area into at least one control system, b) entering a nominal target for the quantity, mass or unit volume of flowable articles to be processed into the control system of a surface treatment system, thereby defining a first total surface area target c) providing a reactive precursor with which to treat the surfaces of said plurality of flowable articles, and entering into said control system the provided, estimated, measured or known number of moles of a reactive precursor required to saturate, react with or treat the entirety of the first total surface area target using empirical or estimated process conditions, thereby defining a complete saturation quantity, and d) selecting a target saturation ratio, to obtain a process recipe for a batch, semi-batch, semi-continuous or continuous surface treatment process, wherein said process recipe comprises at least one target pressure level associated with said target saturation ratio.

In at least one embodiment, the method further comprises e) administering a target quantity, mass or unit volume of flowable articles and a gas-phase environment into a first chamber through one or more first solid phase inlets having two or more actuation mechanisms, wherein a first actuation mechanism effectuates the transport of a predominantly gas-phase comprising gas-solids composition, and wherein a second actuation mechanism effectuates the transport of a predominantly solids-phase comprising gas-solids composition, and f) subsequently administering a vapor phase comprising a target number of moles of one or more reactive or non-reactive gases or precursors to said first chamber through one or more first vapor phase inlets having one or more actuation mechanisms, wherein a first actuation mechanism effectuates the transport of said vapor phase, under conditions suitable to effectuate a surface treatment reaction, while preventing the solids phase from exiting said first chamber.

In at least one embodiment, the method further comprises g) administering a vapor phase comprising a target number of moles of one or more reactive or non-reactive gases or precursors to a first chamber through one or more first vapor phase inlets having one or more actuation mechanisms, wherein a first actuation mechanism effectuates the transport of said vapor phase, under conditions suitable to effectuate a surface treatment reaction, and h) subsequently administering a target quantity, mass or unit volume of flowable articles and a gas-phase environment into said first chamber through one or more first solid phase inlets having two or more actuation mechanisms, wherein a first actuation mechanism effectuates the transport of a predominantly or completely gas-phase comprising gas-solids composition, and wherein a second actuation mechanism effectuates the transport of a predominantly solids-phase comprising gas-solids composition.

In at least one embodiment, the method further comprises i) administering a target quantity, mass or unit volume of flowable articles and a gas-phase environment into a first chamber through one or more first solid phase inlets having two or more actuation mechanisms, wherein a first actuation mechanism effectuates the transport of a predominantly gas-phase comprising gas-solids composition, and wherein a second actuation mechanism effectuates the transport of a predominantly solids-phase comprising gas-solids composition, and j) synchronously administering a vapor phase comprising a target number of moles of one or more reactive or non-reactive gases or precursors to said first chamber through one or more first vapor phase inlets having one or more actuation mechanisms, wherein a first actuation mechanism effectuates the transport of said vapor phase, under conditions suitable to effectuate a surface treatment reaction, while preventing the solids phase from exiting said first chamber.

In at least one embodiment, the method further comprises one or more of k) monitoring the signals from one or more pressure measurement sensors, and incorporating a unit to increase the residence time, allowable mixing time and/or the interdiffusion rate of the gaseous and solids phases, until said target pressure level is achieved, l) evacuation of gaseous and solid materials synchronously, asynchronously, sequentially, and/or periodically, through one or more outlets and into a transport unit, and in relation to the predominant actuation mechanism ascribed to each phase, and m) characterizing the treated solid materials for one or more of: a surface treatment loading, a specific surface area after treatment, or a particle size or size distribution after treatment, and entering these into the control system to incorporate machine learning.

In at least one embodiment, the method further comprises n) evacuating gaseous and solid materials synchronously, asynchronously, sequentially, and/or periodically, through one or more outlets and into a transport unit, and in relation to the predominant actuation mechanism ascribed to each phase, and o) initiating a second surface treatment process by administering a target quantity, mass or unit volume of flowable articles and a gas-phase environment into a second chamber through one or more second solid phase inlets having two or more actuation mechanisms, wherein a first actuation mechanism effectuates the transport of a predominantly gas-phase comprising gas-solids composition, and wherein a second actuation mechanism effectuates the transport of a predominantly solids-phase comprising gas-solids composition. In at least one embodiment, said second surface treatment process in said second reactor chamber utilizes one or more of a different reactive precursor, a different operating pressure, a different operating temperature, a different residence time, or different other process parameter than was used for said first surface treatment process.

In at least one embodiment, the first surface treatment process comprises one or more of an atomic layer deposition process, a molecular layer deposition process, a chemical vapor deposition process, a physical vapor deposition process, a molecular layering process, an atomic layer chemical vapor deposition process, an epitaxial deposition process, a chemical grafting process, an atomic layer etching process, an atomic layer corrosion process, an atomic layer combustion process, or a combination thereof.

In at least one embodiment, the method further comprises a subsystem configured to carry out one or more of a flame spray process, a combustion spray process, a plasma spray process, a spray drying process, or combinations thereof.

In at least one embodiment, the method further comprises a subsystem configured to control the nominal value and the rate of change of one or more of i) a treatment pressure, ii) a treatment temperature, iii) a gas phase composition or flow rate, iv) a liquid phase composition or flow rate, v) a solute or solvent composition or flow rate, and vi) a solid phase composition or flow rate.

In at least one embodiment, the method comprises a subsystem to synthesize or receive an article, a subsystem to treat the surfaces of an article, and a subsystem to apply a coating to the surfaces of an article.

In at least one embodiment, the method is suitable for processing a plurality of composite articles synchronously, wherein the flowable articles comprise one or more discrete particles, powders, extrudates, granules, flowable objects. In at least one embodiment, the method is suitable for processing an object having a largest dimension less than 125 millimeters in size, and wherein the surfaces of at least 75% of said composite articles are coated or treated upon exiting the system.

In at least one embodiment, the method is configured to produce materials suitable for use in a battery, a fuel cell, a catalyst, a capacitor, a pharmaceutical ingredient, a passive electronic component, a solar cell, a 3D printer, a semiconductor device, an integrated circuit, an optoelectronic device, a thermoelectric device, a thermionic device, an electrochemical device, a biomedical device, or an electromechanical device.

In at least one embodiment, the method is configured to utilize a precursor comprising phosphorous, sulfur, nitrogen, carbon, fluorine, chlorine, bromine or iodine. In at least one embodiment, the precursor comprises a phosphide, a phosphate, a sulfide, a sulfate, a nitrate, a fluoride, a chloride, a bromide or an iodide.

In at least one embodiment, the method further comprises one or more of a common precursor delivery subsystem, a precursor delivery enhancement subsystem, or an exhaust treatment or recycling subsystem.

In at least one embodiment, a machine learning algorithm calculates a subprocess deviation from modeled or empirical data with information derived from one or more of a direct in-situ signal, an indirect in-situ signal, a direct ex-situ signal or an indirect ex-situ signal.

Another aspect of many embodiments of the invention relates to an atomic layer deposition apparatus for processing articles comprising a) a first chamber having at least one of each of a first solids phase inlet, a first solids phase outlet, a first vapor phase inlet and a first vapor phase outlet, b) a second chamber having at least one of each of a second solids phase inlet, a second solids phase outlet, a second vapor phase inlet and a second vapor phase outlet, c) a first solids phase valve assembly or solids phase pump assembly in fluid communication with said first solids phase inlet of said first chamber, said first solid phase valve assembly or solids phase pump assembly having at least two actuation mechanisms, d) a first vapor phase valve assembly or vapor phase pump assembly adjacent to and in fluid communication with said first vapor phase inlet of said first chamber, said first vapor phase valve assembly or vapor phase pump assembly having at least one actuation mechanism, e) a second solids phase valve assembly or solids phase pump assembly in fluid communication with said second solids phase inlet of said second chamber, said second solid phase valve assembly or solids phase pump assembly having at least two actuation mechanisms, f) a second vapor phase valve assembly or vapor phase pump assembly adjacent to and in fluid communication with said second vapor phase inlet of said first chamber, said second vapor phase valve assembly or vapor phase pump assembly having at least one actuation mechanism, and g) a common signal hub.

In at least one embodiment, each actuation mechanism of the atomic layer deposition apparatus is configured for bidirectional signal communication with a common signal hub, and is selected from a group consisting of i) an instantaneous opening, ii) an instantaneous closing, iii) the controlled opening over a programmable time constant, iv) controlled closing over a programmable time constant, v) the expansion of a subcomponent to reduce the conductance through the assembly, vi) the contraction of a subcomponent to increase the conductance through the assembly, vii) a concave or convex deflection of a subcomponent, viii) rotation of a subcomponent co-linear with the direction of solid material flow, ix) rotation of a subcomponent tangential to the direction of solid material flow, x) an instantaneous increase in conductance to a position less than fully open, xi) an instantaneous decrease in conductance to a position greater than fully closed, xii) the actuation of a piston or piston-like subcomponent, xiii) an actuation delivering a secondary phase to promote aeration, contraction or expansion of the primary phase unit volume, or xiv) an actuation mechanism initiated by the electrical application of a sinusoidal, dirac function, triangular or rectangular waveform over one or more programmable time constants.

In at least one embodiment, said first chamber and second chamber of the atomic layer deposition apparatus are each configured to a) receive a solids phase comprising said articles having a definable specific surface area through each respective solids phase inlet, b) dispense a solids phase comprising said articles having treated surfaces having a definable specific surface area through each respective solids phase outlet, c) receive, create and/or accommodate a vapor phase comprising one or more reactive or non-reactive gases or precursors having a definable number of moles or molar flux through each respective vapor phase inlet, and d) dispense a vapor phase comprising one or more reactive or non-reactive gases or byproducts having a definable number of moles or molar flux through each respective vapor phase outlet.

In at least one embodiment, said first chamber of the atomic layer deposition apparatus further comprises a first sensor network comprising two or more sensors, each sensor within said first sensor network configured for delivering one or more signals to said common signal hub, said first sensor network configured to monitor the temperature, pressure and/or composition of a gaseous environment surrounding said articles.

In at least one embodiment, the atomic layer deposition apparatus further comprises at least one control system configured for simultaneously sending a plurality of signals to, and receiving a plurality of signals from, a common signal hub, said control system is configured to provide a controllable unit for regulating material flows throughout the entire apparatus.

In at least one embodiment, the atomic layer deposition apparatus further comprises a third solids phase valve assembly or solids phase pump assembly in fluid communication with a) a second solids phase outlet of said second chamber, said third solids phase valve assembly or solids phase pump assembly having at least two actuation mechanisms, and b) a first transport unit having one or more actuation mechanisms and is configured for controlling the temperature, pressure and composition of a gaseous environment while regulating the material flow rate of said articles. In at least one embodiment, said first transport unit of the atomic layer deposition apparatus is in bidirectional control signal communication with a signal hub, and wherein one or more actuation mechanisms of said first transport unit is configured for synchronous actuation with said third solids phase valve assembly or solids phase pump assembly actuation mechanisms.

In at least one embodiment, the outlet of said first transport unit is in fluid communication with a fourth solids phase valve assembly or solids phase pump assembly having at least two actuation mechanisms, and wherein one or more actuation mechanisms of said first transport unit is configured for synchronous actuation with said fourth solids phase valve assembly or solids phase pump assembly actuation mechanisms.

In at least one embodiment, the actuation mechanism of said first transport unit that is configured for synchronous actuation with the actuation mechanism of said third solids phase valve assembly or solids phase pump assembly and the actuation mechanism of said first transport unit that is configured for synchronous actuation with the actuation mechanism of said fourth solids phase valve assembly or solids phase pump assembly are the same.

In at least one embodiment, the actuation mechanism of said first transport unit that is configured for synchronous actuation with the actuation mechanism of said third solids phase valve assembly or solids phase pump assembly and the actuation mechanism of said first transport unit that is configured for synchronous actuation with the actuation mechanism of said fourth solids phase valve assembly or solids phase pump assembly are different.

In at least one embodiment, the atomic layer deposition apparatus further comprises a second transport unit in fluid communication with said third solids phase valve assembly or solids phase pump assembly, and in parallel with said first transport unit, said second transport unit having one or more actuation mechanisms and is configured for controlling the temperature, pressure and composition of a gaseous environment while regulating the material flow rate of said articles. In at least one embodiment, said second transport unit of the atomic layer deposition apparatus is in bidirectional control signal communication with a signal hub, and wherein one or more actuation mechanisms of said second transport unit is configured for synchronous actuation with said third solid phase valve assembly or solid phase pump assembly actuation mechanisms.

In at least one embodiment, The apparatus is further configured to regulate the flow rate of the solids phase comprising said articles having treated surfaces to each respective transport unit, such that the specific surface area flowing through each transport unit is defined.

In at least one embodiment, the atomic layer deposition apparatus further comprises a third vapor phase valve assembly or vapor phase pump assembly adjacent to and in fluid communication with and interposed between a) said first vapor phase outlet of said first chamber, and b) a first exhaust return manifold. In at least one embodiment, said third vapor phase valve assembly or vapor phase pump assembly having at least one actuation mechanism in bidirectional signal communication with said common signal hub and is configured for controlling the pressure of the gaseous environment within said first chamber.

In at least one embodiment, the atomic layer deposition apparatus further comprises a fourth vapor phase valve assembly or vapor phase pump assembly adjacent to and in fluid communication with and interposed between a) said second vapor phase outlet of said second chamber, and b) a second exhaust return manifold. In at least one embodiment, said fourth vapor phase valve assembly or vapor phase pump assembly having at least one actuation mechanism in bidirectional signal communication with said common signal hub and is configured for controlling the pressure of the gaseous environment within said second chamber. In at least one embodiment, at least one actuation mechanism of a fourth vapor phase valve assembly or vapor phase pump assembly is configured for synchronous actuation with at least one actuation mechanism of said third vapor phase valve assembly or vapor phase pump assembly.

In at least one embodiment, the atomic layer deposition apparatus further comprises a first precursor delivery system having one or more actuation mechanisms and in fluid communication with said first vapor phase valve assembly or vapor phase pump assembly, said precursor delivery system comprising: i) a vaporizer unit having an external heating mechanism, ii) a vaporizer unit having an external cooling mechanism, iii) a vaporizer unit having an internal heating mechanism, iv) a vaporizer unit having an internal cooling mechanism, v) a precursor volume controller configurable to the specific articles and processes being carried out in said first chamber, vi) a liquid precursor injection pumping system, vii) a solid precursor metering system, viii) one or more first capillary nozzles sized to the number of moles of precursor intended for delivery into said first chamber, ix) one or more first expansion tanks each having a definable total internal surface area, where the combination of the total surface area in all first expansion tanks is larger than the total active surface area of the articles to be saturated in said first chamber, and x) a first vaporizer unit having a rapid thermal treatment system.

In at least one embodiment, the apparatus further comprises a second precursor delivery system having one or more actuation mechanisms and in fluid communication with said second vapor phase valve assembly or vapor phase pump assembly, said precursor delivery system comprising: i) a second vaporizer unit having an external heating mechanism, ii) a second vaporizer unit having an external cooling mechanism, iii) a second vaporizer unit having an internal heating mechanism, iv) a second vaporizer unit having an internal cooling mechanism, v) a second precursor volume controller configurable to the specific articles and processes being carried out in said second chamber, vi) a second liquid precursor injection pumping system, vii) a second solid precursor metering system, viii) one or more second capillary nozzles sized to the number of moles of precursor intended for delivery into said second chamber, ix) one or more second expansion tanks each having a definable total internal surface area, where the combination of the total surface area in all second expansion tanks is larger than the total active surface area of the articles to be saturated in said second chamber, and x) a second vaporizer unit having a rapid thermal treatment system. In at least one embodiment, at least one actuation mechanism of a first precursor delivery system is actuated synchronously with at least one actuation mechanism of said second precursor delivery system.

In at least one embodiment, the atomic layer deposition apparatus is configured to carry out one or more of a batch, semi-batch, semi-continuous and continuous atomic layer deposition process or sub-process.

In at least one embodiment, the second chamber is subjacent to the first chamber.

In at least one embodiment, at least a portion of the fourth solids valve assembly or pump assembly is located in the same horizontal plane as at least a portion of the first solids valve assembly or solids phase pump assembly.

In at least one embodiment, the actuation mechanisms of the fourth solids valve assembly or pump assembly are configured for synchronous actuation with the actuation mechanisms of said first solids phase valve assembly or solid phase pump assembly.

In at least one embodiment, the outlet of said first transport unit is in fluid communication with said first solids phase valve assembly or solids phase pump assembly having at least two actuation mechanisms, and wherein one or more actuation mechanisms of said first transport unit is configured for synchronous actuation with said first solids phase valve assembly or solids phase pump assembly actuation mechanisms.

In at least one embodiment, the articles are selected from the group consisting of particles, powders and porous supports.

In at least one embodiment, the apparatus is configured for operation at a minimum pressure of about 0.1 Torr. In at least one embodiment, the apparatus is configured to accommodate a pressure drop of up to about 1,500 Torr.

These and other features, together with the organization and manner of operation thereof, will become apparent from the following detailed description when taken in conjunction with the accompanying drawings.

BRIEF DESCRIPTION OF THE DRAWINGS

The details of one or more embodiments are set forth in the accompanying drawings and the description below. Other features, aspects, and advantages of the disclosure will become apparent from the description, the drawings, and the claims. In the drawings, like reference numerals are used throughout the various views to designate like components.

Figures 1A, 1B, 1C, 1D:
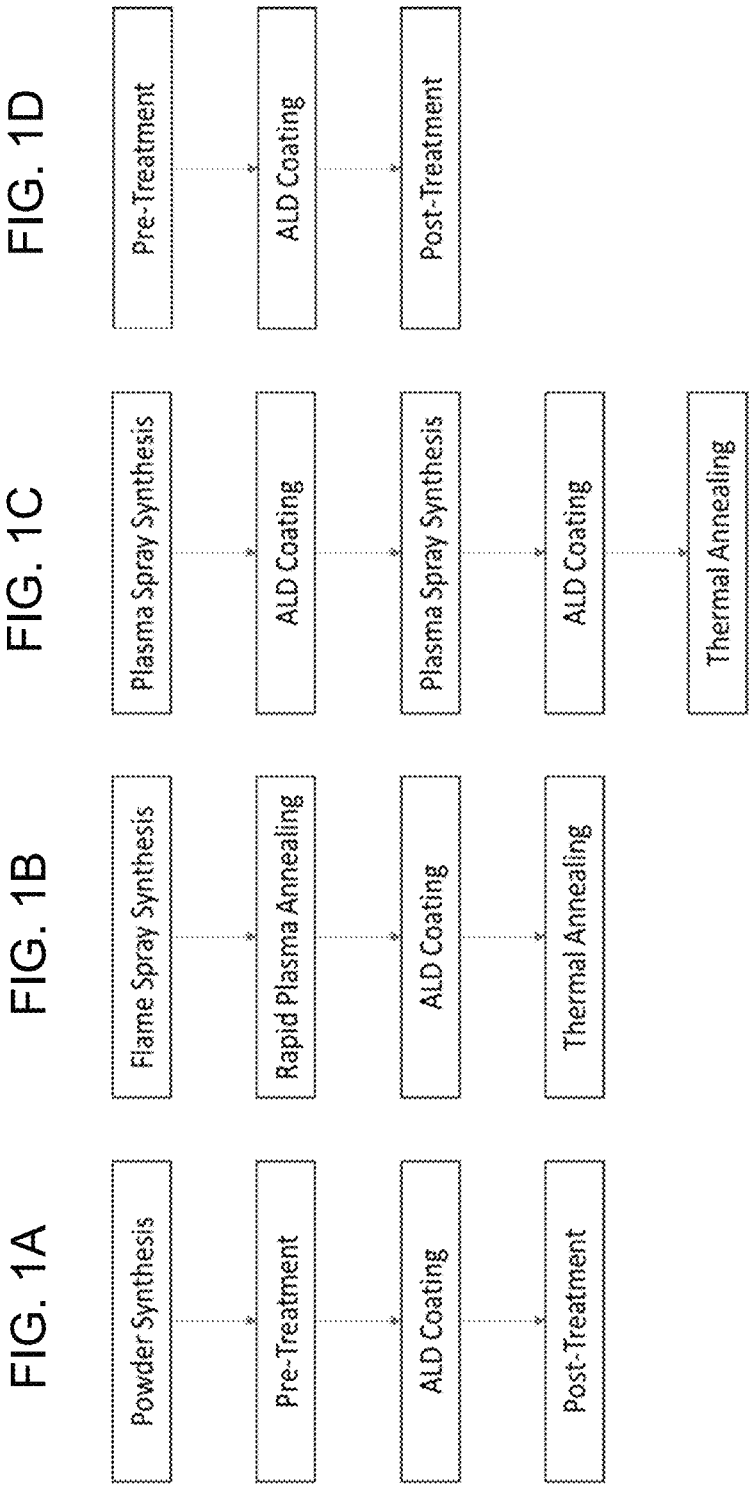
FIGS. 1A-1D illustrate multistep methods for producing a coated powder with optimized substructures and surface structures having a coating step along with optional synthesis, pre-treatment step and post-treatment steps, in accordance with an exemplary embodiment of the present technology.

It will be recognized that some or all of the figures are schematic representations for purposes of illustration. The figures are provided for the purpose of illustrating one or more embodiments with the explicit understanding that they will not be used to limit the scope or the meaning of the claims. The depiction of a particular height, length, width, relative sizing, number of chambers, sub-chambers, and the like, are intended to serve as examples only, and are not intended to limit the scope of the present technology.

DETAILED DESCRIPTION

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

Features may be described herein as part of the same or separate aspects or embodiments of the present technology for the purpose of clarity and a concise description. It will be appreciated by the skilled person that the scope of the present technology may include embodiments having combinations of all or some of the features described herein as part of the same or separate embodiments.

Various techniques and mechanisms of the present technology will sometimes be described in singular form for clarity. However, it should be noted that some embodiments include multiple iterations of a technique or multiple instantiations of a mechanism unless noted otherwise. In the following description, numerous specific details are set forth in order to provide a thorough understanding of the present technology. Particular example embodiments of the present technology may be implemented without some or all of these specific details. In other instances, well known process operations have not been described in detail in order not to unnecessarily obscure the present technology.

The following terms are used throughout and are as defined below.

As used herein and in the appended claims, singular articles such as "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of refereeing individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified. The expression "comprising" means "including, but not limited to." Thus, other non-mentioned substances, additives, carriers, or steps may be present. Unless otherwise specified, "a" or "an" means one or more.

Unless otherwise indicated, all numbers expressing quantities of properties, parameters, conditions, and so forth, used in the specification and claims are to be understood as being modified in all instances by the term "about." Accordingly, unless indicated to the contrary, the numerical parameters set forth in the following specification and attached claims are approximations. Any numerical parameter should at least be construed in light of the number reported significant digits and by applying ordinary rounding techniques. The term "about" when used before a numerical designation, e.g., temperature, time, amount, and concentration including range, indicates approximations which may vary by (+) or (−) 10%, 5% or 1%.

As will be understood by one of skill in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

As used herein "synchronous" refers to two or more occurrences that share one or more of a common start point, a common end point, a common rate or velocity, a common frequency, or a common acceleration or rate of change of velocity.

As used herein "asynchronous" refers to two or more occurrences that do not share one or more of a common start point, a common end point, a common rate or velocity, a common frequency, or a common acceleration or rate of change of velocity.

The terms "adjacent," "superjacent" and "subjacent" may be used interchangeably herein.

The terms "substrate," "articles" and "materials" are used interchangeably herein. Suitable substrates, articles or materials may include, but are not limited to, particles, powders, porous supports, flowable articles, objects, composite workpieces, extrusions, extrudates, packing media, fillers, grains, precipitates, granulates, and the like. In at least one embodiment, the articles described herein include flowable articles. Suitable flowable articles, include, but are not limited to metallic powders, ceramic particles, catalyst supports including extrudates, additive manufacturing alloy powders, polymeric particles, electrochemically-active precipitates, fly ash and other silicate fillers, carbon granulates, extruded workpieces, thermal fillers, electrical fillers, base metal grains, separations media, electronics components including circuit boards, metal shot powders, and the like.

The substrate or article can be any material which is chemically and/or thermally stable under the conditions of the deposition reaction. By "chemically" stable, it is meant that no more than 15% of the surface of the article undergoes any undesirable chemical reaction during the deposition process, other than in some cases bonding to the applied coating. By "thermally" stable, it is meant that the article does not melt, sublime, volatilize, degrade or otherwise dramatically change its physical state under the conditions of the deposition reaction by more than 30%. For certain applications, powders, typically ceramic or metallic in nature, are used. Suitable materials include, but are not limited to, silica, alumina, glass, metals, phosphors, silicon, iron oxide, other metal oxides, nitrides such as tungsten nitride or boron nitride, and a wide range of other materials. Organic materials, including powdered organic polymers, can be used when deposition temperatures are somewhat low.

The size of the articles will depend on various factors such as the particular end-use application. In exemplary embodiments, the powder may have a particle size of as little as 5 nanometers up to micron size or greater, for example up to 100 microns, or alternatively up to 1 micron. Thus the particle size may range from about 5 nm to about 1000 microns, including from about 5 nm to about 100 microns, from about 50 nm to about 50 microns, from about 500 nm to about 25 microns, or from about 1 micron to about 20 microns, and ranges between any two of these values or less than any one of these values. In at least one embodiment, the powder may have a particle size of up to 100 microns. Porous workpieces configured for use as catalyst supports, also sometimes characterized as Geldart class D particles, or other times characterized as class A, class B or class C particles, sometimes taking the form of extrusions or extrudates, are also able to be coated using one or more of the systems described herein. Such porous workpieces may have dimensions ranging from about 10 microns to about 5 centimeters in any characteristic dimension, and may be round, cylindrical, spherical, ellipsoidal, oblong, rectangular, smooth, rough or angular. Solid workpieces that are flowable can also easily be processed using the system described herein, such as small passive electronic components, thermoelectric devices, or even jewelry.

As used herein "precursor" refers to a reactant or starting material that is used at the beginning of a chemical process, typically reactive, however occasionally inert under certain operating conditions.

Suitable precursors may include one or more of aluminum sec-butoxide, aluminum tribromide, aluminum trichloride, diethylaluminum ethoxide, dimethylaluminum isopropoxide, tris(ethylmethylamido)aluminum, tris(dimethylamido) aluminum, triethylaluminum, triisobutylaluminum, trimethylaluminum, tris(diethylamido)aluminum, tris(ethylmethylamido)aluminum, trimethylantimony(III), triethylantimony(III), triphenylantimony(III), tris(dimethylamido)antimony(III), trimethylarsine, triphenylarsine, triphenylarsine oxide, barium bis(2,2,6,6-tetramethyl-3,5-heptanedionate) hydrate, barium nitrate, bis(pentamethylcyclopentadienyl)barium tetrahydrofuran, bis(triisopropylcyclopentadienyl)barium tetrahydrofuran, bis(acetate-O)triphenylbismuth(V), triphenylbismuth, tris(2-methoxyphenyl)bismuthine, diborane, trimethylboron, triethylboron, triisopropylboroate, triphenylborane, tris(pentafluorophenyl)borane, cadmium acetylacetonate, calcium bis(2,2,6,6-tetramethyl-3,5-heptanedionate), carbon tetrabromide, carbon tetrachloride, cerium(III) trifluoroacetylacetonate, tetrakis(2,2,6,6-tetramethyl-3,5-heptanedionat)cerium(IV), tris(cyclopentadienyl)cerium(III), tris(isopropylcyclopentadienyl)cerium(III), tris(1,2,3,4-tetramethyl-2,4-cyclopentadienyl)cerium(III), bis(cyclopentadienyl)chromium(II), bis(pentamethylcyclopentadienyl)chromium(II), chromium(III) tris(2,2,6,6-tetramethyl-3,5-heptanedionate), chromium(II) chloride, chromium(III) chloride, chromium(II) carbonyl, chromium(III) carbonyl, cyclopentadienyl(II)chromium carbonyl, bis(cyclopentadienyl)cobalt(II), bis(ethylcyclopentadienyl)cobalt(II), bis(pentamethylcyclopentadienyl)cobalt(II), tribis(N,N'-diisopropylacetaminato)cobalt(II), dicarbonyl(cyclopentadienyl)cobalt(III), cyclopentadienylcobalt(II) carbonyl, copper bis(6,6,7,7,8,8-heptafluoro-2,2-dimethyl-3,5-octanedionate, copper bis(2,2,6,6-tetramethyl-3,5-heptanedionate, (N,N'-diisopropylacetaminato)copper(II), tris(2,2,6,6-tetramethyl-3,5-heptanedionato)dysprosium(III), tris(isopropylcyclopentadienyl)dysprosium(III), erbium(III) tris(2,2,6,6-tetramethyl-3,5-heptanedionate), tris(butylcyclopentadienyl)erbium(III), tris(N,N-bis(trimethylsilyl)amide)europium(III), tris(tetramethylcyclopentadienyl)europium(III), nitrogen trifluoride, tris(N,N-bis(trimethylsilyl)amide)gadolinium(III), tris(cyclopentadienyl)gadolinium(III), tris(tetramethylcyclopentadienyl)gadolinium(III), gallium tribromide, gallium trichloride, triethylgallium, triisopropylgallium, trimethylgallium, tris(dimethylamido)gallium, tri-tert-butylgallium, digermane, germane, tetramethylgermanium, germanium(IV) fluoride, germanium(IV) chloride, hexaethyldigermanium(IV), hexaphenyldigermanium(IV), tributylgermanium hydride, triphenylgermanium hydride, dimethyl(acetylacetonate)gold(III), dimethyl(trifluoroacetylacetonate)gold(III), hafnium(IV) chloride, hafnium (IV) tert-butoxide, tetrakis(diethylamido)hafnium (IV), tetrakis(dimethylamido)hafnium (IV), tetrakis(ethylmethylamido)hafnium (IV), bis(tert-butylcyclopentadienyl)dimethylhafnium(IV), bis(methyl-n-cyclopentadienyl)dimethylhafnium, bis(trimethylsilyl)amidohafnium(IV) chloride, dimethylbis(cyclopentadienyl)hafnium (IV), hafnium isopropoxide, tris(N,N-bis(trimethylsilyl)amide)holmium(III), indium trichloride, indium(I) iodide, indium acetylacetonate, triethylindium, tris(dimethylamido)indium, tris(diethylamido)indium, tris(cyclopentadienyl)indium, 1,5-cyclooctadiene(acetylacetonato)iridium(I), 1,5-cyclooctadiene(hexafluoroacetylacetonato)iridium(I), 1-ethylcyclopentadienyl-1,3-cyclohexadieneiridium(I), (methylcyclopentadienyl)(1,5-cyclooctadiene)iridium(I), bis(N,N'-di-tert-butylacetamidinato)iron (II), bis(pentamethylcyclopentadienyl)iron(II), ferrocene, 1,1'-diethylferrocene, iron pentacarbonyl, iron(III tris(2,2,6,6-tetramethyl-3,5-heptanedionate), tris(N,N'-Di-tert-butylacetamidinato)lanthanum (III), lanthanum(III) isopropoxide, tris(N,N-bis(trimethylsilyl)amide)lanthanum(III), tris(cyclopentadienyl)lanthanum(III), tris(tetramethylcyclopentadienyl)lanthanum (III), tetraethyllead, tetramethyllead, tetraphenyllead, tithium t-butoxide, lithium trimethylsilylamide, lithium (2,2,6,6-tetramethyl-3,5-heptanedionate), tris(N,N-diisopropylacetamidinato)lutetium(III), lutetium(III) tris(2,2,6,6-tetramethyl-3,5-heptanedionate), bis(cyclopentadienyl)magnesium(II), bis(pentamethylcyclopentadienyl)magnesium(II), bis(pentaethylcyclopentadienyl)magnesium(II), bis(cyclopentadienyl)manganese(II), bis(N,N-diisopropylpentylamidinato)manganese(II), bis(ethylcyclopentadienyl)manganese(II), bis(pentamethylcyclopentadienyl)manganese(II), bis(isopropylcyclopentadienyl)manganese(II), cyclopentadienylmanganese tricarbonyl, manganese carbonyl, methylcyclopentadienylmanganese tricarbonyl, manganese tris(2,2,6,6-tetramethyl-3,5-heptanedionate), molybdenum hexacarbonyl, molybdenum (V) chloride, molybdenum (VI) fluoride, bis(cyclopentadienyl)molybdenum(IV) dichloride, cyclopentadienylmolybdenum (II) tricarbonyl, propylcyclopentadienylmolybdenum(I) tricarbonyl, tris(N,N-bis(trimethylsilyl)amide)neodymium (III), bis(methylcyclopentadienyl)nickel(II), allyl(cyclopentadienyl)nickel(II), bis(cyclopentadienyl)nickel (II), bis(ethylcyclopentadienyl)nickel(II), bis(triphenylphosphine)nickel(II) dichloride, nickel(II) bis(2,2,6,6-tetramethyl-3,5-heptanedionate), bis(cyclopentadienyl)niobium(IV) dichloride, niobium(V) chloride, niobium(V) isopropoxide, niobium(V) ethoxide, N,N-dimethylhydrazine, ammonia, hydrazine, ammonium fluoride, azidotrimethylsilane, triosmium dodecacarbonyl, allyl(cyclopentadienyl)palladium(II), palladium(II) hexafluoroacetylacetonate, bis(2,2,6,6-tetramethyl-3,5-heptanedionato)palladium(II), phosphine, tert-butylphosphine, tris(trimethylsilyl)phosphine, phosphorous oxychloride, triethylphosphate, trimethylphosphate, methylcyclopentadienyl(trimethyl)platinum (IV), chloroplatinic acid, praseodymium(III) hexafluoroacetylacetonate hydrate, dirhenium decacarbonyl, acetylacetonato(1,5-cyclooctadiene)rhodium(I), bis(ethylcyclopentadienyl)ruthenium (II), bis(cyclopentadienyl)ruthenium(II), bis(pentamethylcyclopentadienyl)ruthnenium (II), triruthenium dodecacarbonyl, tris(N,N-bis(trimethylsilyl)amide)samarium(III), tris(tetramethylcyclopentadienyl)samarium(III), tris(2,2,6,6-tetramethyl-3,5-heptanedionato)scandium(III), dimethyl selenide, diethyl selenide, 2,4,6,8-tetramethylcyclotetrasiloxane, dimethoxydimethylsilane, di silane, methyl silane, octamethylcyclotetrasiloxane, silane, tris(isopropoxy)silanol, tris(tert-butoxy)silanol, tris(tert-pentoxy)silanol, (3-aminopropyl)triethoxysilane, N-sec-butyl(trimethylsilyl)amine, chloropentamethyldisilane, hexamethyldisilazane, silicon (IV) chloride, silicon(IV) bromide, pentamethyldisilane, tetraethyl silane, N,N',N"-tri-tert-butylsilanetriamine, (2,2,6,6-tetramethyl-3,5-heptanedionato)silver(I), triethoxyphosphine(trifluoroacetylacetonate)silver(I), silver(I) triethylphosphine(6,6,7,7,8,8,8-heptafluoro-2,2-dimethyl-3,5-octanedionate), trimethylphosphine(hexafluoroacetylacetonato)silver(I), vinyltriethylsilane(hexafluoroacetylacetonato)silver(I), strontium tetramethylheptanedionate, pentakis(dimethylamido)tantalum(V), tantalum(V) chloride, tantalum(V) ethoxide, tantalum(V) fluoride, tris(ethylmethylamido)tert-butylimido)tantalum(V), tris(diethylamido)(tert-butylimido)tantalum(V), tellurium tetrabromide, tellurium tetrachloride, terbium(2,2,6,6-tetramethyl-3,5-heptanedionate), tris(cyclopentadienyl)terbium(III), tris(tetramethylcyclopentadienyl)terbium(III), thallium(I) ethoxide, thallium(I) hexafluoroacetylacetonate, cyclopentadienylthallium, 2,2,6,6-tetramethyl-3,5-heptanedionatothallium(I), tris(N,N-bis(trimethylsilyl)amide)thulium (III), tris(cyclopentadienyl)thulium(III), tin(IV) chloride, tetramethyltin, tin(II) acetylacetonate, tin(IV) tert-butoxide, tin(II) hexafluoroacetylacetonate, bis(N,N'-diisopropylacetamidinato)tin(II), N,N-di-tert-butyl-2,3-diamidobutanetin(II), tetrakis(dimethylamino)tin(IV), bis(diethylamido)bis(dimethylamido)titanium (IV), tetrakis(diethylamido)titanium (IV), tetrakis(dimethylamido)titanium(IV), tetrakis(ethylmethylamido)titanium (IV), titanium (IV) bromide, titanium (IV) chloride, titanium (IV) fluoride, titanium (IV) tert-butoxide, titanium(IV) isopropoxide, titanium(IV) ethoxide, titanium(IV) methoxide, titanium(IV) isopropoxidebis(2,2,6,6-tetramethyl-3,5-heptanedionate), dichloro titanium(IV) oxide, bis(tert-butylimido)bis(dimethylamido)tungsten (VI), tungsten hexacarbonyl, tungsten (VI) chloride, tungsten (VI) fluoride, triaminetungsten(IV) tricarbonyl, cyclopentadienyltungsten(II) tricarbonyl hydride, bis(isopropylcyclopentadienyl)tungsten(IV) dihydride, bis(cyclopentadienyl)tungsten(IV) dihydride), bis(cyclopentadienyl)tungsten(IV) dichloride, bis(butylcyclopentadienyl)tungsten(IV) diiodide, bis(cyclopentadienyl)vanadium(II), vanadium(V) oxide trichloride, vanadium(V) oxytriisopropoxide, tris(N,N-bis(trimethylsilyl)amide)ytterbium(III), tris(cyclopentadienyl)ytterbium(III), tris(N,N-bis(trimethylsilyl)amide)yttrium (III), yttrium(III) tris(tert-butoxide), yttrium(III) triisopropoxide, yttrium(III) tris(2,2,6,6-tetramethyl-3,5-heptanedionate), tris(butylcyclopentadienyl)yttrium(III), tris(cyclopentadienyl)yttrium(III), yttrium 2-methoxyethoxide, diethylzinc, dimethylzinc, diphenylzinc, bis(2,2,6,6-tetramethyl-3,5-heptanedionate)zinc(II), bis(pentafluorophenyl)zinc, zirconium(IV) dibutoxide(bis-2,4-pentanedionate), zirconium(IV) 2-ethylhexanoate, zirconium tetrakis(2,2,6,6-tetramethyl-3,5-heptanedionate), bis(cyclopentadienyl)zirconium(IV) dihydride, bis(methyl-n-cyclopentadienyl)methoxymethylzirconium, tetrakis(diethylamido)zirconium (IV), dimethylbis(pentamethylcyclopentadienyl)zirconium(IV), tetrakis(dimethylamido)zirconium (IV), tetrakis(ethylmethylamido)zirconium (IV), zirconium (IV) bromide, zirconium (IV) chloride, zirconium (IV) tert-butoxide, and a mixture of any two or more thereof. Precursors for the synthesis of powders and particles, and occasionally for their encapsulation, oftentimes include metal salts and hydroxides, and administered as a dry powder, liquid or gaseous feedstock, or as dissolved in a suitable solvent, via an injection device, nozzle, spray device, vaporizer, sonicator, or other known sub-component. Metal salts may be in the form of halides, sulfates, nitritates, oxalates, phosphates, or other inorganic or organic compounds of Ac, Ag, Al, Am, As, At, Au, B, Ba, Be, Bh, Bi, Bk, Br, C, Ca, Cd, Ce, Cf, Cm, Cn, Co, Cr, Cs, Cu, db, Ds, Dy, Er, Es, Eu, Fe, Fl, Fm, Fr, Ga, Gd, Ge, H, Hf, Hg, Ho, Hs, In, K, La, Li, Lr, Lu, Lv, Mc, Md, Mg, Mn, Mo, Mt, N, Na, Nb, Nd, Nh, Ni, No, Np, O, Og, Os, P, Pa, Pb, Pd, Pm, Po, Pr, Pt, Pu, Ra, Rb, Re, Rf, Rg, Rh, Ru, S, Sb, Sc, Se, Sg, Si, Sm, Sn, Sr, Ta, Tb, Tc, Te, Th, Ti, Tl, Tm, Ts, U, V, W, Y, Yb, Zn, Zr, or combinations thereof.

In at least one embodiment, the precursor includes one or more of phosphorous, sulfur, nitrogen, carbon, fluorine, chlorine, bromine or iodine. In at least one embodiment, the precursor includes a phosphide, a phosphate, a sulfide, a sulfate, a nitrate, a fluoride, a chloride, a bromide or an iodide.

Various embodiments of the present technology described herein relates to systems, apparatus and methods for processing articles. The processing may include, but is not limited to one or more of synthesizing, functionalizing, surface treating and encapsulating articles. In one aspect, the present technology provides an apparatus for processing articles. The apparatus is suitable for implementation of a variety of processing steps on a variety of articles. As an example, the system, apparatus or method is configured for the application of layers to articles or substrates by various vapor deposition techniques. Examples of vapor deposition techniques can include molecular layering (ML), chemical vapor deposition (CVD), physical vapor deposition (PVD), atomic layer deposition (ALD), molecular layer deposition (MLD), vapor phase epitaxy (VPE), atomic layer chemical vapor deposition (ALCVD), ion implantation or similar techniques. In each of these, coatings are formed by exposing the powder to reactive precursors, which react either in the vapor phase (in the case of CVD, for example) or at the surface of the powder particles (as in ALD and MLD).

In one aspect, disclosed herein is a system and method for synthesizing, treating functionalizing and/or encapsulating articles, substrates or objects controlled from a common signal hub, comprising one or more of:

1. a synthesis subsystem having at least one chamber with an inlet, an outlet and a controllable unit for simultaneously regulating material flows, controlling the conversion of precursors to products and controlling nominal operating pressures;
2. a pre-treatment subsystem having at least one chamber with an inlet, an outlet and a controllable unit for simultaneously regulating material flows, controlling a pre-treatment process, which can include one or more of a plasma treatment, a thermal treatment, a microwave treatment, an oxidizing treatment, a reducing treatment, a pH modifying treatment, a molecular grafting treatment, an etching treatment, or combinations thereof, and a means for controlling one or more of the nominal operating pressures, gas concentrations, temperatures and/or flow rates;
3. a functionalization subsystem having at least one chamber with an inlet, an outlet and a controllable unit for simultaneously regulating material flows, controlling the conversion of precursors to functionalized products, and controlling nominal operating pressures;
4. a post-treatment subsystem having at least one chamber with an inlet, an outlet and a controllable unit for simultaneously regulating material flows, controlling a post-treatment process, which can include one or more of a plasma treatment, a thermal treatment, a microwave treatment, an oxidizing treatment, a reducing treatment, a pH modifying treatment, a molecular grafting treatment, an etching treatment, or combinations thereof, and a means (unit) for controlling one or more of the nominal operating pressures, gas concentrations, temperatures and/or flow rates;
5. a valve or pump assembly with at least two actuation mechanisms. The two or more actuation mechanisms may control two or more discrete subvalves or subpumps within the valve or pump assembly, or discrete features of a common valve or pump, but at least one actuation mechanism would be largely dictated by the properties of the solids phase, at least one would be largely dictated by the properties of the gas phase, and if relevant, at least one would be largely dictated by the properties of the liquid phase. in the case of a valve assembly, each actuation mechanism may represent one or more of i) an instantaneous opening; ii) an instantaneous closing; iii) the controlled opening over a programmable time constant; iv) controlled closing over a programmable time constant, v) the expansion of a subcomponent to reduce the conductance through the assembly; vi) the contraction of a subcomponent to increase the conductance through the assembly; vii) a concave or convex deflection of a subcomponent; viii) rotation of a subcomponent co-linear with the direction of solid material flow; ix) rotation of a subcomponent tangential to the direction of solid material flow; x) an instantaneous increase in conductance to a position less than fully open; xi) an instantaneous decrease in conductance to a position greater than fully closed; xii) the actuation of a piston or piston-like subcomponent; xiii) an actuation delivering a secondary phase to promote aeration, contraction or expansion of the primary phase unit volume; or xiv) an actuation mechanism initiated by the electrical application of a sinusoidal, dirac function, triangular or rectangular waveform over one or more programmable time constants;

6. one or more vertical transfer operations each having an inlet, an outlet and a controllable unit for feeding and regulating material flows and transiently controlling the ambient environment before and after each inlet and outlet, wherein at least one transfer operation is downward oriented and deposits material into a subjacent receiver, and at least one transfer operation is upward oriented and deposits material into a superjacent receiver, and wherein the feeding operations of the vertical transfer operations are commonly controlled and maintain a substantially uniform transport rate;

7. a control system configured for machine learning and designed for simultaneous or synchronous feed-back and/or feed-forward control of chemical reaction reactant flows, chemical reaction product flows, chemical reaction operating conditions, system state of health, timing and programmable steps for transfers, batching considerations with respect to monitored physicochemical parameters, looping considerations, and a continuous monitoring of the mass or volumetric transport of the materials being manufactured;

8. typically one or more sub-system that is suitable for operation in a continuous mode, and one or more sub-system that preferably operates in a semi-continuous or batch mode;

9. at least one yield-improving structural or functional design feature required for the manufacture of specific materials combinations suitable for use in commercial or industrial products, including precursor delivery unit, chamber geometry, analytical monitoring instrument connectivity, flow enhancers, stirrers, vibrators, agitators, heaters, filters, actuators, valves, control systems, control intelligence, or other unique design features determined to be critical to the manufacture of the products at high yield; and 10. one or more of any of the other system sub-components, configurations and/or services.

The apparatus may include a plurality of: solids phase inlet, solids phase outlet, vapor phase inlet vapor phase outlet, solids phase valve assembly, vapor phase valve assembly, signal hubs, and control systems. In at least one embodiment, the articles may include powders or flowable articles.

In another aspect, disclosed herein is an apparatus including at least a first chamber having at least one of each of a first solids phase inlet, a first solids phase outlet, a first vapor phase inlet and a first vapor phase outlet, at least a first solids phase valve or pump assembly in fluid communication with the first solids phase inlet of the first chamber, at least a first vapor phase valve or pump assembly adjacent to and in fluid communication with the first vapor phase inlet of the first chamber, and a common signal hub.

In yet another aspect, disclosed herein is an apparatus for processing articles or treating the surfaces of articles with a vaporous precursor. The apparatus includes a) a first chamber having at least one of each of a first solids phase inlet, a first solids phase outlet, a first vapor phase inlet and a first vapor phase outlet, b) a first solids phase valve or pump assembly in fluid communication with the first solids phase inlet of the first chamber, c) a first vapor phase valve or pump assembly adjacent to and in fluid communication with the first vapor phase inlet of the first chamber, and d) a common signal hub. In at least one embodiment, the articles include a plurality of flowable articles.

In the apparatus, at least one first solid phase inlet and at least one first solid phase outlet include a solid phase valve assembly or solid phase pump assembly having at least two actuation mechanisms configured for and capable of bidirectional control signal communication with a signal hub.

In the apparatus, at least one first vapor phase inlet and at least one first vapor phase outlet include a vapor phase valve assembly or vapor phase pump assembly having at least one actuation mechanism configured for bidirectional control signal communication with a signal hub.

In the apparatus, the first chamber further includes a first sensor network which includes two or more sensors. Each sensor within the first sensor network may be configured for and capable of delivering one or more signals to a signal hub, the first sensor network configured to monitor the temperature, pressure and/or composition of a gaseous environment surrounding the articles.

The apparatus includes at least one control system. The control system is configured for simultaneously sending a plurality of signals to, and receiving a plurality of signals from, one or more signal hubs, and provides a controllable unit or controllable means for regulating material flows.

The apparatus may further include at least one transport means or transport unit having one or more actuation mechanisms and configured for controlling the temperature, pressure and composition of a gaseous environment while regulating the material flow rate of a plurality of articles. The inlet of transport unit may be configured to be in fluid communication with at least one first solid phase outlet valve assembly or solid phase pump assembly. The inlet of the transport unit may be configured to be in bidirectional control signal communication with a signal hub. The one or more transport unit actuation mechanisms is configured for synchronous actuation with one or more first solid phase outlet valve assembly or solid phase pump assembly actuation mechanisms.

The apparatus may further include a second chamber which may be similar to or different from the first chamber. The second chamber may include one or more of a) at least one of each of a second solids phase inlet, a second solids phase outlet, a second vapor phase inlet and a second vapor phase outlet, b) a second solids phase valve or pump assembly in fluid communication with the second solids phase inlet of the second chamber, c) a second vapor phase valve or pump assembly adjacent to and in fluid communication with the second vapor phase inlet of the second chamber, and d) a common signal hub.

In the apparatus, at least one second solid phase inlet and at least one second solid phase outlet include a solid phase valve assembly or solid phase pump assembly having at least two actuation mechanisms configured for bidirectional control signal communication with a signal hub.

In the apparatus, at least one second vapor phase inlet and at least one second vapor phase outlet include a vapor phase valve assembly or vapor phase pump assembly having at least one actuation mechanism, configured for bidirectional control signal communication with a signal hub.

In the apparatus, the second chamber further includes a second sensor network which include two or more sensors. Each sensor within the second sensor network may be configured for delivering one or more signals to a signal hub, the second sensor network configured to monitor the temperature, pressure and/or composition of a gaseous environment surrounding the articles.

The apparatus further includes at least one control system for the second chamber. The control system is configured for sending and receiving a plurality of signals simultaneously to and from one or more signal hubs and provides a controllable unit for regulating material flows.

The apparatus having a second chamber further includes a second transport means or transport unit. The second transport unit may include at least one transport unit having one or more actuation mechanisms and configured for controlling the temperature, pressure and composition of a gaseous environment while regulating the material flow rate of a plurality of articles. In at least one embodiment, the inlet of second transport unit is in fluid communication with at least one first solid phase outlet valve assembly or solid phase pump assembly. In at least one embodiment, the inlet of second transport unit is in bidirectional control signal communication with a signal hub. In at least one embodiment, one or more transport unit actuation mechanisms may be actuated synchronously with one or more first solid phase outlet valve assembly or solid phase pump assembly actuation mechanisms. In at least one embodiment, the outlet of second transport unit is in fluid communication with at least one second solid phase inlet valve assembly or solid phase pump assembly. In at least one embodiment, the outlet of second transport unit is in bidirectional control signal communication with a signal hub. In at least one embodiment, one or more transport unit actuation mechanisms may be actuated synchronously with one or more second solid phase inlet valve assembly or solid phase pump assembly actuation mechanisms. In at least one embodiment, one or more transport unit actuation mechanisms may be actuated synchronously with one or more first solid phase outlet valve assembly or solid phase pump assembly actuation mechanisms, and with one or more second solid phase inlet valve assembly or solid phase pump assembly actuation mechanisms.

The apparatus may include a plurality of control systems. In at least one embodiment, the apparatus includes a master control system, configured to simultaneously control the plurality of control systems. In at least one embodiment, the apparatus includes at least one control system is configured for machine learning. The apparatus may include a plurality of signal hubs. In at least one embodiment, the apparatus includes a common signal hub, configured to aggregate the signals to and from said plurality of signal hubs.

In at least one embodiment, the apparatus described herein are configured to receive a solids phase which includes articles having a definable specific surface area through one or more solids phase inlets, dispense a solids phase which includes articles having treated surfaces having a definable specific surface area through one or more solids phase outlets, receive, create and/or accommodate a vapor phase which includes one or more reactive or non-reactive gases or precursors having a definable number of moles or molar flux through one or more vapor phase inlets, and/or dispense a vapor phase which includes one or more reactive or non-reactive gases or byproducts having a definable number of moles or molar flux through one or more vapor phase outlets.

In at least one embodiment, the actuation mechanisms on a valve assembly or pump assembly of the apparatus are configured for bidirectional control signal communication with a signal hub. In at least one embodiment, the actuation mechanism on a valve assembly or pump assembly includes one or more of i) an instantaneous opening; ii) an instantaneous closing; iii) the controlled opening over a programmable time constant; iv) controlled closing over a programmable time constant, v) the expansion of a subcomponent to reduce the conductance through the assembly; vi) the contraction of a subcomponent to increase the conductance through the assembly; vii) a concave or convex deflection of a subcomponent; viii) rotation of a subcomponent co-linear with the direction of solid material flow; ix) rotation of a subcomponent tangential to the direction of solid material flow; x) an instantaneous increase in conductance to a position less than fully open; xi) an instantaneous decrease in conductance to a position greater than fully closed; xii) the actuation of a piston or piston-like subcomponent; xiii) an actuation delivering a secondary phase to promote aeration, contraction or expansion of the primary phase unit volume; or xiv) an actuation mechanism initiated by the electrical application of a sinusoidal, dirac function, triangular or rectangular waveform over one or more programmable time constants.

In one aspect, an apparatus is provided which includes at least a first chamber having at least one of each of a first solids phase inlet, a first solids phase outlet, a first vapor phase inlet and a first vapor phase outlet, at least a second chamber having at least one of each of a second solids phase inlet, a second solids phase outlet, a second vapor phase inlet and a second vapor phase outlet, at least a first solids phase valve or pump assembly in fluid communication with the first solids phase inlet of the first chamber, the first solid phase valve or pump assembly having at least two actuation mechanisms, at least a first vapor phase valve or pump assembly adjacent to and in fluid communication with the first vapor phase inlet of the first chamber, the first vapor phase valve or pump assembly having at least one actuation mechanism, at least a second solids phase valve or pump assembly in fluid communication with the second solids phase inlet of the second chamber, the second solid phase valve or pump assembly having at least two actuation mechanisms, at least a second vapor phase valve or pump assembly adjacent to and in fluid communication with the second vapor phase inlet of the first chamber, the second vapor phase valve or pump assembly having at least one actuation mechanism, and g) a common signal hub.

The actuation mechanism of the apparatus may be configured for bidirectional signal communication with a common signal hub. The actuation mechanism may be selected one or more of i) an instantaneous opening, ii) an instantaneous closing, iii) the controlled opening over a programmable time constant, iv) controlled closing over a programmable time constant, v) the expansion of a subcomponent to reduce the conductance through the assembly, vi) the contraction of a subcomponent to increase the conductance through the assembly, vii) a concave or convex deflection of a subcomponent, viii) rotation of a subcomponent co-linear with the direction of solid material flow, ix) rotation of a subcomponent tangential to the direction of solid material flow, x) an instantaneous increase in conductance to a position less than fully open, xi) an instantaneous decrease in conductance to a position greater than fully closed, xii)

the actuation of a piston or piston-like subcomponent, xiii) an actuation delivering a secondary phase to promote aeration, contraction or expansion of the primary phase unit volume, and xiv) an actuation mechanism initiated by the electrical application of a sinusoidal, dirac function, triangular or rectangular waveform over one or more programmable time constants. In at least one embodiment, the apparatus is an atomic layer deposition apparatus for processing articles. The article may include for example, particles, powders or porous supports.

The first chamber and second chamber may each be configured to perform one or more functions. For example the first chamber and second chamber may receive a solids phase which includes articles having a definable specific surface area through each respective solids phase inlet, dispense a solids phase which includes articles having treated surfaces having a definable specific surface area through each respective solids phase outlet, receive, create and/or accommodate a vapor phase which includes one or more reactive or non-reactive gases or precursors having a definable number of moles or molar flux through each respective vapor phase inlet, and/or dispense a vapor phase which includes one or more reactive or non-reactive gases or byproducts having a definable number of moles or molar flux through each respective vapor phase outlet. In at least one embodiment, the first chamber further includes a first sensor network which include two or more sensors. Each sensor may be configured for delivering one or more signals to said common signal hub. Further, the first sensor network may be configured to monitor various characteristics, such as for example, the temperature, pressure and/or composition of a gaseous environment surrounding the articles. In at least one embodiment, the apparatus further includes at least one control system. The control system may be configured for simultaneously sending a plurality of signals to, and receiving a plurality of signals from, a common signal hub. The control system may further be configured to provide a controllable unit for regulating material flows. The apparatus described herein may carry out one or more of a batch, semi-batch, semi-continuous and continuous processes, such as for example, an atomic layer deposition process or sub-process.

The various actuation mechanisms may be configured to be actuated simultaneously, synchronously or asynchronously with each other. In at least one embodiment, at least one actuation mechanism of any one or more solid phase valve assembly or solid phase pump assembly is configurable to be initiated synchronously with any one or more actuation mechanism of any one or more vapor phase valve or vapor phase pump assembly. In at least one embodiments, at least one actuation mechanism of any one or more solid phase valve assembly or solid phase pump assembly in the first chamber is configurable to be initiated synchronously with any one or more actuation mechanism of any one or more vapor phase valve assembly or vapor phase pump assembly, in the first chamber. In at least one embodiment, at least one actuation mechanism of any one or more solid phase valve assembly or solid phase pump assembly of the second chamber is configurable to be initiated synchronously with any one or more actuation mechanism of any one or more vapor phase valve or pump assembly of the second chamber. In at least one embodiment, at least one actuation mechanism of any one or more solid phase valve assembly or solid phase pump assembly of the second chamber is configurable to be initiated synchronously with any one or more actuation mechanism of any one or more solid phase valve assembly or solid phase pump assembly of the first chamber.

In yet another aspect, disclosed herein is a method for treating the surfaces of articles with a vaporous precursor. The method may include receiving a solids phase which includes articles having a definable specific surface area through one or more first solids phase inlets of a first chamber, dispensing a solids phase which includes articles having treated surfaces having a definable specific surface area through one or more first solids phase outlets of the first chamber, receiving, creating and/or accommodating a vapor phase which include one or more reactive or non-reactive gases or precursors having a definable number of moles or molar flux through one or more first vapor phase inlets of the first chamber, and dispensing a vapor phase which include one or more reactive or non-reactive gases or byproducts having a definable number of moles or molar flux through one or more first vapor phase outlets of the first chamber.

In another aspect, disclosed herein is a method for executing a surface treatment process on a plurality of articles with a reactive precursor, in a surface treatment system which includes at least one chamber and at least one control system. The method includes providing a plurality of articles, wherein the articles have a provided, estimated, measured or known specific surface area, and entering the specific surface area into a control system, entering a nominal target for the quantity, mass or unit volume of the articles to be processed into the control system of a surface treatment system, thereby defining a first total surface area target, providing a reactive precursor with which to treat the surfaces of the plurality of articles, and entering into the control system the provided, estimated, measured or known number of moles of a reactive precursor required to saturate, react with or treat the entirety of the first total surface area target using empirical or estimated process conditions, thereby defining a complete saturation quantity, and selecting a target saturation ratio, to obtain a process recipe for a batch, semi-batch, semi-continuous or continuous surface treatment process, wherein the process recipe comprises at least one target pressure level associated with the target saturation ratio.

The methods described herein may include additional steps, such as e.g., administering a target quantity, mass or unit volume of articles and a gas-phase environment into a first chamber through one or more first solid phase inlets having two or more actuation mechanisms, wherein a first actuation mechanism effectuates the transport of a predominantly gas-phase which includes gas-solids composition, and wherein a second actuation mechanism effectuates the transport of a predominantly solids-phase which includes gas-solids composition, and subsequently, administering a vapor phase which includes a target number of moles of one or more reactive or non-reactive gases or precursors to the first chamber through one or more first vapor phase inlets having one or more actuation mechanisms, wherein a first actuation mechanism effectuates the transport of the vapor phase, under conditions suitable to effectuate a surface treatment reaction, while preventing the solids phase from exiting the first chamber.

The method may further include administering a vapor phase which includes a target number of moles of one or more reactive or non-reactive gases or precursors to a first chamber through one or more first vapor phase inlets having one or more actuation mechanisms, wherein a first actuation mechanism effectuates the transport of the vapor phase, under conditions suitable to effectuate a surface treatment reaction, and subsequently, administering a target quantity, mass or unit volume of flowable articles and a gas-phase environment into the first chamber through one or more first solid phase inlets having two or more actuation mechanisms. Suitable actuation mechanisms may include actuation mechanism which effectuates the transport of a predominantly or completely gas-phase which includes gas-solids composition, and/or actuation mechanism which effectuates the transport of a predominantly solids-phase which includes gas-solids composition.

Additionally, the method may include administering a target quantity, mass or unit volume of articles and a gas-phase environment into a first chamber through one or more first solid phase inlets having two or more actuation mechanisms, wherein a first actuation mechanism effectuates the transport of a predominantly gas-phase which includes gas-solids composition, and wherein a second actuation mechanism effectuates the transport of a predominantly solids-phase which includes gas-solids composition, and synchronously administering a vapor phase which includes a target number of moles of one or more reactive or non-reactive gases or precursors to the first chamber through one or more first vapor phase inlets having one or more actuation mechanisms, wherein a first actuation mechanism effectuates the transport of the vapor phase, under conditions suitable to effectuate a surface treatment reaction, while preventing the solids phase from exiting the first chamber.

The method may include addition steps such as e.g., monitoring the signals from one or more pressure measurement sensors, and incorporating a means to increase the residence time, allowable mixing time and/or the interdiffusion rate of the gaseous and solids phases, until the at least one target pressure level is achieved, evacuating the gaseous and solid materials synchronously, asynchronously, sequentially, and/or periodically, through one or more outlets and into a transport unit, and in relation to the predominant actuation mechanism ascribed to each phase, characterizing the treated solid materials for one or more of a surface treatment loading, a specific surface area after treatment, or a particle size or size distribution after treatment, and entering the characterization value into the control system to incorporate machine learning.

The method may additionally include one or more of: evacuating gaseous and solid materials synchronously, asynchronously, sequentially, and/or periodically, through one or more outlets and into a transport unit, and in relation to the predominant actuation mechanism ascribed to each phase, and initiating a second surface treatment process by administering a target quantity, mass or unit volume of articles and a gas-phase environment into a second chamber through one or more second solid phase inlets having two or more actuation mechanisms. The first actuation mechanism may effectuate the transport of a predominantly gas-phase which includes gas-solids composition, and the a second actuation mechanism may effectuate the transport of a predominantly solids-phase which includes gas-solids composition. In at least one embodiment, the second surface treatment process in the second reactor chamber utilizes one or more of a different reactive precursor, a different operating pressure, a different operating temperature, a different residence time, or different other process parameter than was used for the first surface treatment process.

Suitable surface treatment processes may include, but are not limited to, atomic layer deposition process, molecular layer deposition process, chemical vapor deposition process, a physical vapor deposition process, molecular layering process, atomic layer chemical vapor deposition process, epitaxial deposition process, chemical grafting process, atomic layer etching process, atomic layer corrosion process, atomic layer combustion process, or any combination thereof.

In at least one embodiment, the method further includes a subsystem configured to execute one or more of a flame spray process, a combustion spray process, a plasma spray process, a spray drying process, or combinations thereof.

In at least one embodiment, the method further includes a subsystem configured to control the nominal value and the rate of change of one or more of i) a treatment pressure, ii) a treatment temperature, iii) a gas phase composition or flow rate, iv) a liquid phase composition or flow rate, v) a solute or solvent composition or flow rate, and vi) a solid phase composition or flow rate. In at least one embodiment, the method further includes a subsystem to synthesize or receive an article, a subsystem to treat the surfaces of an article, and a subsystem to apply a coating to the surfaces of an article. In at least one embodiment, the method further includes one or more of a common precursor delivery subsystem, a precursor delivery enhancement subsystem, or an exhaust treatment or recycling subsystem.

The apparatus and methods described herein are suitable for processing a plurality of composite articles synchronously, for example, discrete particles, powders, extrudates, granules, flowable articles and objects, or objects having suitable dimensions and characteristics, such as objects having a largest dimension less than 125 mm in size, and wherein the surfaces of at least 75% of said composite articles are coated or treated upon exiting the system. In at least one embodiment, the method further includes a machine learning algorithm which calculates a subprocess deviation from modeled or empirical data with information derived from one or more of a direct in-situ signal, an indirect in-situ signal, a direct ex-situ signal or an indirect ex-situ signal.

The apparatus and methods described herein are configured to produce materials suitable for use in a battery, a fuel cell, a catalyst, a capacitor, a pharmaceutical ingredient, a passive electronic component, a solar cell, a 3D printer, a semiconductor device, an integrated circuit, an optoelectronic device, a thermoelectric device, a thermionic device, an electrochemical device, a biomedical device, or an electromechanical device.

Suitable precursors for use in the apparatus and methods are described herein. In at least one embodiment, the apparatus and methods described herein are configured to utilize a precursor which includes one or more of phosphorous, sulfur, nitrogen, carbon, fluorine, chlorine, bromine or iodine. In at least one embodiment, the apparatus and methods described herein are configured to utilize a precursor which includes one or more of a phosphide, a phosphate, a sulfide, a sulfate, a nitrate, a fluoride, a chloride, a bromide or an iodide.

In another aspect, disclosed herein is an atomic layer deposition apparatus for processing articles which includes a first chamber having at least one of each of a first solids phase inlet, a first solids phase outlet, a first vapor phase inlet and a first vapor phase outlet, a second chamber having at least one of each of a second solids phase inlet, a second solids phase outlet, a second vapor phase inlet and a second vapor phase outlet, a first solids phase valve assembly or solids phase pump assembly in fluid communication with said first solids phase inlet of said first chamber, said first solid phase valve assembly or solids phase pump assembly having at least two actuation mechanisms, a first vapor phase valve assembly or vapor phase pump assembly adjacent to and in fluid communication with said first vapor phase inlet of said first chamber, said first vapor phase valve assembly or vapor phase pump assembly having at least one actuation mechanism, a second solids phase valve assembly or solids phase pump assembly in fluid communication with said second solids phase inlet of said second chamber, said second solid phase valve assembly or solids phase pump assembly having at least two actuation mechanisms, a second vapor phase valve assembly or vapor phase pump assembly adjacent to and in fluid communication with said second vapor phase inlet of said first chamber, said second vapor phase valve assembly or vapor phase pump assembly having at least one actuation mechanism, and a common signal hub.

In at least one embodiment, each actuation mechanism of the atomic layer deposition apparatus is configured for bidirectional signal communication with a common signal hub, and is selected from a group consisting of i) an instantaneous opening, ii) an instantaneous closing, iii) the controlled opening over a programmable time constant, iv) controlled closing over a programmable time constant, v) the expansion of a subcomponent to reduce the conductance through the assembly, vi) the contraction of a subcomponent to increase the conductance through the assembly, vii) a concave or convex deflection of a subcomponent, viii) rotation of a subcomponent co-linear with the direction of solid material flow, ix) rotation of a subcomponent tangential to the direction of solid material flow, x) an instantaneous increase in conductance to a position less than fully open, xi) an instantaneous decrease in conductance to a position greater than fully closed, xii) the actuation of a piston or piston-like subcomponent, xiii) an actuation delivering a secondary phase to promote aeration, contraction or expansion of the primary phase unit volume, or xiv) an actuation mechanism initiated by the electrical application of a sinusoidal, dirac function, triangular or rectangular waveform over one or more programmable time constants.

In at least one embodiment, said first chamber and second chamber of the atomic layer deposition apparatus are each configured to a) receive a solids phase which includes said articles having a definable specific surface area through each respective solids phase inlet, b) dispense a solids phase which includes said articles having treated surfaces having a definable specific surface area through each respective solids phase outlet, c) receive, create and/or accommodate a vapor phase which includes one or more reactive or non-reactive gases or precursors having a definable number of moles or molar flux through each respective vapor phase inlet, and d) dispense a vapor phase which includes one or more reactive or non-reactive gases or byproducts having a definable number of moles or molar flux through each respective vapor phase outlet.

In at least one embodiment, said first chamber of the atomic layer deposition apparatus further comprises a first sensor network which includes two or more sensors, each sensor within said first sensor network configured for delivering one or more signals to said common signal hub, said first sensor network configured to monitor the temperature, pressure and/or composition of a gaseous environment surrounding said articles.

In at least one embodiment, the atomic layer deposition apparatus further comprises at least one control system configured for simultaneously sending a plurality of signals to, and receiving a plurality of signals from, a common signal hub, said control system is configured to provide a controllable unit for regulating material flows throughout the entire apparatus.

In at least one embodiment, the atomic layer deposition apparatus further includes a third solids phase valve assembly or solids phase pump assembly in fluid communication with a) a second solids phase outlet of said second chamber, said third solids phase valve assembly or solids phase pump assembly having at least two actuation mechanisms, and b) a first transport unit having one or more actuation mechanisms and is configured for controlling the temperature, pressure and composition of a gaseous environment while regulating the material flow rate of said articles. In at least one embodiment, said first transport unit of the atomic layer deposition apparatus is in bidirectional control signal communication with a signal hub, and wherein one or more actuation mechanisms of said first transport unit is configured for synchronous actuation with said third solids phase valve assembly or solids phase pump assembly actuation mechanisms. In at least one embodiment, the outlet of said first transport unit is in fluid communication with a fourth solids phase valve assembly or solids phase pump assembly having at least two actuation mechanisms, and wherein one or more actuation mechanisms of said first transport unit is configured for synchronous actuation with said fourth solids phase valve assembly or solids phase pump assembly actuation mechanisms. In at least one embodiment, the actuation mechanism of said first transport unit that is configured for synchronous actuation with the actuation mechanism of said third solids phase valve assembly or solids phase pump assembly and the actuation mechanism of said first transport unit that is configured for synchronous actuation with the actuation mechanism of said fourth solids phase valve assembly or solids phase pump assembly are the same. In at least one embodiment, the actuation mechanism of said first transport unit that is configured for synchronous actuation with the actuation mechanism of said third solids phase valve assembly or solids phase pump assembly and the actuation mechanism of said first transport unit that is configured for synchronous actuation with the actuation mechanism of said fourth solids phase valve assembly or solids phase pump assembly are different.

In at least one embodiment, the atomic layer deposition apparatus further includes a second transport unit in fluid communication with said third solids phase valve assembly or solids phase pump assembly, and in parallel with said first transport unit, said second transport unit having one or more actuation mechanisms and is configured for controlling the temperature, pressure and composition of a gaseous environment while regulating the material flow rate of said articles. In at least one embodiment, said second transport unit of the atomic layer deposition apparatus is in bidirectional control signal communication with a signal hub, and wherein one or more actuation mechanisms of said second transport unit is configured for synchronous actuation with said third solid phase valve assembly or solid phase pump assembly actuation mechanisms.

In at least one embodiment, the atomic layer deposition apparatus is further configured to regulate the flow rate of the solids phase which includes said articles having treated surfaces to each respective transport unit, such that the specific surface area flowing through each transport unit can be defined. In at least one embodiment, the atomic layer deposition apparatus further includes a third vapor phase valve assembly or vapor phase pump assembly adjacent to and in fluid communication with and interposed between a) said first vapor phase outlet of said first chamber, and b) a first exhaust return manifold. In at least one embodiment, said third vapor phase valve assembly or vapor phase pump assembly having at least one actuation mechanism in bidirectional signal communication with said common signal hub and is configured for controlling the pressure of the gaseous environment within said first chamber.

In at least one embodiment, the atomic layer deposition apparatus further includes a fourth vapor phase valve assembly or vapor phase pump assembly adjacent to and in fluid communication with and interposed between a) said second vapor phase outlet of said second chamber, and b) a second exhaust return manifold. In at least one embodiment, said fourth vapor phase valve assembly or vapor phase pump assembly having at least one actuation mechanism in bidirectional signal communication with said common signal hub and is configured for controlling the pressure of the gaseous environment within said second chamber. In at least one embodiment, at least one actuation mechanism of a fourth vapor phase valve assembly or vapor phase pump assembly is configured for synchronous actuation with at least one actuation mechanism of said third vapor phase valve assembly or vapor phase pump assembly.

In at least one embodiment, the atomic layer deposition apparatus further includes a first precursor delivery system having one or more actuation mechanisms and in fluid communication with said first vapor phase valve assembly or vapor phase pump assembly, said precursor delivery system which includes: i) a vaporizer unit having an external heating mechanism, ii) a vaporizer unit having an external cooling mechanism, iii) a vaporizer unit having an internal heating mechanism, iv) a vaporizer unit having an internal cooling mechanism, v) a precursor volume controller configurable to the specific articles and processes being carried out in said first chamber, vi) a liquid precursor injection pumping system, vii) a solid precursor metering system, viii) one or more first capillary nozzles sized to the number of moles of precursor intended for delivery into said first chamber, ix) one or more first expansion tanks each having a definable total internal surface area, where the combination of the total surface area in all first expansion tanks is larger than the total active surface area of the articles to be saturated in said first chamber, and x) a first vaporizer unit having a rapid thermal treatment system.

In at least one embodiment, the apparatus further includes a second precursor delivery system having one or more actuation mechanisms and in fluid communication with said second vapor phase valve assembly or vapor phase pump assembly, said precursor delivery system which includes: i) a second vaporizer unit having an external heating mechanism, ii) a second vaporizer unit having an external cooling mechanism, iii) a second vaporizer unit having an internal heating mechanism, iv) a second vaporizer unit having an internal cooling mechanism, v) a second precursor volume controller configurable to the specific articles and processes being carried out in said second chamber, vi) a second liquid precursor injection pumping system, vii) a second solid precursor metering system, viii) one or more second capillary nozzles sized to the number of moles of precursor intended for delivery into said second chamber, ix) one or more second expansion tanks each having a definable total internal surface area, where the combination of the total surface area in all second expansion tanks is larger than the total active surface area of the articles to be saturated in said second chamber, and x) a second vaporizer unit having a rapid thermal treatment system. In at least one embodiment, at least one actuation mechanism of a first precursor delivery system is actuated synchronously with at least one actuation mechanism of said second precursor delivery system.

The atomic layer deposition apparatus may be configured to carry out one or more of a batch, semi-batch, semi-continuous and continuous atomic layer deposition process or sub-process.

Depending on the end-use application, the positions or locations of the chambers, inlets, outlets and valves can be modified. In at least one embodiment, the second chamber is subjacent to the first chamber. In at least one embodiment, at least a portion of the fourth solids valve assembly or pump assembly is located in the same horizontal plane as at least a portion of the first solids valve assembly or solids phase pump assembly. In at least one embodiment, the actuation mechanisms of the fourth solids valve assembly or pump assembly are configured for synchronous actuation with the actuation mechanisms of said first solids phase valve assembly or solid phase pump assembly. In at least one embodiment, the outlet of said first transport unit is in fluid communication with said first solids phase valve assembly or solids phase pump assembly having at least two actuation mechanisms, and wherein one or more actuation mechanisms of said first transport unit is configured for synchronous actuation with said first solids phase valve assembly or solids phase pump assembly actuation mechanisms.

The systems and apparatus of the present technology may be configured to operate at various pressure levels. For example, the apparatus may be configured to operate at a minimum pressure of about 0.1 Torr. In some Further, the apparatus may be configured to accommodate a pressure drop of up to about 1,500 Torr, for example.

FIG. 1 shows four of many potential configurations of the present technology. FIG. 1A illustrates a general embodiment of the present technology, a four-step method for producing an encapsulated powder with optimized substructures and surface structures with treatment step after a synthesis step and a treatment step after a coating step. The embodiment illustrated by FIG. 1A would provide an apparatus and method for producing synthesized and coated powders, which would benefit from a treatment step after synthesis and a treatment step after coating, without which would create an inferior composite powder. A more specific example of such a process is shown in FIG. 1B, in which the synthesis process comprises a flame-based or combustion synthesis type of spray pyrolysis process, the pre-treatment step comprises a rapid plasma annealing step; and the post-treatment step after the ALD coating step comprises thermal annealing. In such a process, precursors are administered into or near a flame, and particles can be synthesized in a continuous method. For some applications, an energy providing step (e.g., heat treatment, plasma treatment, electromagnetic wave/field treatment, and the like) is beneficial to promote a particular crystal phase, reduce the surface area or other attribute that without such step would create an inferior product. Such a combination of synthesis and treatment steps can be carried out in one or more of the systems described herein, and each sub-step can be connected to a common signal hub that serves as a master controller that can be equipped with machine learning capabilities. Once the conditions have been optimized for the synthesis and treatment steps, a surface modification sub-process and sub-system can be integrated into the overarching process and system. One such process, ALD, comprises a specific series of steps and sequences that occur over a particular space (Spatial ALD) or time (Temporal ALD). The specific number of steps and process conditions can be tailored to the specific product. Once the surface coating treatment is defined such that the coated workpiece or powder can be produced, certain post-treatment sub-processes can be carried out in sub-systems to fully optimize the material for its end-use application. FIG. 1C illustrates an embodiment in which multiple coating steps are included to produce a multifunctional, multi-layered, and/or hybrid coating, or a first coating material that is designed to allow its constituent components to diffuse into a first synthesized powder to create a first integrated sub-structure, with a subsequent synthesis and coating step to produce a multifunctional or hybrid super-structure, which can then undergo an optional post-treatment step. The process incorporates a slurry spray process which includes particles or powders that are formulated into a slurry with other inactive or active materials, which can be delivered through e.g., a flame spray, plasma spray or spray drying system. This process is particularly useful for a composite powder that benefits from being synthesized in two steps, where the compositions produced in the two steps are unique and cannot easily be achieved in a one-step process. This type of material can further benefit from a first ALD coating material that is applied homogeneously onto the substrate, which when processed in the second synthesis step, allows the homogeneously distributed first ALD coating material to be incorporated uniformly within the final composite particle. Subsequently a second ALD coating material can be applied to the outer surfaces of the composite material, which can be followed by another treatment step, if desirable. FIG. 1D illustrates a simplified embodiment, in which a powder is provided to a system, and treatment steps are included before and after a coating step. In this process, the powder is subjected to a pre-treatment step in one or more of the described sub-systems and sub-processes, and once the powder is coated, it is treated through similar or dissimilar treatment sub-systems and sub-processes, to produce an optimized composite substrate or powder.

Figure 2:
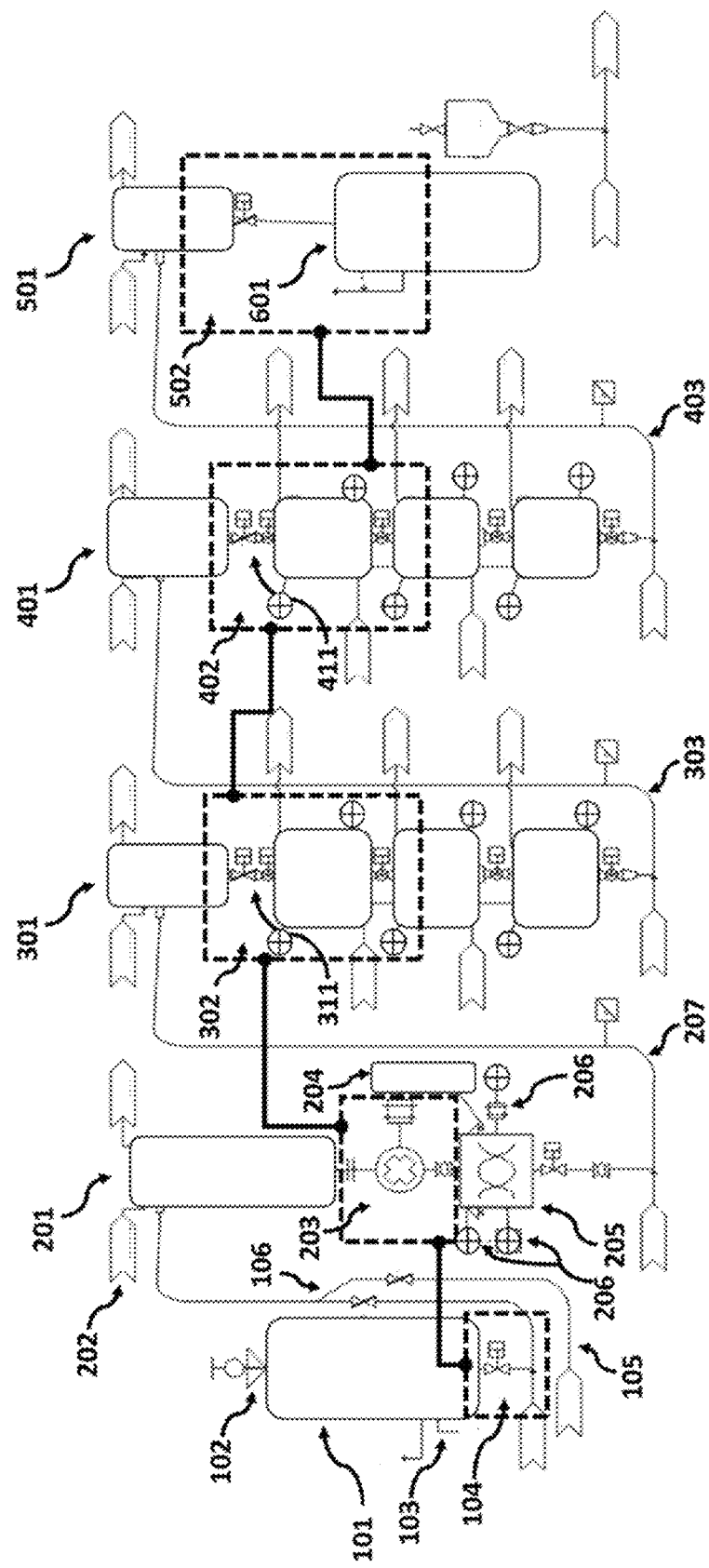
FIG. 2 is an operational flow diagram illustrating the process flow for FIG. 1A, in accordance with an exemplary embodiment of the present technology.

FIG. 2 shows a process flow diagram for one embodiment of FIG. 1A, including a synthesis subsystem, a pre-treatment subsystem, a two-step ALD coating processes in series, a post-treatment subsystem and a unit operation for collecting optimized materials, with common computer control over all critical processes and operating parameters. The process is designed to produce a composite powder product that is tailored and designed to achieve a value proposition for a customer in its end-use environment. Synthesis subsystem 101 can represent one of an array of particle synthesis systems, in which one or more precursor feedstocks are effectively delivered into a system through inlet assembly 102 at known flow rates, concentrations, temperatures, pressures, periodicity, measured and controlled through control ports 103, and the system outputs the synthesized materials through outlet assembly 104. The control ports may comprise one or more of i) valve-regulated ports designed for mass or material flow into or out of the system with optional filtration unit; ii) diagnostic ports for in-situ measurement capabilities for process matter and/or product monitoring; iii) sampling ports for extracting process matter and/or products for ex-situ measurement capabilities; iv) optical ports for monitoring process matter and/or products, such as e.g., plasma glow discharge, or FTIR spectroscopy monitoring of organic materials; v) jetted or mechanical mixing ports to deliver shear and/or agitate/mix powders, workpieces, extrudates or similar, throughout the process being carried out in synthesis subsystem. The control ports may be situated at or near the top, centrally and/or at or near the base of synthesis subsystem. In at least one embodiment, control ports of the same type or classification are intentionally situated in more than one location throughout the system, and occasionally incorporate baffles or internals that can extend from the wall through to the center of synthesis subsystem, or even through to the other side of synthesis subsystem. Upon completion, a synthesized powder exits outlet assembly in a controlled fashion and is delivered to treatment subsystem via transport units 105 and/or 106, where one represents a primary path, and one represents a secondary path that augments one or more features of the first path, including an inert flow booster system or a convective thermal modulation system.

Treatment subsystem 201 represents a pre-treatment operation that carries out a pre-treatment process. Control ports 202 are selected in type, location and frequency to execute the specific sub-process to be carried out to improve the properties of the powder synthesized in synthesis subsystem. An important feature of a treatment subsystem is a computer-controlled treatment assembly 203 that controls the overall material and mass transport of each phase relevant to the process in treatment subsystem. The treatment assembly includes a material flow valve used to control the material flow through the subsystem, configured for receiving powder directly from transport unit or staged via a hopper as depicted above the treatment assembly. The treatment assembly is typically augmented by treatment enhancer 204, which may comprise one or more of an inert gas, a reducing gas or vapor, an oxidizing gas or vapor, an etchant or otherwise chemically-reactive gas or vapor, a dopant gas, a molecular grafting vapor or other functionalization gas or vapor. In order to maximize efficiencies, the treatment enhancer is designed to be in electrical communication with the outlet assembly 104 and the transport unit 106, such that the output parameters of treatment enhancer are aligned with the known and quantified physical attributes of the synthesized material from synthesis subsystem 101. One significant feature that is monitored and passed throughout the control systems for each subsystem is the specific surface area of the substrate, powder, extrudate or workpiece. The treatment subsystem may also benefit from a treatment mixer 205, which may comprise a material mixing or blending unit (e.g., mechanical, acoustical, vibrational, and the like), such as e.g., a stirrer, blender, impellor, stator blade or a tuning fork, and an energy delivery and control means (e.g., conductive, convective or radiative heating, plasma exposure, and the like) which are fully controllable from the common signal hub. Additionally, treatment control ports 206, which are analogous in form, classification and function to control ports 103, are useful to execute certain types of sub-processes and operations in the treatment subsystem. Upon completion, a treated powder (and as provided for in FIG. 2, a synthesized and treated powder) exits the treatment subsystem in a controlled fashion and is delivered to a coating subsystem via transport unit 207.

Coating Subsystem 301 is one embodiment of a broader category of coating subsystems that can be deployed for producing the wide array of optimized products using processes, sub-processes, systems and/or sub-systems of the present technology. The coating subsystem can represent a batch, semi-batch, semi-continuous or continuous coating subsystem. Exemplary systems include batch systems described by van Ommen et al. (U.S. application Ser. No. 11/955,184), semi-batch or semi-continuous systems described by King et al. (U.S. application Ser. No. 13/069,452), and continuous systems described by Elam et al. (U.S. Application Ser. No. 14/339,058) all incorporated herein by reference. The coating subsystem 301 is designed to be compatible for conducting the process of King et al. (U.S. application Ser. No. 13/069,452), while the entire system and process incorporates important features that improve upon the systems described by Ommen et al., King et al. and Elam et al. The coating subsystem may include at least one chamber with an inlet, an outlet and a controllable unit for simultaneously regulating material flows, controlling the conversion of precursors to functionalized products, and controlling nominal operating pressures and temperatures. The coating subsystem includes at least one valve assembly 311 having an inlet and an outlet, wherein the inlet is in fluid communication with the outlet of an adjacent or superjacent chamber, and wherein the outlet is in fluid communication with the inlet of an adjacent or subjacent chamber, the valve assembly having at least two computer-controlled actuation mechanisms for maintaining nominal pressures in the adjacent chambers. The first computer-controlled actuation mechanism provides a means to release a first phase of matter without allowing other phases of matter to flow from one chamber to the other, and the second, third and so on, computer-controlled actuation mechanism(s) providing a sequential means to allow other phases of matter to flow from one adjacent chamber to a different adjacent chamber. Each system or subsystem comprises at least one computer-controlled actuation mechanism per phase of matter present within the system or subsystem, which is beyond what is contemplated in any of the systems described by Ommen et al., King et al. and Elam et al. Each computer-controlled actuation mechanism is in electronic communication with a common signal hub and at least one computer-controlled actuation mechanism for the same phase of material on a separate subsystem for controlling a separate subprocess. This is depicted conceptually by the dashed rectangles that connect subsystems 104, 203, 302, and so on; for example, one or more sub-component of coating subsystems depicted as parallel (e.g., coating subsystems 302 and 402) may further reside in the same horizontal plane if depicted in a horizontal plane, which does not preclude depicted subsystems or subcomponents from residing in a different horizontal plane. This material phase-based monitoring and control system is preferentially designed for simultaneous feed-back and feed-forward control of reactant flows, product flows, operating conditions, and a continuous monitoring of the mass or volumetric transport of the material being manufactured. The coating subsystem may further include at least one yield-improving structural or functional design feature required for the manufacture of specific material combinations suitable for use in commercial or industrial products, including precursor delivery unit, chamber geometry, analytical monitoring instrument connectivity, flow enhancers, stirrers, vibrators, agitators, heaters, filters, actuators, valves, control systems, control intelligence, or other unique design features determined to be critical to the manufacture of the products at high yield.

The coating subsystem of FIG. 2 includes at least two vertical transfer operations each equipped with an inlet, an outlet and a controllable unit for feeding and regulating material flows and transiently controlling the ambient environment. Suitably, at least one transfer operation is downward oriented and deposits material into a subjacent receiver, and at least one transfer operation (e.g., transport unit 303) is upward oriented and deposits material into a superjacent receiver (e.g., coating subsystem 401, treatment system 501, termination unit 601 or recirculating to synthesis system 101, treatment system 201 or coating subsystem 301), and wherein the feeding operations of each of the vertical transfer operations are commonly controlled and maintain a substantially uniform hourly transport rate. The system is designed to provide a synchronized flow of materials through transport units 106, 207, 303, and so on, from a common signal hub.

The second coating subsystem of FIG. 2, i.e. coating subsystem 401 is analogous to coating subsystem 301, however the subprocesses being carried out in each of these subsystems may be the same or different, depending on the substrate or workpiece, the type and/or composition of the coating, whether the subprocess represents a first-pass, second-pass or nth-pass through the subsystem, a group of subsystems or the entire system, and the nature of the performance benefit ascribed to the optimized composite material of interest and its industrial applicability.

Treatment subsystem 501 of FIG. 2 is analogous to treatment subsystem 201 and is designed to execute the fourth step shown in FIG. 1A. The subprocesses being carried out in each of the treatment subsystems may be the same or different, depending on the substrate or workpiece, the type of treatment process, whether this subprocess represents a first-pass, second-pass or nth-pass through the subsystem, a group of subsystems or the entire system, and the nature of the performance benefit ascribed to the optimized composite material of interest and its industrial applicability. For some materials and products, treatment subsystem 501 is not necessary, making this step optional, and simplifying each arbitrary scheme depicted in FIG. 1. For few other materials and products, treatment subsystem 501 represents a thermal annealing subprocess designed to improve the performance of the material that optionally passes through subsystems 101, 201, 301 and/or 401 prior to arriving at the treatment subsystem 501. For treatment processes that benefit from a residence time in excess of the time constant associated with the synchronized flow of materials, the technology provides one or more parallel systems with converging or diverging flows. These parallel systems are designed to maintain an overall uniform transport rate with properly sized transport unit and chamber/vessel volumetric capacities, and to allow for the centralized management of at least one sub-system that operates in a continuous mode, and at least one sub-system that operates in a semi-continuous or batch mode. For example, a single synthesis subsystem 101 may be a continuous process that feeds into a single semi-batch treatment subsystem 201, which may be divided up into two or more parallel product streams using diverter valves, or similar equipment, which then feed into two or more parallel coating subsystems (exemplary subsystems could be represented by semi-continuous units shown in FIG. 2). In such systems, the volumes of each coating subsystem chamber could be smaller than the volume of treatment subsystem 201. Subsequent material handling systems could be deployed to recombine the parallel product streams to feed into one common treatment subsystem 501 that then flows to a bagging operation or similar operation as depicted by termination unit 601. Alternatively, a surge tank may be used, which may collect or otherwise temporarily store a batch, sub-batch or other unit volume quantity of material, until a computer-controlled signal allows for the unit volume to re-enter the process for continued processing.

Figure 3:
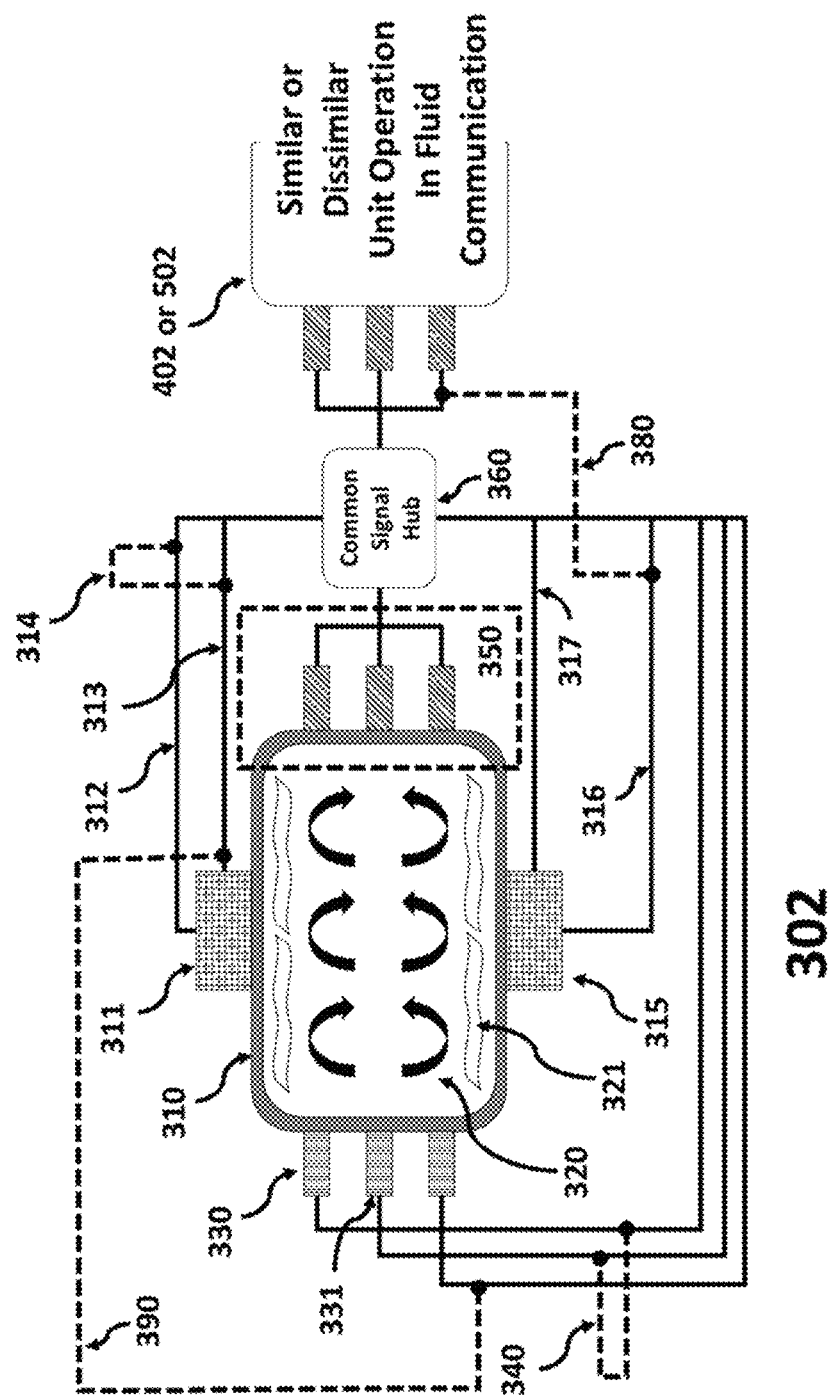
FIG. 3 is an operational flow diagram illustrating the coating subsystem depicted in FIG. 2, with a common signal hub and a control scheme for machine learning with multi-sensor controls, in accordance with an exemplary embodiment of the present technology.

FIG. 3 depicts one embodiment of coating subsystem 302, of FIG. 2A, with a common signal hub (360) and a control scheme for machine learning with multi-sensor controls by temperature, pressure, gas composition, pH or similar, with common dosing elements, common exhaust or filtration elements, and unit volume management of mass and matter throughout both the subsystem and the complete system. In this configuration, the global transport vector of one phase of material would be directed largely vertically between valve assemblies 311 and 315, and a second phase of material could be transported horizontally from individual control ports 330 or 331, e.g., or control port manifold 350 as an alternate example. Alternatively, or in addition to, one or more second phases of material may be administered through valve assemblies 311 and/or 315, before, during or after the transport of the first phase. One or more control ports may be computer controlled and have actuation mechanisms that operate synchronously or asynchronously with those of other control ports (e.g., with signal line 340) or valve assemblies (e.g., with signal line 390). Further, the system includes a signal line 380 and common signal hub 360, as a means to operate an entire system in an infinite number of configurations and/or operational modes, four of which are highlighted in FIG. 1. Additionally, coating subsystem 302 may further include at least one yield-improving structural or functional design feature required for the manufacture of specific material combinations suitable for use in commercial or industrial products, including precursor delivery unit, chamber geometry (e.g., the overly-simplified geometry represented by 310), analytical monitoring instrument connectivity, flow enhancers (e.g., 320), stirrers, vibrators, agitators, heaters (e.g., 321), filters, actuators, valves, fluidization aids or phases, control systems, control intelligence, or other unique design features determined to be critical to the manufacture of the products at high yield.

For subsystems, executing a gas-solid subprocess, e.g., the coating subsystem 302, it may be advantageous to utilize a valve assembly 311 and valve assembly 315, each of which has at least two actuation mechanisms, for controlling or metering the flow of a substrate through coating subsystem 301. The two or more actuation mechanisms may control two or more discrete subvalves within the valve assembly 311 or 315, or discrete features of a common valve, but at least one actuation mechanism would be largely dictated by the properties of the solids phase, and at least one other valve would be largely dictated by the properties of the gas phase. Each actuation mechanism may represent one or more of i) an instantaneous opening of a valve; ii) an instantaneous closing of a valve; iii) the controlled opening of a valve over a programmable time constant; iv) controlled closing of a valve over a programmable time constant, v) the expansion of a subcomponent of the valve assembly to reduce the conductance through the valve assembly; vi) the contraction of a subcomponent of the valve assembly to increase the conductance through the valve assembly; vii) a concave or convex deflection of a subcomponent of the valve assembly to change the volumetric capacity of the coating subsystem; viii) rotation of a subcomponent co-linear with the direction of bulk material flow; or ix) rotation of a subcomponent tangential to the direction of bulk material flow.

In at least one embodiment, two or more of these mechanisms may be actuated synchronously, where the two or more actuation mechanisms may be associated with a single valve assembly, or two or more valve assemblies. In at least one embodiment, the two or more actuation mechanisms may be associated with one or more valve assemblies in a sequence with no time lapse between actuations. For some materials, a time constant between actuation mechanisms may be beneficial, and is typically tied to and scales with a critical parameter such as total surface area, total volume of material, particle size or size distribution, pore size, structure or size distribution, degradation phenomena, etching or deposition rates, temperatures, pressures, and the like. In any other embodiments, it may be useful to actuate one or more mechanisms intermittently throughout some or all of the duration of the subprocess being carried out coating subsystem 302, or in a random or stochastic nature while still being controlled via a common signal hub 360. The actuation mechanisms (312, 313, 316, 317), and those of other valve assemblies in other subsystems and control ports in coating subsystem 302 are preferably controlled and coordinated through a common signal hub 360, to accommodate different coating processes, substrate variations, amongst others.

Figure 4:
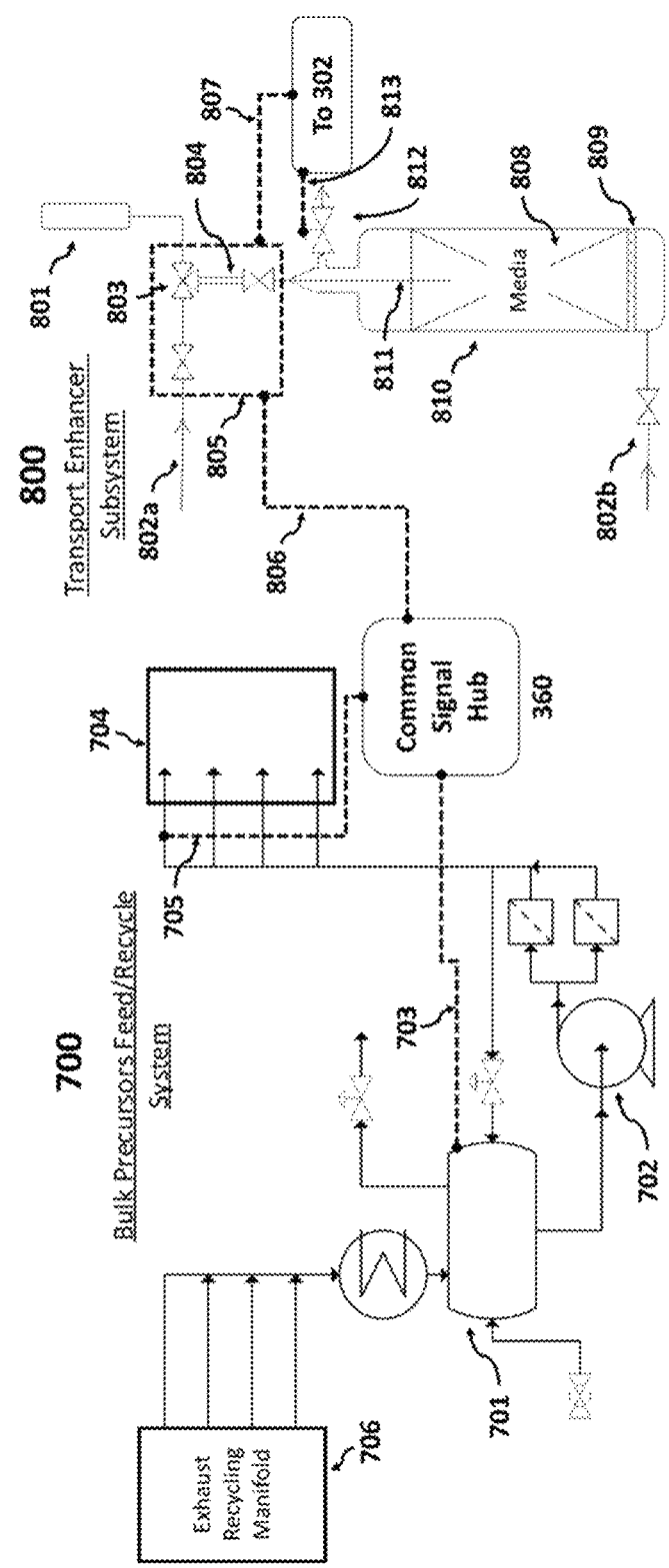
FIG. 4 is an operational flow diagram illustrating multi-zone chemical precursor storage, delivery and recycling system, in accordance with an exemplary embodiment of the present technology.

FIG. 4 exemplifies an embodiment of a precursor storage, delivery and recycling subsystem, chemical system 700, suitable for a single precursor described herein. Storage unit 701 is configured for computer-controlled delivery of chemical precursors through pump station 702 and into distribution manifold 704, which can provide a specific chemical directly to, e.g., as applied to FIG. 2, synthesis subsystem 101, treatment subsystem 201, coating subsystems 301 or 401, or treatment subsystem 501, depending on the composition and applicability of the specific chemical. The pump station 702 preferably has the ability to maintain a constant precursor pressure using a secondary valve configuration, for which all components are in electrical communication with a common signal hub. The common signal hub 360 is again represented here as a means to provide an electrical communication pathway between a specific leg of distribution manifold 704 (with signal connector 705), and, e.g., control port manifold 350 from FIG. 3. The chemical system is in electrical communication the corresponding subsystem (e.g., 101, 201, 301, 401, 501, etc.) via common signal hub 360 such that the actuation of any particular mechanism in any one or more valve assembly is in fluid communication, within or between, one or more subsystems. Further the actuation(s) of the valve assembly/assemblies may be aligned in any configuration, e.g., synchronously, consecutively, intermittently, or intermittently and offset by one or more time constants. The type of configuration depends on and scales with one or more common important parameters such as total surface area, total volume of material, particle size or size distribution, degradation phenomena, etching or deposition rates, temperatures, pressures, and the like. The time constants can be further attenuated by the distance between chemical system 700 and any particular delivery point (using signal connector 703), the flow rates from pump station 702, and recycling inputs from return manifold 706.

The transport enhancer 800 depicted in FIG. 4 is designed for two-phase (or three-phase) flow of precursors diluted in a secondary (or tertiary) media and may be particularly beneficial for the delivery of low vapor pressure liquid precursors, highly exothermic precursors, toxic or poisonous precursors, and solid precursors, and the like. The transport enhancer may be designed to vaporize a precursor by volume expansion, enhanced gas flow, greater precursor-to-vessel surface area to enhance the vaporization rate of the precursor when exposed to a gas stream, improved heat transfer, or any combination thereof. In at least one embodiment, a precursor can be fed, stored or otherwise situated in precursor vessel 801 which is in fluid communication with a valved delivery assembly 805, which in turn may be operatively connected to one or more subsystems of FIG. 2, e.g., 204, 302, 402, and so on, and may optionally include a vaporizer chamber 810, which broadly represents a vaporizing unit. The vaporizer chamber may be heated from the outside or may incorporate internal heating mechanisms. In any other embodiments, the vaporizer chamber may represent a capillary tube with the appropriate features relevant to the material being vaporized. The transport enhancer is preferably equipped with a precursor volume controller 804, which is configured to be sized based upon the one or more common important parameters such as total surface area, total volume of material, particle size or size distribution, degradation phenomena, etching or deposition rates, reaction temperatures, operating pressures, and the like, specific to the material and process carried out by the subsystem to which the transport enhancer is operatively connected, and further coordinated using common signal hub. Delivery nozzle 811 benefits from a pressure drop between the precursor volume controller and the pressure of the chamber in which the nozzle is configured to penetrate. In at least one embodiment, the transport enhancer is used to deliver a specific precursor to a coating subsystem. The common signal hub identifies the critical threshold amount of a specific precursor required to saturate the total surface area the material to be coated in the particular subprocess step corresponding with coating subsystem, and the amount is charged into an evacuated precursor volume controller. The pressure of the vaporizer chamber is simultaneously or sequentially brought to a pressure condition that is sufficiently lower than the pressure of precursor volume controller when filled with the critical threshold amount of the specific precursor. The coating chamber 310 is simultaneously or sequentially brought to a pressure condition that is sufficiently lower than the pressure of vaporizer chamber. The conditions are continually monitored by common signal hub via signal connectors 806 and 807. Alternatively, rather than controlling the precursor delivery using pressure differentials, gravitational conveying may be sufficient for the delivery of some solid precursors, such that they can be dropped in, either directly or indirectly, in whole or in part. In some cases, vaporizer chamber 810 is filled with packing media 808, and is configured to have a higher surface area than the total surface area of the material to be coated in the particular subprocess step corresponding with coating subsystem 302. In at least one embodiment, the packing media may have a lower surface area. The vaporizer chamber may be optionally equipped with a rapid thermal treatment system, designed to rapidly disengage any precursor from packing media at a prescribed time. Alternatively, or in addition to, a reactive gas may be incorporated in such a system to enhance the ability to clean and change-over the vaporizer chamber without removing the packing media. The vaporizer chamber may be operatively connected to an additional secondary or tertiary media delivery system via one or more of purge port 802a, which would be in fluid communication with the chamber when valved delivery assembly 805, via valve 803, is so operatively configured or purge port 802b which is in fluid communication with the chamber optionally via a distributor plate 809.

Each subsystem that utilizes any specific low vapor pressure liquid or solid precursor could benefit from having one or more dedicated transport enhancers 800 in fluid communication per each precursor inlet assembly, versus a conventional centralized chemical system 700 with a single distribution manifold 704 that is operatively connected to one or more subsystems, as disclosed in, e.g., U.S. Patent Publication No. 2008/0202416 by Provencher et al. In at least one embodiment, one or more legs of distribution manifold 704 may be configured to be in fluid communication with a precursor vessel 801 to more precisely deliver and manage a precursor that is not characterized as a low vapor pressure liquid precursor, a highly exothermic precursor, a toxic or poisonous precursor, a solid precursor, or other difficult or dangerous precursor. In such a configuration, the vaporizer chamber 810 may represent, e.g., coating chamber 310 in FIG. 3, into which delivery nozzle 811 could directly penetrate for efficient precursor delivery. The transport enhancer may be utilized e.g., to increase the throughput of material produced in a subsystem by at least 10%, or to increase the precursor consumption efficiency by at least 5%, relative to the subsystem without the presence of the transport enhancer. In the case of processes largely dictated by surface area (such as coating or grafting processes) total surface area may be utilized as a critical parameter. For processes such as oxidation, reduction and etching, both surface area and reaction penetration depth that can define a volumetric value may be utilized as a critical parameter. For processes such as thermal annealing, granulation or aggregation to achieve a particular secondary particle size, a length scale such as average diameter may be utilized as a critical parameter. These processes and potential critical parameters are not intended to be limiting to the invention but rather are included as a representative subset of parameters that have been qualitatively or quantitatively identified and monitored at the input and output of each subsystem of interest and permit machine learning for process and product optimization through the common signal hub.

Figure 5:
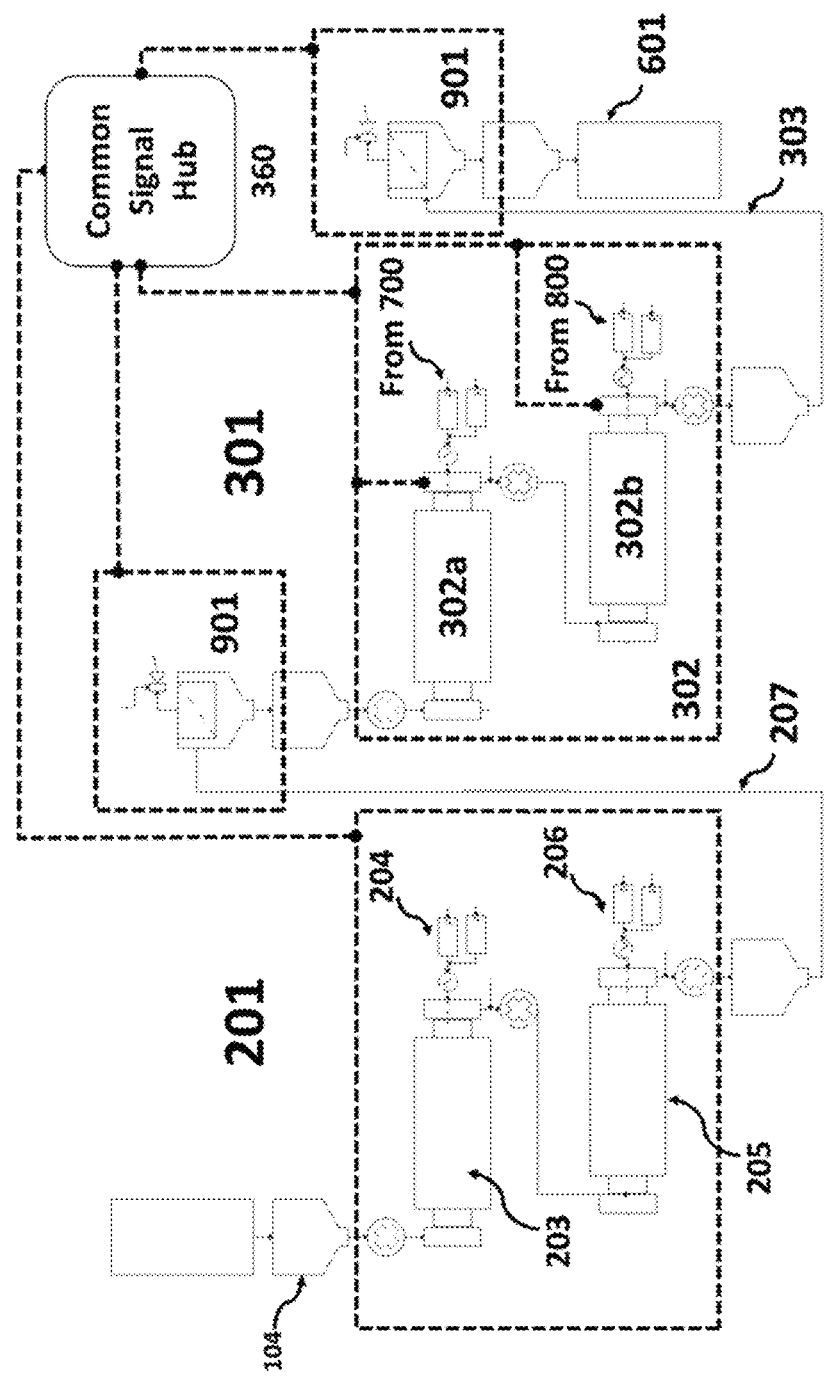
FIG. 5 is an operational flow diagram illustrating a sequence of dual-stage rotary treatment system configured for pre-treatment, surface coating, or post-treatment operations for low vapor pressure liquid and solid precursors, in accordance with an exemplary embodiment of the present technology.

FIG. 5 illustrates another embodiment of the present technology, which comprises a pretreatment subsystem 201 that feeds into a coating subsystem 301, each which includes dual-stage rotary systems, in electrical connection with common signal hub 360. In this configuration, the batch or continuous rotary reactor subsystems for treatment and coating are connected to transport units 207 and 303, respectively, where each transport unit feeds into a separator system 901 before entering a subsequent unit operation. Of particular relevance to this system is the parameter monitoring required to achieve an efficient operating system. The process illustrated in FIG. 5 begins with an as-received powder from a bulk bag unloader or outlet assembly 104, which is transported to treatment assembly 203 to execute a first treatment step, e.g., a mild reducing gas exposure, which is provided by treatment enhancer 204, and carried out in a first rotating batch system. Process parameters such as exposure time, rotational speed, concentration, pressure and temperature may be driven primarily by total surface area in this exemplary first treatment step. In a second treatment step, the material enters treatment mixer 205 at a predetermined rate, and a secondary treatment step may be administered under computer-controlled conditions via treatment control ports 206. If the function of this second treatment step is to uniformly pre-heat materials for hot-flow into the subsequent coating step, the process parameters may be driven primarily by factors such as mass, thermal conductivity and/or heat capacity. Separator system 901 may represent cyclone separators or other gas-solid classification system, in which case material density, particle size and flow rates through transport units 207 and 303 are important parameters for operational quality. Once the material passes through the first separator system 901 and enters a coating subsystem 302, represented by batch-style rotating drum reactors, an exemplary coating process may be carried out in one or more unit operations in series or parallel. FIG. 5 exemplifies a configuration in which one precursor is delivered to coating subsystem 302a from chemical system (via one leg of distribution manifold), and a different precursor benefits from delivery to coating subsystem 302b with the additional assistance from a transport enhancer. A separate transport enhancer may be operatively connected to coating subsystem 302a, if desirable. In all cases, every coating subsystem (and every individual subcomponent that benefits from sending or receiving communication signals therein) is in electrical connection with the common signal hub 360. The important parameters for processes carried out in coating subsystem may rely most heavily on the total surface area of the material, but further process refinement based on both material parameters and precursor properties may be required when using transport enhancer. FIG. 5 further represents an embodiment wherein the material is staged between batch (201), continuous (901), batch (301), continuous (901) to a semi-batch termination unit 601, which comprises at least two vertical transfer operations each having an inlet, an outlet and a controllable unit for feeding and regulating material flows and transiently controlling the ambient environment. In such a system, at least one transfer operation is downward oriented and deposits material into a subjacent receiver, and at least one transfer operation is upward oriented and deposits material into a superjacent receiver. Further, the feeding operations of the vertical transfer operations are commonly controlled and maintain a substantially uniform hourly transport rate. The system may include a control system designed for simultaneous feed-back and feed-forward control of chemical reaction reactant flows, chemical reaction product flows, chemical reaction operating conditions, and a continuous monitoring of the mass or volumetric transport of the material being manufactured. At least one sub-system that operates in a continuous mode, and at least one sub-system that operates in a semi-continuous or batch mode may also be included. This serves to quantify and log all intrinsic and extrinsic properties and parameters of interest throughout an entire production system in common signal hub, as a means to maximize the manufacturing efficiency of the composite product.

Figure 6:
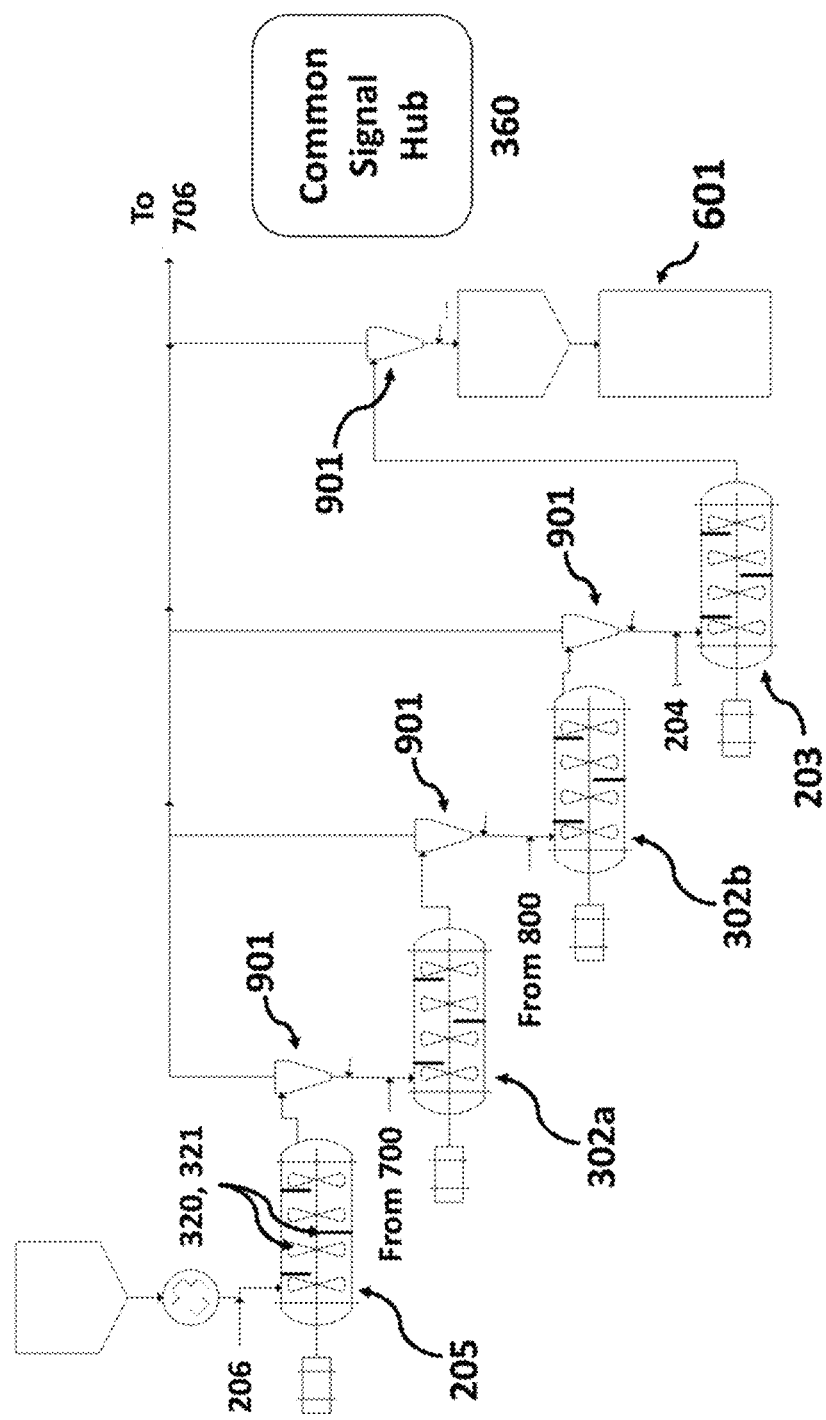
FIG. 6 is an operational flow diagram illustrating a multi-stage continuous treatment and/or coating system, in accordance with an exemplary embodiment of the present technology.

FIG. 6 illustrates a schematic of a multi-stage spatially-arranged continuous treatment and/or coating system which includes individual synchronized unit operations with computer control, with integrated machine learning to optimize the process conditions and transport properties throughout the system. Initial batch and/or semi-batch operations are incorporated to monitor and control inputs; and material exits the entire system at a final batch or semi-batch unit operation. The exemplary process flow diagram shown in FIG. 6 includes identically-sized unit operations, which would require the transport rate through any individual subsystem to be the same, however in reality, the sizes and number of parallel reactors running each sub-process would be scaled based upon the critical parameters associated the precursors, materials and products, and monitored and controlled with common signal hub 360 (implied connections not shown). Representative continuously stirred reactors are shown throughout, with flow enhancers, baffles, internals, stirrers/agitators, etc., represented by 320 and 321, which leads to good product homogeneity. An advantage of this embodiment which incorporates a series of discrete continuous units, versus a single continuous unit without an internal separator system as taught by Elam et al. (U.S. Application Ser. No. 14/339,058), is that each separator unit (901) allows for the disengagement of gas-phase reactants and products from treated substrates, and further allows different effluent streams to be managed and/or recycled without mixing the streams, overcoming any potential issues with precursor mixing and precursor utilization. The separator system can be further improved with an additional inert purge applied to the dip leg, which creates an inert curtain to minimize gas-phase material carryover to each subsequent continuous agitated vessel. Additional advantages of this system include the ability to operate at higher than atmospheric pressure, which leads to higher throughput capabilities and facilitates treatment and coating of higher surface area materials. In some embodiments, radial mixing is dominant, in others, axial mixing is dominant. Reactor chambers may be mounted at a 0°, 1°, 2°, 3°, 4°, 5°, 6°, 7°, 8°, 9°, 10°, 11°, 12°, 13°, 14° or 15° angle from the horizontal plane, where lower angles are better suited for higher surface area materials that benefit from higher residence time.

Figure 7:
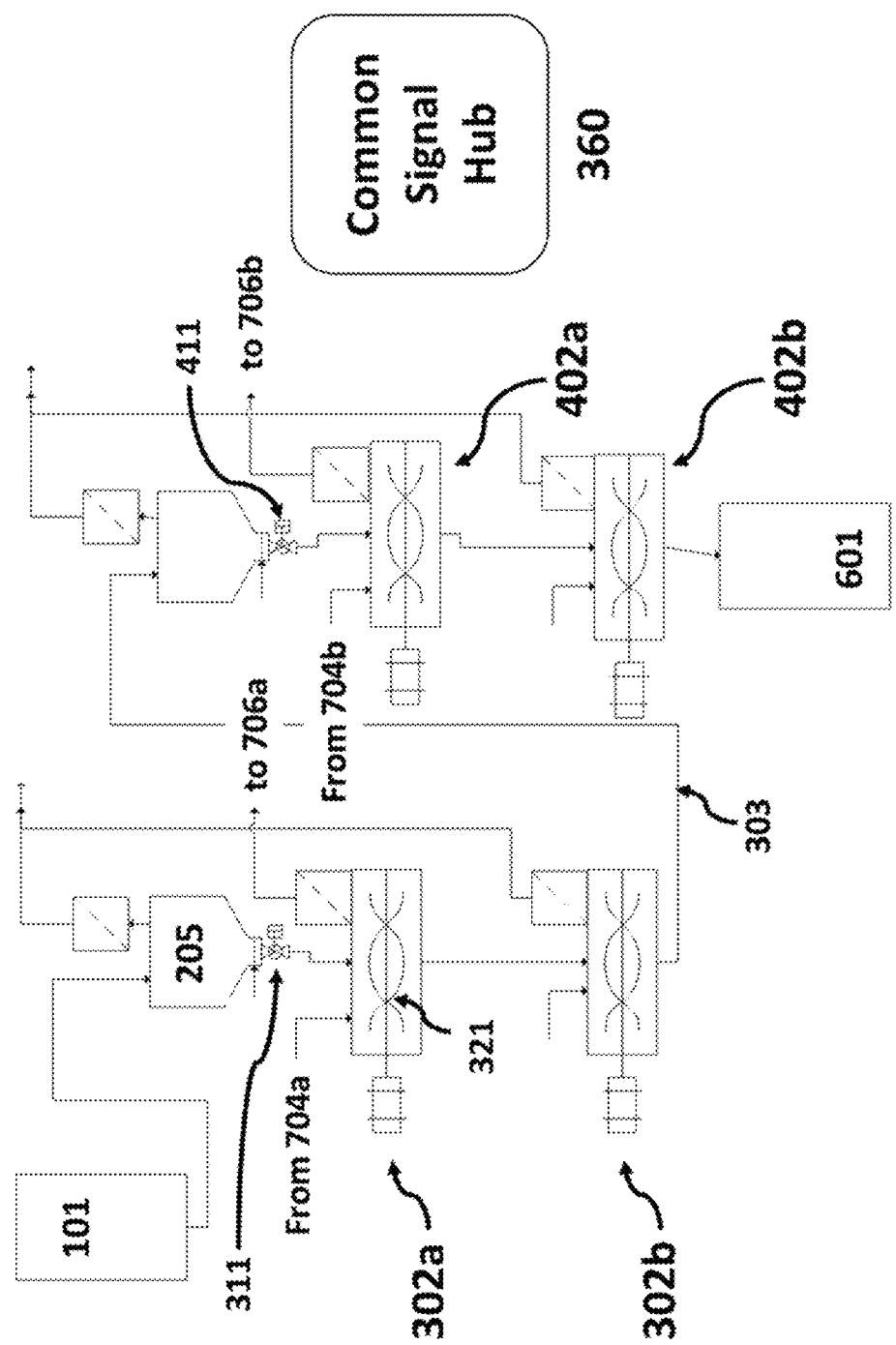
FIG. 7 is an operational flow diagram illustrating a multi-stage batch, semi-batch, semi-continuous or continuous treatment and/or coating system, in accordance with an exemplary embodiment of the present technology.

FIG. 7 illustrates a schematic of a multi-stage batch, semi-batch, semi-continuous or continuous treatment and/or coating system which includes individual synchronized mechanically-fluidized unit operations with computer control, and with integrated machine learning to optimize the process conditions and transport properties throughout the system. In this configuration, powdered or flowable articles or substrates are optionally synthesized using synthesis system 101 and are conveyed to, or loaded manually or automatically into, treatment subsystem 205. The treated substrate is administered into coating subsystem 302a through valve assembly 311 having an inlet and an outlet, wherein the inlet is in fluid communication with the outlet of an adjacent or superjacent chamber, and wherein the outlet is in fluid communication with the inlet of an adjacent or subjacent chamber. The valve assembly 311 has at least two computer-controlled actuation mechanisms for maintaining nominal pressures in the adjacent chambers, where at least one computer-controlled actuation mechanism is available per phase of material present within the subsystem. The first computer-controlled actuation mechanism provides a means to release one phase of matter without allowing other phases of matter to flow from one chamber to the other. The second, third and so on, computer-controlled actuation mechanism(s) provide a sequential means to allow other phases of matter to flow from one adjacent chamber to a different adjacent chamber. The system of FIG. 7 also includes a common signal hub 360 designed for simultaneous feed-back and feed-forward control of chemical reaction reactant flows, chemical reaction product flows, chemical reaction operating conditions, and a continuous monitoring of the mass or volumetric transport of the material being manufactured. The system may include two parallel coating subsystems (e.g., as depicted by 302 and 402 from FIG. 2), each having with an inlet, an outlet and a controllable unit for feeding and regulating material flows and transiently controlling the ambient environment, wherein at least one transfer operation is downward oriented (e.g., valve assemblies 311 and 411) and deposits material into a subjacent receiver, and at least one transfer operation is upward oriented (e.g., transport unit 303) and deposits material into a superjacent receiver. The feeding operations of the vertical transfer operations are commonly controlled by the common signal hub and maintain a substantially uniform hourly transport rate, as coating subsystems 302a and 302b are executing similar processes as coating subsystems 402a and 402b, respectively. One or more mechanical fluidization systems (321) may be present within each subsystem chamber, such as a rotor, ribbon, stator or paddle, and precursors can be configured for gas-phase, liquid-phase or solid-phase injection into the reactor under mechanical fluidization conditions. Continuous, intermittent or periodic evacuation of reaction byproducts may be performed, while precursor injection may take place initially only, or simultaneously, sequentially, periodically, pulse-wise or asynchronously with respect to evacuation steps. Mechanical fluidization system 321 serves a dual function of supporting the substrate evacuation process. This system is beneficial for treating and coating particles and flowable substrates having a wide size distribution, as well as those ranging from solid to highly porous. For example, materials having a specific surface area from about 0.01 m$^2$/g to about 1.5 m$^2$/g may be processed without periodic evacuation steps. Materials having a specific surface area from about 1.5 m$^2$/g to about 50 m$^2$/g may be processed with multiple evacuation steps and one or few precursor dosing steps. Materials having a specific surface area from about 50 m$^2$/g to about 2,000 m$^2$/g may be processed with multiple sequential, pulse-wise evacuation and dosing steps to complete surface saturation, and/or may incorporate bumper tanks configured for achieving higher precursor pressures and concentrations without risking condensation to minimize precursor delivery time. This configuration has the ability for the mechanical mixing system to serve the dual function of both internal mixing during processing, as well as effectively pumping material into discharge nozzles and to subjacent or otherwise sequential unit operations. Integral bag filters may be utilized to improve the flexibility of the precursor administration and byproduct evacuation steps, allowing each subsystem to "breathe" without disrupting product integrity. Alternatively, or in addition, various types of pneumatic conveyors, mechanical conveyors, vibrating devices, gas delivery jets, sonic devices and the like can be used to transport the coated powder or flowable material to the next consecutive reactor.

Figure 8:
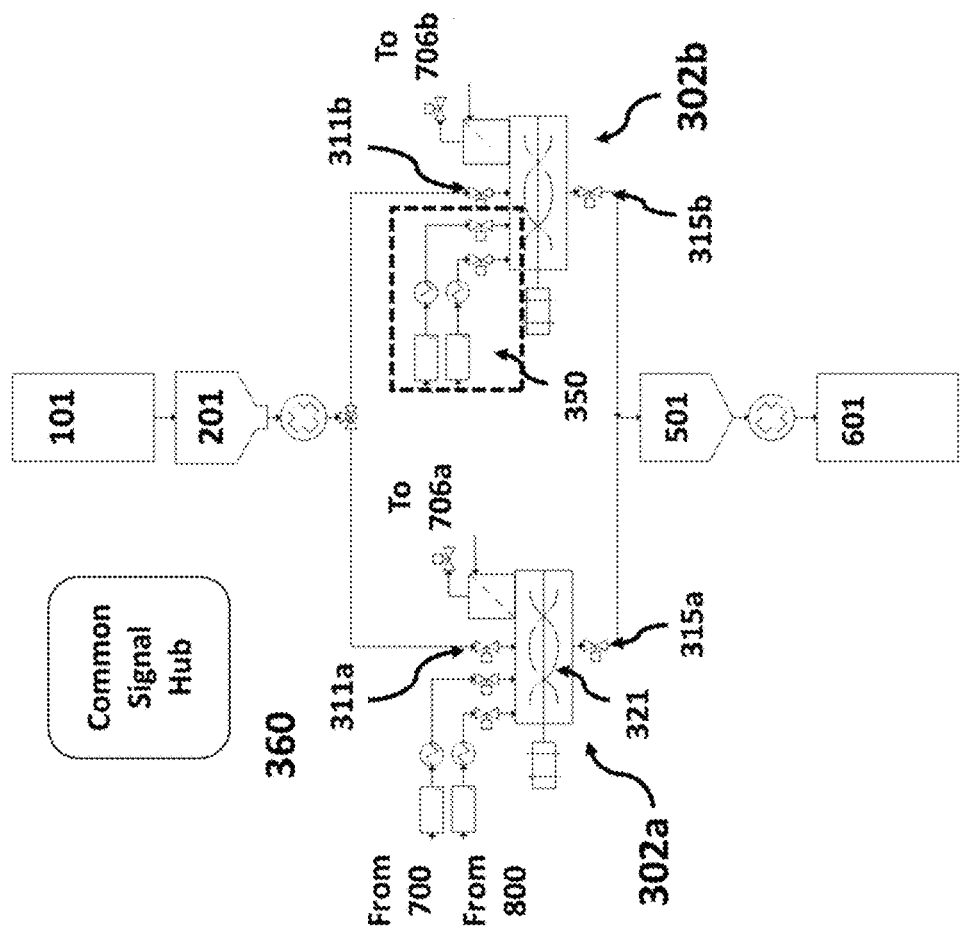
FIG. 8 is an operational flow diagram illustrating a common synthesis subsystem, a common first treatment subsystem, a distributed and/or parallel and synchronized coating system, in accordance with an exemplary embodiment of the present technology.

FIG. 8 illustrates a schematic of a system, optionally comprising a common synthesis subsystem 101, a common first treatment subsystem 201, a distributed and/or parallel and synchronized coating subsystem 302a and 302b including sub-chambers with computer control via common signal hub 360 (connections to all labeled and unlabeled subcomponents not shown), each with integrated machine learning to optimize the process conditions and bidirectional transport properties throughout each individual subsystem, followed by a recentralization system for a common second treatment subsystem 501 and a termination unit 601. The system includes two parallel inlet valve assemblies 311a and 311b and outlet valve assemblies 315a and 315b, for controlling or metering the flow of a substrate through coating subsystems 302a and 302b, respectively, each of which has at least two actuation mechanisms. The two or more actuation mechanisms may control two or more discrete sub-valves within valve assembly 311 or 315, or discrete features of a common valve, but at least one actuation mechanism would be largely dictated by the properties of the solids phase, and at least one would be largely dictated by the properties of the gas phase. Each actuation mechanism may represent one or more of i) an instantaneous opening of a valve; ii) an instantaneous closing of a valve; iii) the controlled opening of a valve over a programmable time constant; iv) controlled closing of a valve over a programmable time constant, v) the expansion of a subcomponent of the valve assembly to reduce the conductance through the valve assembly; vi) the contraction of a subcomponent of the valve assembly to increase the conductance through the valve assembly; vii) a concave or convex deflection of a subcomponent of the valve assembly to change the volumetric capacity of the coating subsystem; viii) rotation of a subcomponent co-linear with the direction of bulk material flow; or ix) rotation of a subcomponent tangential to the direction of bulk material flow. Mechanical fluidization system 321 serves a dual function of both mixing and supporting the substrate evacuation process. In such a combined series and parallelized subsystem approach, material and process information in bidirectional flow or communication with each control port manifold 350, and/or chemical subsystem 700 and/or transport enhancer 800, must be carefully monitored and controlled, particularly for steps and substeps with different natural time constants based upon particle size, surface area, size distribution, density, heat capacity, thermal conductivity, magnetic susceptibility, functional groups and/or site density, or similar property, and the control system must provide for simultaneous feedback and feed-forward control of chemical reaction reactant flows, chemical reaction product flows, chemical reaction operating conditions, and a continuous monitoring of the mass or volumetric transport of the material being manufactured. At least one sub-system is present that generally operates in a continuous or pseudo-continuous mode, and at least one sub-system that operates in a semi-continuous or batch mode, and the system is configured to quantify and log all intrinsic and extrinsic properties and parameters of interest throughout an entire production system in common signal hub 360, as a means to harmonize and maximize the manufacturing efficiency of the composite product.

Figure 9:
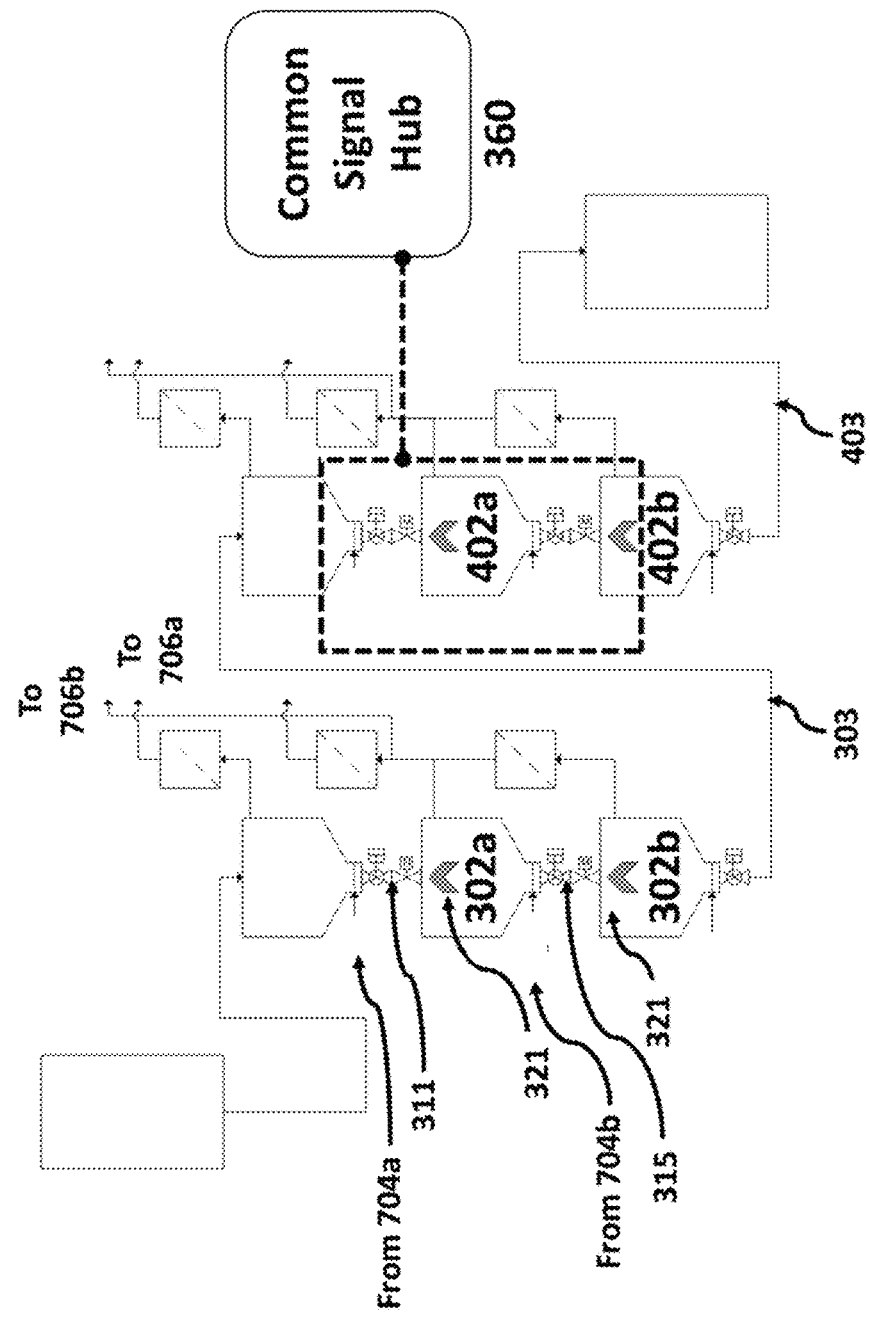
FIG. 9 is an operational flow diagram illustrating an asynchronous gas-solid coating or treatment system, in accordance with an exemplary embodiment of the present technology.

FIG. 9 illustrates a schematic of an asynchronous gas-solid coating or treatment system including individual semi-continuous sub-chambers with external filtration and multiple actuation mechanisms to allow for computer control and machine learning, internal mixing aids, gas distribution mechanisms and/or solids flow controls. The subsystems in FIG. 9 may emulate coating subsystems 301 and 401 in FIG. 2, except for the addition of mixing internals 321 into each chamber specifically designed to further enhance powder mixing. The mixing internals are located adjacent to and in fluid communication with one or more gas delivery inlets (e.g., such as those identified in control port manifold 350 in FIG. 3). Precursor and powder mixing is enhanced by application of one or more of a gas distribution unit and a powder distribution unit, reducing the gas-powder intermixing time by at least about 25%. The addition of reactor internals to facilitate powder bulk mixing may reduce gas-powder intermixing time by at least about 50%. Gas distribution nozzles are preferentially both designed and strategically located to mitigate powder bridging issues that may be present for specific types or classes of powders. Both coating subsystem 302 and coating subsystem 402 include at least two vertical transfer operations each having an inlet, an outlet and a controllable unit for feeding and regulating material flows and transiently controlling the ambient environment. In this depiction, the coating subsystem N comprises at least one transfer operation from chamber 302a is downward oriented and deposits material into subjacent receiver 302b, and transport unit 303 is upward oriented and deposits material into a superjacent receiver in coating subsystem N+1, and wherein the feeding operations are commonly controlled and maintain a substantially uniform hourly transport rate. Both machine learning and solids transport rates (e.g., in transport units 303 and 403) mitigate any maximum batch size limitations that may exist in equivalent subsystems that do not incorporate the benefits of mixing internals 321, and also allows the processing of higher surface area materials at a higher materials throughput. One or more standard valving operations may be utilized to control the solids transport and/or circulation rate throughout entire system.

Figure 10:
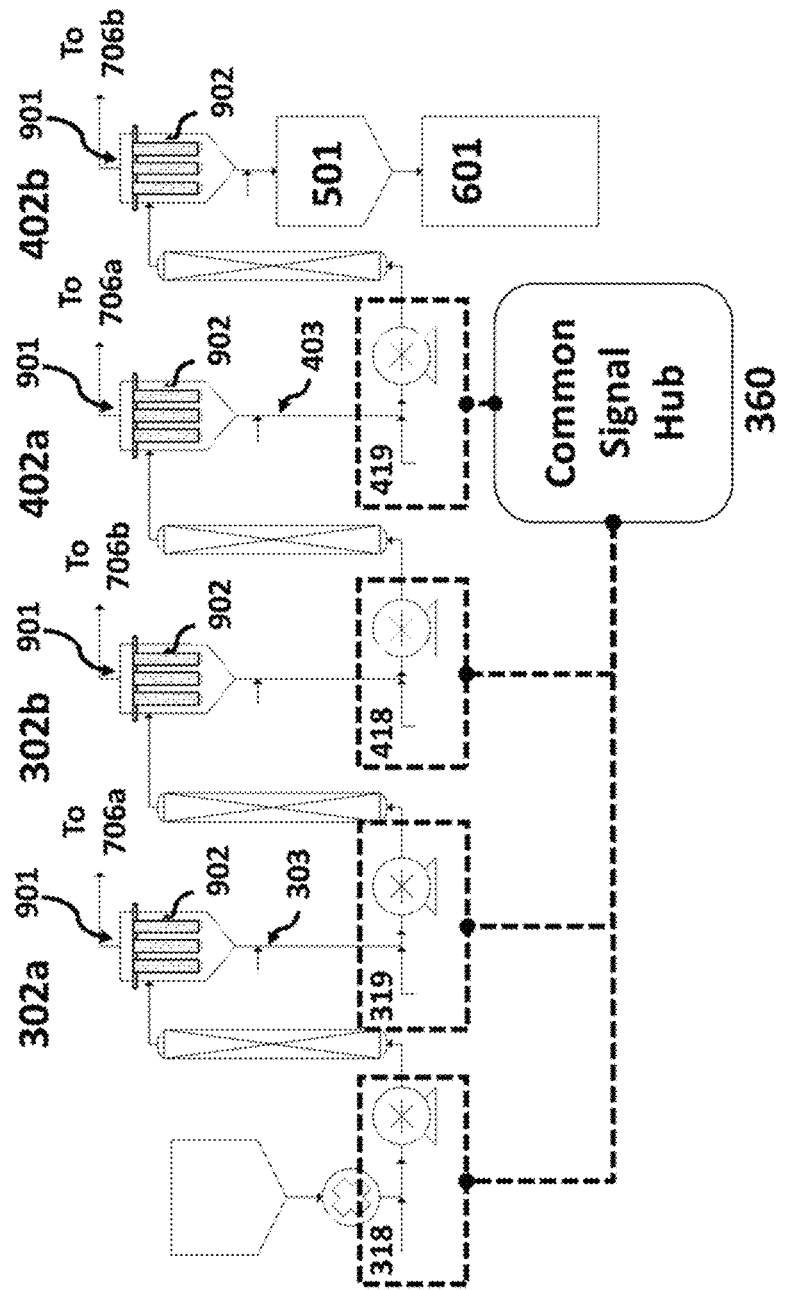
FIG. 10 is an operational flow diagram illustrating a synchronous gas-solid coating or treatment system, in accordance with an exemplary embodiment of the present technology.

FIG. 10 illustrates a schematic of a synchronous gas-solid coating or treatment system including individual synchronized sub-chambers designed for co-current flow/transport, with external filtration, effluent management, solids flow and transport management controls with computer control and machine learning. In this configuration, valve assemblies 311 and 315 are replaced with pump assemblies 318 and 319, respectively, for sequential step 'a' and sequential step 'b'. Similar to the actuation mechanisms present within each aforementioned valve assembly, each of the pump assemblies 318 and 319 have at least two actuation mechanisms and provide a means for controlling or metering the flow of both a gas phase and a solids phase through coating subsystems 302a and 302b, respectively. The two or more actuation mechanisms may control two or more discrete pump subassemblies within pump assembly 318 or 319, or discrete features of a common pump, but at least one actuation mechanism would be largely dictated by the properties of the solids phase, and at least one would be largely dictated by the properties of the gas phase. Each actuation mechanism may represent one or more of i) an instantaneous increase in pumping speed; ii) an instantaneous decrease in pumping speed; iii) the electrical application of a sinusoidal, triangular or rectangular waveform to control pumping speed variations over one or more programmable time constants; iv) the expansion of a subcomponent of the pump assembly to reduce the conductance through the pump assembly; v) the contraction of a subcomponent of the pump assembly to increase the conductance through the pump assembly; vi) a concave or convex deflection of an inline valved subcomponent within the pump assembly to change the volumetric capacity of the pump assembly; vii) the actuation of a piston or piston-like subcomponent within the pump assembly to provide a temporary step function increase or decrease in system pressure; vii) rotation of a subcomponent tangential to the direction of bulk material flow to alter the transport vector of the delivered materials; or viii) incorporating a secondary phase to promote aeration, contraction or expansion of the primary phase unit volume during processing.

FIG. 10 illustrates a system wherein each coating subsystem has a dedicated external separation system 901, with filter assembly 902 that is selected based on the specific properties of the materials, precursors, temperatures, pressures and other process conditions. Many powders are comprised of small particles, resulting in aeratable and sometimes cohesive Geldart Group C or Group A powders. In this configuration, the aeratable and cohesive nature of these powders can be leveraged in a continuous transport-type reactor, and also allows for operation at elevated pressures. The powders are may be aerated using precursor gas diluted in an inert solvent, or using jets, nozzles or similar impingement known devices to the industry. The co-currently fed and aerated powder and precursors are pumped or conveyed through coating subsystem 302a at a specified operating temperature using pump assembly 318. The precursor may suitably be added on the suction side of the pump, such as when certain types of pumps are used and pump cavitation is responsible for completing the precursor-powder bulk mixing. In such a configuration, a critical length of piping is installed on the discharge side of the pump, which defines the residence time for the coating subsystem process to occur. For example, in the case of an ALD process, the length of piping would be constructed based upon the specific surface area of the materials, the estimated saturation loading of the precursor, the target operating pressure and pump speed of the coating subsystem, and the throughput objectives for the specific end-use application of the materials. The length can be designed such that any desired reactions come to completion before any residual unreacted precursor and byproduct gases are separated from the powder in any separation system 901 at filter assembly 902 (e.g., hot gas filter elements). A purge step (typically inert) can also be implemented in the dip leg of the hot gas filter to minimize precursor, or other material considered to be a contaminant of a subsequent subprocess, being carried over to the next stage. The embodiment of the system depicted in FIG. 10 may be operated at slightly higher-than-ambient pressure, by design.

Figure 11:
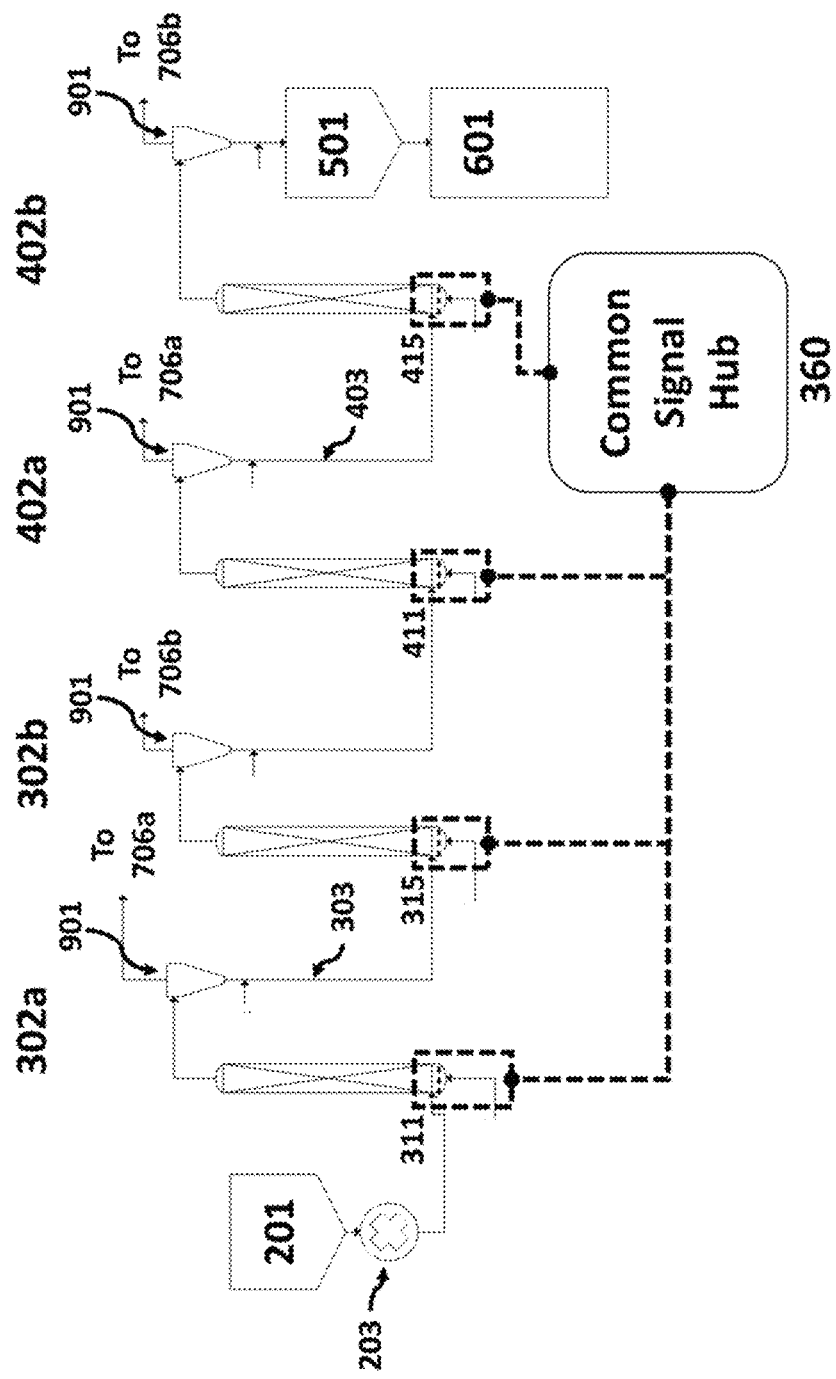
FIG. 11 is an operational flow diagram illustrating an asynchronous gas-solid coating or treatment system, in accordance with another exemplary embodiment of the present technology.

FIG. 11 illustrates a schematic of a synchronous gas-solid coating or treatment system including continuous transport chambers with external filtration and separation, including multiple gas flow actuation mechanisms to allow for computer control and machine learning, to maximize gas-solids flow controls and system pressures for efficient operation. Similar to previous embodiments, coating subsystem 302a, 302b, 402a, or 402b is in-line between similar or dissimilar processing subsystems for synthesis, treatment or coating, having valve assemblies 311, 315, 411 and 415 each separated by discrete separation systems 901. In this embodiment, each valve assembly manages continuous, tangential streams of gas and solid being transported through each reactor chamber. Each valve assembly is in electrical communication with common signal hub 360 as a means to tightly control each subprocess that occurs in each different subreactor. 302a and 302b may be used to execute different surface coating chemistry, which necessitates different (but known or otherwise predictable) parameters including, but not limited to, temperature, pressure, flow rates, concentrations, reactor diameters, and piping lengths. Without the common signal hub, materials and processes would become intermingled and lead to ineffective processing steps and loss of material/product. Ultimately this subsystem may preferential for powders with larger particle size that fall into Geldart Group B or Group D. In an embodiment that applies ALD in coating subsystem 302 onto Group B or Group D powders, ALD can be accomplished in these sequential fluidized bed riser reactors, here depicted with a cyclone-type separation unit. Both powder and a diluted precursor are metered into chamber 302a using valve assembly 311 (which could be interchanged with a pump assembly 318) and fed to the bottom of a riser reactor. The precursor, typically diluted in an inert gas, is used at the fluidization and/or elutriation medium in the riser reactor. The well-mixed nature of the fluidized bed and the distributed gas contacting is responsible for precursor-powder mixing and product homogeneity. Suitably the reactor may be operated as a bubbling fluidized bed (e.g., having superficial gas velocity of about 0.5 to about 2.0 ft/s) and having a large height to diameter ratio (e.g., greater than 2), however other operational regimes may be beneficial for certain periods of operational time. Unreacted precursor and product gases are separated from coated powder in a conventional cyclone. In order to minimize precursor carryover to the next step, N2 purge to the cyclone dip leg is provided. A purge step (typically inert) can also be implemented in the dip leg of the hot gas filter to minimize precursor, or other material considered to be a contaminant of a subsequent subprocess, carry over to the next stage. The embodiment of the system depicted in FIG. 11 would preferentially be operated at slightly higher-than-ambient pressure, by design.

Based on the similarities between FIG. 10 and FIG. 11, some embodiments of the system may benefit from including a subsystem 101, 201, 301, 401 or 501 that incorporates both a valve assembly and a pump assembly, as a way to further modulate and control the flow of material within a subsystem. Other embodiments of the system will have at least one subsystem that operates in a continuous mode, and at least one subsystem that operates in a semi-continuous or batch mode, where one or more subsystem may comprise one or more valve assemblies, and one or more subsystem may comprise one or more pump assemblies.

Figure 12:
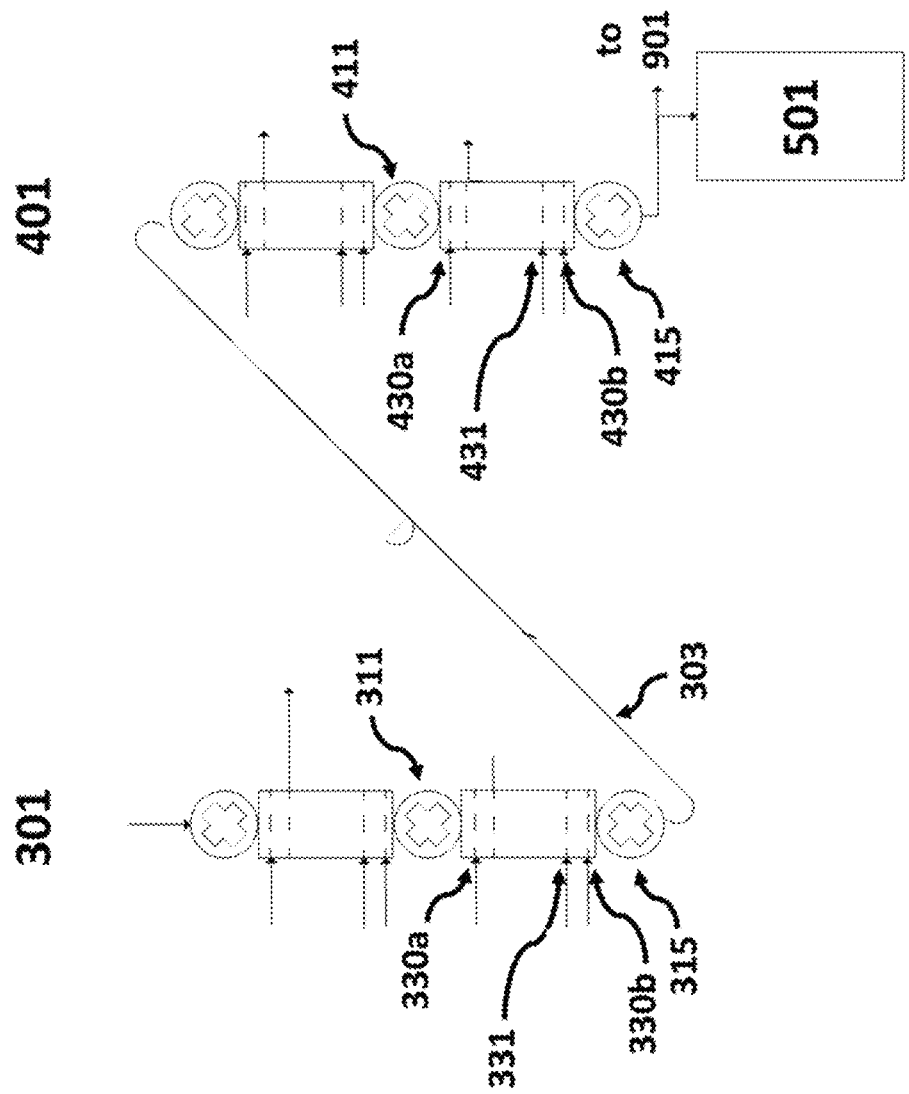
FIG. 12 is an operational flow diagram illustrating an asynchronous gas-solid coating or treatment system, in accordance with yet another exemplary embodiment of the present technology.

FIG. 12 illustrates a schematic of an asynchronous gas-solid coating or treatment system including individual synchronized sub-chambers with synchronized gas inputs in fluid communication with the top and bottom of each sub-chamber, external filtration, gas recycling, multiple actuation mechanisms to allow for computer control and machine learning, solids flow controls, and a mechanical transport mechanism. In this configuration, coating subsystems 301 and 401 are configured to apply ALD or MLD coatings onto particles, small flowable objects, catalyst pellets, extrudates, granules or other movable materials that may not easily be characterized as particles or powders, such as e.g., Geldart Class D materials. When porous objects are to be treated, coated or otherwise functionalized, common signal hub 360 (not shown) must configure and modulate the flow rates and pressures to accommodate high surface area processes (as the number of moles required for complete surface saturation corresponds to the operating pressure of the system). When catalyst pellets or extrudates are intended to be used as a substrate, the coating subsystem 301 provides multiple individual control ports 330a and 330b, where one or more individual control ports is situated at or near the top or at or near the bottom of the reactor chamber. The purpose of the plurality of ports is to be able to rapidly modulate the pressure of the system, in some cases upwards to facilitate diffusion into potentially tortuous pore networks; in some cases downwards to rapidly evacuate the system uniformly; in some cases to provide a gas blanket to prevent precursor mixing. One or more pressure modulating individual control ports may be co-located with precursor delivery port 331, which may be connected to precursor delivery system 700, transport enhancer 800, or similar beneficial subsystem designed for process enhancement. In this embodiment, porous particles, pellets or extrudates are fed to the top of a reactor pipe and continuously removed from the bottom of the reactor. Gas distributors and a gas collector are positioned at different elevations within the reactor. The individual ALD half cycles are separated by valve assembly 311, 315, 411 or 415, a transport unit 303 or by staged flush gas and gas collection. In some cases, a valve assembly (or pump assembly) may preferentially include an inert gas purge feature, which can support cleaning, flushing, purging, aeration, etc.

Figure 13:
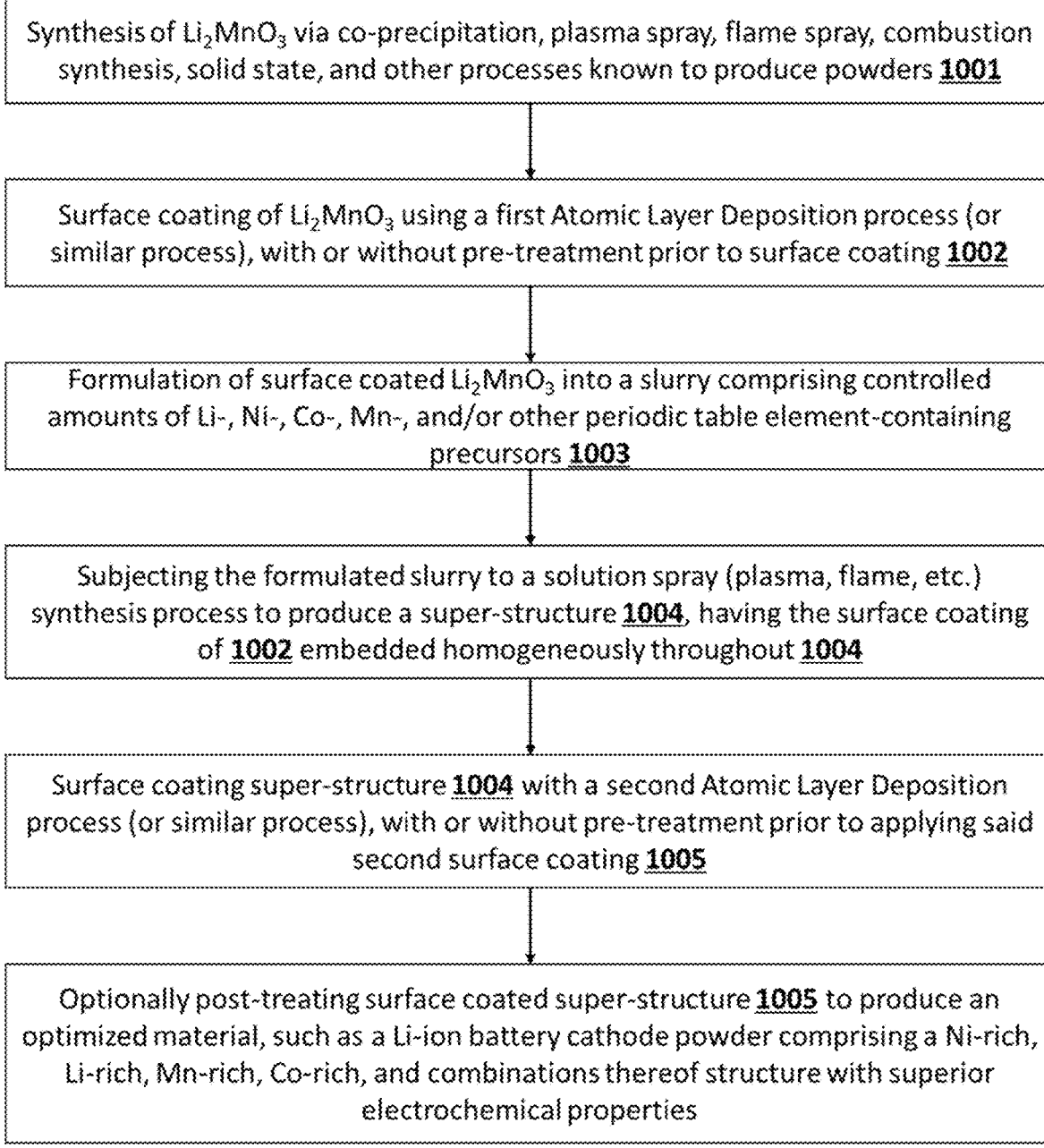
FIG. 13 is an operational flow diagram illustrating the process flow for producing an optimized Lithium-ion battery cathode powder, in accordance with an exemplary embodiment of the present technology.

FIG. 13 illustrates an exemplary flowchart for producing an optimized Li-rich and Mn-rich Lithium-ion battery cathode powder having low capacity/voltage fade, high energy density and suitable for 4.5-4.8V upper cutoff voltage operation. A first powder is synthesized in a first synthesis subsystem, producing powder 1001 that has a particular size, size distribution, surface area, true density, tap density and elemental composition, using one or more of the precursors referenced within this specification or the specification or text of any incorporated reference. Next, powder 1001 is transported into a coating subsystem, in which a specific surface coating is applied, forming powder 1002. Powder 1002 is directly formulated into a slurry 1003 in a third subsystem, and is combined with precursors of specific elements in ratios determined to produce an optimal second material phase when in combination with the constituent components of powder 1001. The slurry is administered into a second synthesis subsystem, to produce a composite powder 1004, which at this point comprises a first core of a first material, an inner coating of a second material, and another phase of a third material, which is largely disposed on the surfaces of powder 1002, except for any preferential restructuring or rearrangement that occurs during the process that is carried out in the second synthesis subsystem. Powder 1004 is transported into a second coating subsystem, onto which a final surface coating is applied to produce powder 1005, which is then transported to a treatment subsystem, to produce a composite powder 1006. In an alternate embodiment, an additional treatment step may occur after one or more of the first, second, third or fourth steps, in addition to after the fifth step. Final composite powder 1006 has superior properties compared to an analogous process wherein one or more steps described herein is absent. Additionally, as Lithium ion battery cathode materials tend to be moisture and/or air sensitive, the ability to execute all steps in an in-line process without exposing any materials to air, moisture or other deleterious environment, provides for the manufacture of optimal composite powders, flowable objects or workpieces that can be transported through such systems in an automated fashion.

Figure 14C:
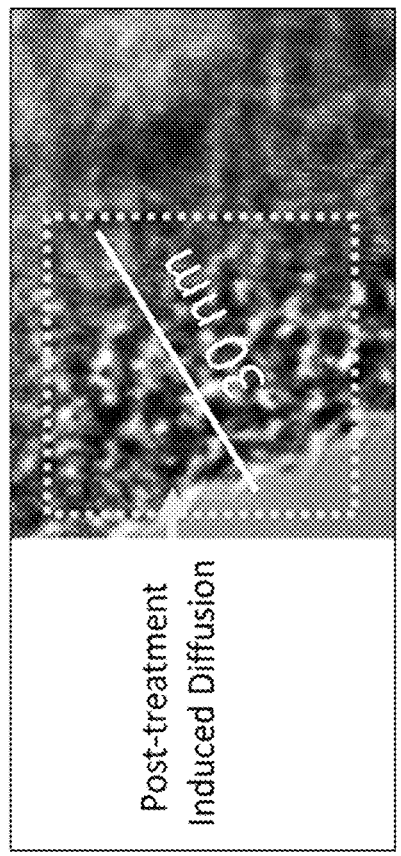
FIG. 14C is a schematic diagram of a TEM image of a substrate powder of the method of FIG. 1D which is pre-treated and then surface coated using an ALD process, followed by a post-treatment process, in accordance with an exemplary embodiment of the present technology.
Figure 14B:
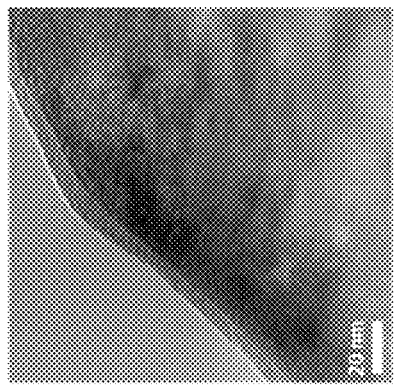
FIG. 14B is a schematic diagram of a TEM image of a substrate powder of the method of FIG. 1D which is pre-treated and then surface coated using an ALD process, in accordance with an exemplary embodiment of the present technology.
Figure 14A:
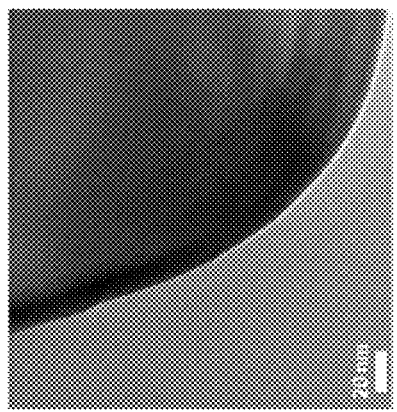
FIG. 14A is a schematic diagram of a TEM image of a substrate powder of the method of FIG. 1D which is pre-treated, in accordance with an exemplary embodiment of the present technology.

FIG. 14A-C are TEM (transmission electron microscope) images depicting an embodiment of the method of FIG. 1D, in which a substrate powder is pre-treated using any of the described pre-treatment steps herein (FIG. 14A), followed by surface coating using an ALD process (FIG. 14B) in a coating subsystem 301, followed by a post-treatment process that provides for diffusion of the surface coating species and creates a penetrated coating region of greater thickness than the starting coated material (FIG. 14C).

Figure 15:
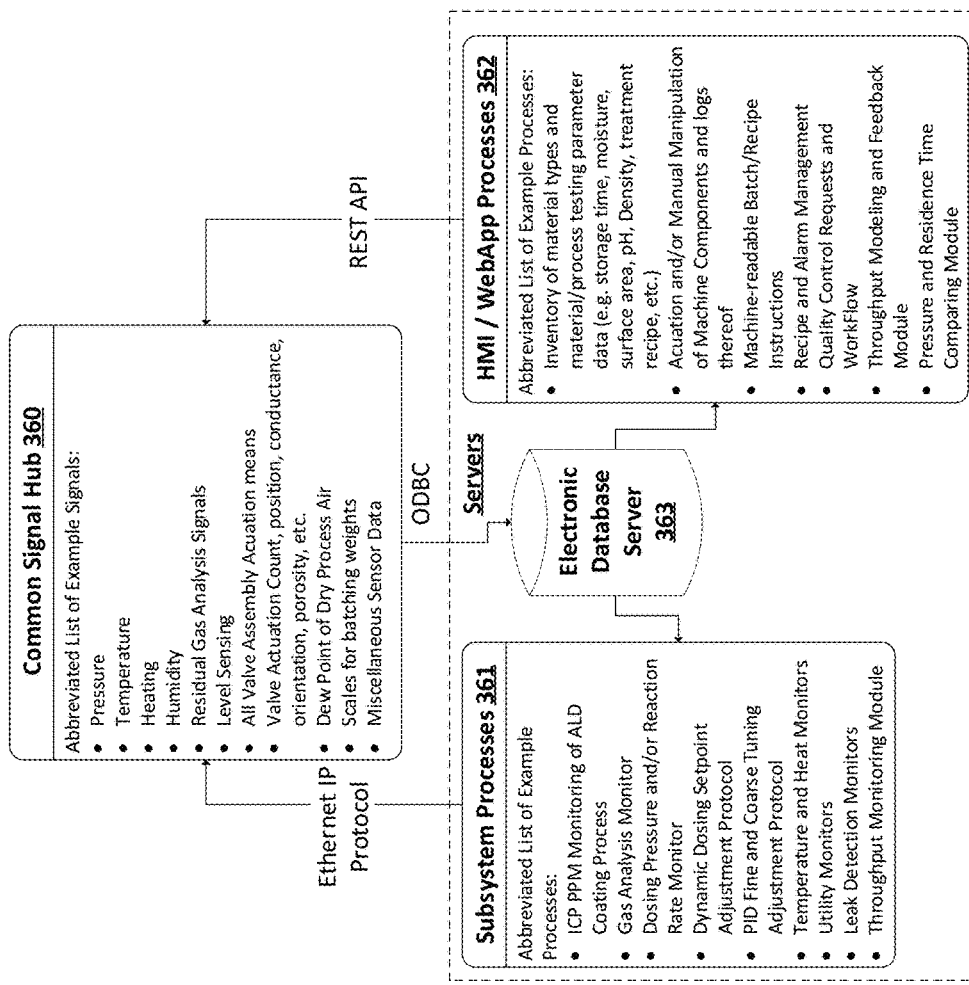
FIG. 15 is a block diagram illustrating the interrelation between the common signal hub and the computer-controlled processes, in accordance with an exemplary embodiment of the present technology.

FIG. 15 illustrates an embodiment of the types of data streams, signal classifications and communication approaches that can be deployed by common signal hub 360, and the processes by which the common signal hub monitors specific static and dynamic features of the composite material manufacturing system, controls each subsystem and sub-component in sequence with both feed-back and feed-forward methodologies, which allows machine learning. Process data is collected through a Programmable Logic Controller (PLC) and accompanying controller modules. In one embodiment, a PLC can be used to regulate field instrumentation that are distributed throughout the manufacturing system and facility. Such a PLC can be used to establish an Open Database Connectivity (ODBC) stream with a Database Server. In a preferred embodiment, the Database Server and PLC are managed on the same network which allows simple connectivity and monitoring access over a physical Ethernet layer.

In one embodiment, the PLC may be used to regulate field instrumentation for monitoring and controlling one or more of temperature, heat, pressure, humidity, gas composition (e.g., reactants, catalyzers, products, byproducts, inert streams, humidity, etc.), safety detectors, interlocks and countermeasures such as chemical extinguishers, substrate quantity levels (e.g., volumes, heights, weights, etc.), one or more valve assembly actuation level, position, orientation, conductance and/or contact, recipe and subprocess synchronization and/or sequence check steps, and scales for batch weight/control periodically, such as the start and/or end of each subsystem process 361. In some embodiments, the raw signal and/or instrumentation data may be streamed continuously at a particular frequency (e.g., for some subcomponents, frequencies of about 0.1 to about 1 Hz or about 2-10 Hz; for other subcomponents, about 30, 50 or 60 Hz, and so on) to the Database Server over ODBC. In other embodiments, the data may be streamed intermittently, synchronously or asynchronously with particular critical signals being sent to or received from any particular sub-component or subsystem of the entire system. In some embodiments, one or more bidirectional signals are transmitted between valve assembly 311 or 315 and common signal hub 360, such that one or more actuation mechanisms are triggered in coating subsystem 301 (e.g., to initiate or otherwise continue operation of transport unit 303), coating subsystem 401 (e.g., synchronously actuating valve assembly 411 or 415 with valve assembly 311 or 315, respectively), or treatment subsystem 501. Server data preferentially generates both a time and positional stamp at the time of record entry to effectively index the database server and provide a comprehensive view of all work in progress. One further objective of the common signal hub and its associated database server is to allow for a manufacturing facility to quickly become compliant with one or more governmental or non-governmental regulations and/or compliance metrics set forth by any tradecraft oversight body, or any quality management and/or standardization entity such as the International Organization for Standardization. A similar objective is to allow for a manufacturing facility to track data on and reduce the number of safety and process failure incidents. In an exemplary embodiment, the server database is distributed across the facility network which allows for simple client access and server processing applications. Server processing applications make dynamic feed-forward and feed-back loops possible for ALD continuous manufacturing. Additionally, client connections with the electronic database server 363 and common signal hub 360 allow for manual interaction with the process.

Figure 16:
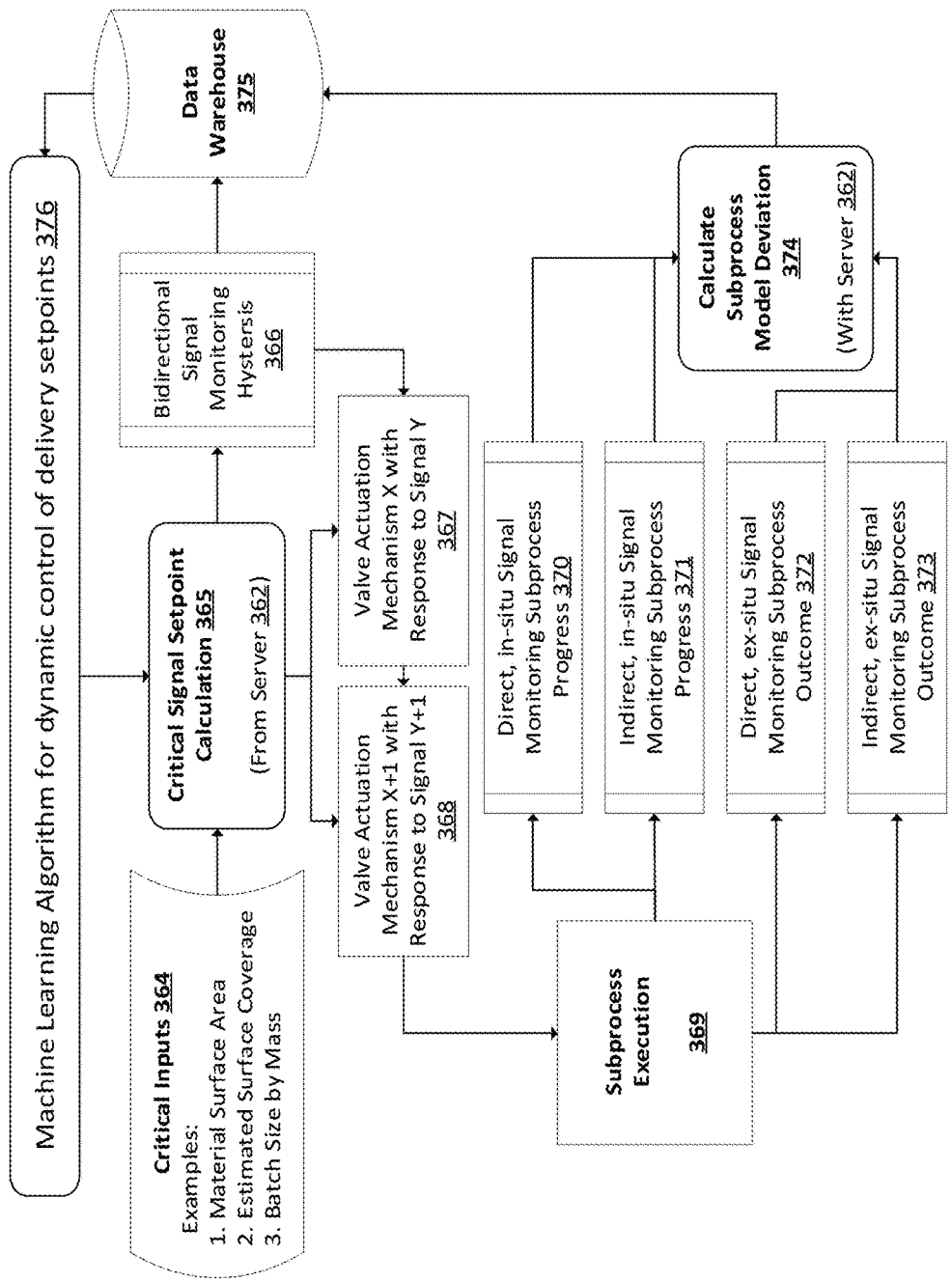
FIG. 16 is a block diagram illustrating the methods used to provide process controls to one or more valve-dependent subsystems based on critical inputs stored in the electronic database server, in accordance with an exemplary embodiment of the present technology.

FIG. 16 depicts the digital process flow that allows for feedback and feed-forward (e.g., machine learning) process controls over any particular process setpoint in any subsystem. In an embodiment in which operating pressure is the target parameter and the subsystem is coating subsystem 302, critical inputs 364 may include the specific surface area of the material, the estimated surface coverage of the coating material, and the average batch size to be processed per unit time. Critical signal setpoint calculation 365 incorporates critical inputs 364 into subsystem-relevant information from server 362 to execute the signal setpoint calculations, and begins executing the bidirectional signal monitoring hysteresis 366 baselining process. In an embodiment where coating subsystem 302 comprises a valve assembly 311 (inlet) and/or 315 (outlet), the valve assembly would have least one actuation mechanism that would be largely dictated by the properties of the solids phase, and at least one would be largely dictated by the properties of the gas phase, the properties of each of which are stored in server 362. Valve actuation mechanism X and valve actuation mechanism X+1, are triggered by signal Y and signal Y+1, respectively. Each actuation mechanism X or X+1 may represent one or more of i) an instantaneous opening of a valve; ii) an instantaneous closing of a valve; iii) the controlled opening of a valve over a programmable time constant; iv) controlled closing of a valve over a programmable time constant, v) the expansion of a subcomponent of the valve assembly to reduce the conductance through the valve assembly; vi) the contraction of a subcomponent of the valve assembly to increase the conductance through the valve assembly; vii) a concave or convex deflection of a subcomponent of the valve assembly to change the volumetric capacity of the coating subsystem; viii) rotation of a subcomponent co-linear with the direction of bulk material flow; or ix) rotation of a subcomponent tangential to the direction of bulk material flow. In this embodiment, valve actuation mechanisms X and XC+1, triggered by signal Y and Y+1, respectively, are represented graphically by 367 and 368, respectively. Signals 367 and 368 are in predetermined states at the start of subprocess execution 369, after which they are independently controlled dynamically throughout the entirety of subprocess execution 369, using monitoring progress features 370 and 371 from an ongoing execution step, while monitoring outcome features 372 and 373 represent historical processes, steps or trends of same or similar subprocesses. Subprocess model deviation calculator 374 utilizes all relevant information to determine the deviation between inputs, outputs, expected values and actual values, and interpolation steps are incorporated when gaps exist in sets of data. The parameter logs store all information in data warehouse 375, which upon compilation with historical data and trends, a machine learning algorithm 376 is thus provided as a predictive mechanism that updates critical signal setpoint calculation 365 and subprocess model deviation calculator 374.

Figure 17:
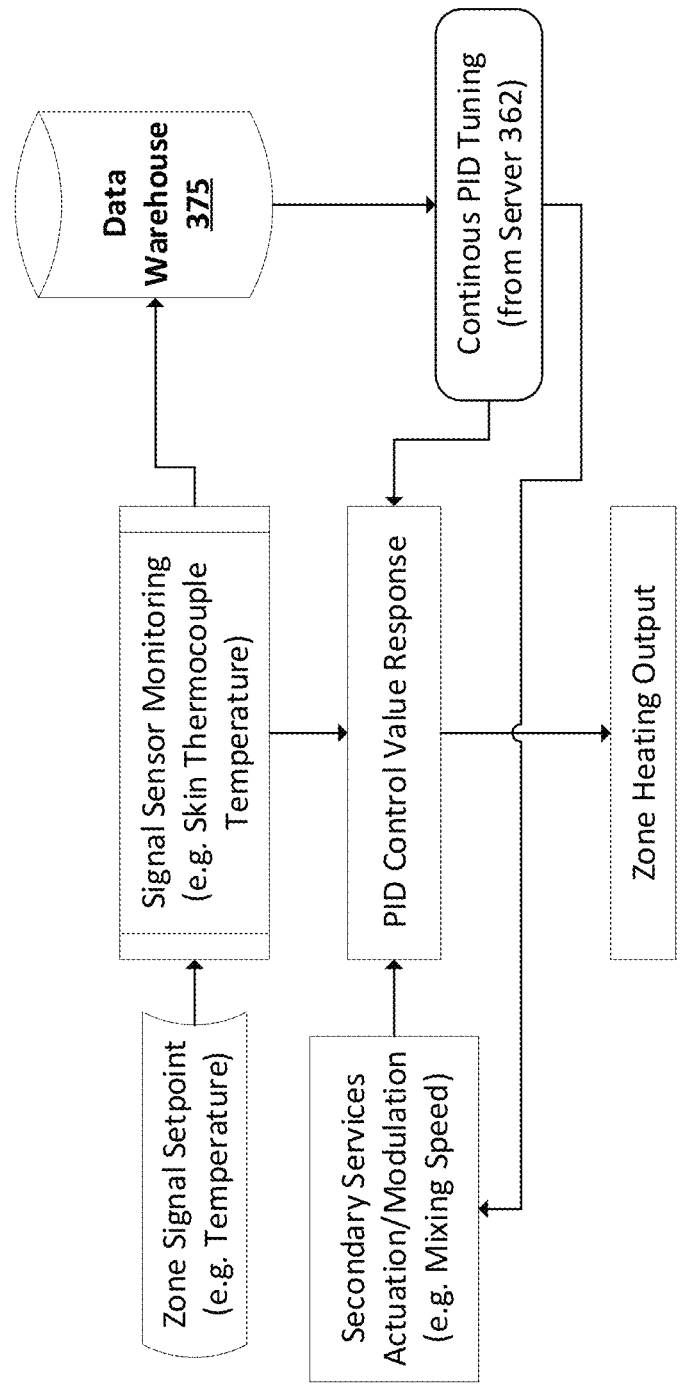
FIG. 17 is a block diagram illustrating the control scheme behind a temperature signal and control loop, in accordance with an exemplary embodiment of the present technology.

FIG. 17 depicts an embodiment of the control scheme behind a temperature signal and control loop, which includes a primary method of increasing temperature by delivering additional heat, as well as a secondary method from secondary services that are programmed to be interrelated as indirect effect drivers with a critical percentage of applicability. In one embodiment, in which the subprocess is a flame spray synthesis process being carried out in synthesis subsystem 101, a plurality of thermocouples are situated along the critical dimensions of the subsystem reactor. Each has a control setpoint, a signal monitor, a value response, and is continuously tuned based on data from both data warehouse 375 and server 362. The important feature is how Machine learning algorithm 376 (not depicted) evolves over time, which allows for the background identification of secondary services that can be actuated or modulated to reduce the lag time required for the tuning algorithm to achieve a particular process parameter setpoint. The machine learning algorithm may generate a dynamic list of available secondary services associated with primary control systems, assign weighting percentages to each secondary service, which also is updated over time. This matrix of weighted effects allows the machine learning algorithm to actuate one or more secondary services to improve process efficiency, reduce process costs, increase subsystem uptime, reduce maintenance intervals, reduce raw materials waste, reduce process time, or any combination thereof. The machine learning algorithm will monitor process failure and safety incident event cause and effect in order to maximize the robustness of the process and facility safety.

The systems, apparatus and methods described herein may encompass any type of reactor configuration or configurations, where particles, powders, small objects or other flowable materials or substrates are conveyed from a system inlet through to a system outlet, passing through one or more subsystems, typically two or more subsystems, carrying out or executing specific processes that are critically-linked to the physicochemical properties of the substrate(s), which may change throughout the execution of the series of applied subprocesses, but are able to be modeled, monitored or otherwise tracked throughout the system. The system comprises an array of predetermined steps in which tailored subprocesses are carried out from a comprehensive database and controlled via a common signal hub, for feedback, feedforward and/or machine learning control. One or more subsystem configurations may include one or more towers having one or more predominantly vertical transfer or transport mechanisms, one or more units having one or more predominantly horizontal transfer or transport mechanisms, one or more common transport units conveying or otherwise moving substrates from one subsystem to the next in series. Optionally a subsystem configuration may comprise one or more units suitable to divert and/or separate materials amongst two or more identical subsystems operating in a synchronized fashion, which amongst other benefits includes an ability to align the hourly transport rate while executing continuous, semi-continuous, semi-batch or batch processing steps in series, where each has a similar or dissimilar substrate flux or residence time through each subsystem executing the specified processing step.

For further flexibility, substrates may optionally be recycled or recirculated back into one or more subsystems to increase the overall residence time though a subprocess, align the hourly transport rate with other subprocesses requiring or not requiring recycling or recirculation processes, or preferentially doubling the effect of the application of any given subprocess or series of subprocesses if a recycling or recirculation step transports materials backwards in a sequence by more than one subsystem or subprocess. Depending on the type, value, production costs and/or volumes of composite material, the installation cost of a second series of subsystems may be justified to be included in a particular system, rather than recycling or recirculating substrates through previously utilized subsystems in a manufacturing process.

Any apparatus or reactor in any aforementioned subsystem of the present technology may include many additional components or features as may be necessary or helpful to perform the desired reactions. For example, one or more inlet ports may be in fluid communication with external sources of the reactive precursor(s). Various types of valves, pumps and metering and/or sensing devices may be provided to ensure accurate dosing of the reactive precursors. One or more inlet ports may be in fluid communication with a source of a purge gas, or a sweep gas, again optionally in conjunction with various types of valves, pumps, and metering and/or sensing devices. Outlet ports may be in fluid communications with various valves, vacuum pumps, metering devices and/or sensing devices. Various sensors and gauges or other measuring devices may be present, as necessary or desirable. Analytical devices may be present to detect the presence and/or concentration of reactive precursors (e.g., within precursor delivery system 700 and interconnection points, transport enhancer 800 and interconnection points, etc.), purge gases and/or various reaction products, and to measure the presence and/or extent of coatings on the particle surfaces. Heating and/or cooling devices may be present to provide temperature control to the powder reservoir, the reactive precursor reservoir, or both. Computerized control and operating devices may be used to operate one or more valves, pumps, heating and/or cooling devices, or other devices. A porous valve or similar device may be present between a powder reservoir and a reactive precursor reservoir. When closed, this porous valve or similar device can act as a support for the powder bed and permit the reactor to function as a conventional fluidized bed reactor.

As described herein, the apparatus in accordance with the present technology may include a subsystem that is suitable for synthesizing a powder, article or flowable object, configured to execute one or more of a flame spray process, a combustion spray process, a plasma spray process, a spray drying process, or combinations thereof. Alternatively or in addition to, one or more subsystems described herein may be suitable for conducting vapor treatment and/or vapor deposition techniques on powdered or flowable substrates or articles. The systems, apparatus and methods described herein may be configured to execute a chemical or physical reaction which includes one or more steps of an atomic layer deposition process, a molecular layer deposition process, a chemical vapor deposition process, a physical vapor deposition process, a molecular layering process, an atomic layer chemical vapor deposition process, an epitaxial deposition process, a chemical grafting process, an atomic layer etching process, an atomic layer corrosion process, an atomic layer combustion process, or any combination thereof. In at least one embodiment, the systems, apparatus and methods described herein are configured to execute a process which includes an atomic layer deposition (ALD), a molecular layer deposition (MLD) or combinations thereof. ALD processes are especially suitable for applying a variety of inorganic coatings to a substrate, including, for example, oxide coatings such as aluminum oxide, silicon oxide, zinc oxide, zirconium oxide, titanium oxide, transition metal oxides, boron oxide, yttria, zinc oxide, magnesium oxide, and the like; nitride coatings such as silicon nitride, boron nitride and aluminum nitride; sulfide coatings such as gallium sulfide, tungsten sulfide and molybdenum sulfide, as well as inorganic phosphides. In addition, various metal coatings can be applied using ALD methods, including cobalt, palladium, platinum, zinc, rhenium, molybdenum, antimony, selenium, thallium, chromium, platinum, ruthenium, iridium, germanium and tungsten. When optionally including transport enhancers, one or more of the precursors described herein may be delivered to the surfaces of a plurality of articles, to treat the article or deposit one or more cation and/or anion on the article, the cation or anion being attributed to Group 1a, 2a, 3a, 4a, 5a, 6a, 7a, 8, 1b, 2b, 3b, 4b, 5b, 6b or 7b on the periodic table of the elements. In some cases, one or more subsystem is configured to utilize a precursor and/or deposit a material including phosphorous, sulfur, nitrogen, carbon, fluorine, chlorine, bromine or iodine, wherein the precursor comprises a phosphide, a phosphate, a sulfide, a sulfate, a nitrate, a fluoride, a chloride, a bromide or an iodide.

The systems, apparatus and methods described herein may include one or more subsystem which includes a treatment subsystem, which may be configured to control the nominal value and the rate of change of one or more of i) a treatment pressure, ii) a treatment temperature, iii) a gas phase composition or flow rate, iv) a liquid phase composition or flow rate, v) a solute or solvent composition or flow rate, and vi) a solid phase composition or flow rate.

In the ALD process, the coating-forming reaction is conducted as a series of two or more (typically two) half-reactions. In each of these half-reactions, a single reagent is introduced into contact with the substrate surface. Conditions are typically such that the reagent is in the form of a gas, however liquid-phase and supercritical phase ALD and MLD processes are also known and understood to be applicable to one or more of the systems described herein. The reagent deposits on the surface of the substrate. In most cases it reacts with functional groups on the surface of the substrate and becomes bound to the substrate. Because the reagent is reactive to only substrate functional groups, it permeates into pores in the substrate and deposits onto the interior surfaces of the pores as well as onto the exterior surfaces of the substrate. Excess amounts of the reagent are then removed, which helps to prevent the growth of undesired, larger inclusions of the coating material. Each remaining half-reaction is then conducted in turn, each time introducing a single reagent, allowing it to react at the surface of the particle, and removing excess reactant before introducing the next reagent, all in the same chamber or reaction vessel. A carrier gas may be used to introduce the reagents, and the powder may be swept with the carrier gas to help remove excess reagents and gaseous reaction products. In one preferred embodiment, at least one subsystem is configured to execute a surface treatment process, and wherein at least one subsystem is configured to execute an atomic layer deposition process, and wherein a surface treatment process is part of a sequence including one or more steps that occur before an atomic layer deposition process, after an atomic layer deposition process, or both.

In one aspect of the present technology, the system may be described as a composite article production system, which includes a control system in communication with two or more subsystems configured for synthesizing, treating and/or coating an article using a continuous, semi-continuous, semi-batch or batch process, wherein a first subsystem comprises one or more chambers having at least one inlet or outlet in fluid communication with at least one valve or pump assembly having more than one actuation mechanism, and wherein at least one first or second subsystem is configured to deliver one or more precursors to the surfaces of an article to effectuate a chemical or physical reaction, thereby forming the composite article. In general, the control system, which may represent a master control system in cases in which more than one control system is present, is in electronic communication with all actuation mechanisms via a common signal hub, and provides a commonly controllable unit for regulating material flows. In many cases, it is beneficial when at least one actuation mechanism from one subsystem is configurable to be actuated synchronously with at least one actuation mechanism from a different subsystem; in other cases it is beneficial when at least one actuation mechanism from one subsystem is configurable to be actuated sequentially, at synchronous or asynchronous rates, with at least one actuation mechanism from a different subsystem. Additionally, oftentimes it is beneficial for one or more system or subsystems to further comprise one or more of a common precursor delivery subsystem, a precursor delivery enhancement subsystem, or an exhaust treatment or recycling subsystem.

An apparatus of the present technology may be suitable for processing a plurality of composite articles synchronously, wherein the composite articles comprise one or more discrete particles, powders, extrudates, granules, flowable objects, or any objects having a largest dimension less than about 125 millimeters in size, and wherein the surfaces of at least about 75% of the composite articles are coated or treated upon exiting the system. Even in cases in which at least about 10% of the surfaces of one or more composite article is internal to the structure of the article, efficient treatment of internal and external surfaces is feasible. In some cases, one or more parameters including, but not limited to, pressure, temperature, molar flux, or residence time is scaled as a function of total surface area, or one or more parameters is scaled as a function of internal surface area. In any case, each subsystem is connected by a transport unit having a controllable environment, and efficiencies can be realized when one or more transport unit is controlled synchronously.

The systems, apparatus and methods described herein may be used to produce materials such as lithium-ion battery materials, phosphor materials, high surface area metals, solid electrolytes, especially those containing sulfides, phosphides, and the like, and catalysts, which are known to uptake, react with, or otherwise interact with, in a chemical, mechanical, electrical or physical mechanism. Minimizing, or ideally eliminating, unwanted interactions provides substantial cost savings, performance benefits, or both. For example, cement powders may be kiln-dried in an extremely high energy intensity clinker process, to minimize moisture uptake from the environment; however a process of the object invention in which one or more cement constituent powders is treated, surface coated (e.g., with a hydrophobic coating), and optionally post-treated, in an all-in-line system such as what is taught here, substantially reduces the operational costs of cement materials production, and adds value to a low-cost commodity material in the form of high performance cement products.

In some embodiments, the systems, apparatus and methods described herein may be used to produce coated fine or ultra-fine particles for cathodes, anodes, dielectrics, metals, polymers, semiconductors and other ceramics for integration into power systems devices including, but not limited to, batteries, capacitors, varistors, thyristors, inverters, transistors, light emitting diodes and phosphors, photovoltaic, and thermoelectric devices.

In some embodiments, the systems, apparatus and methods described herein may be used to produce materials suitable for use in a battery, a fuel cell, a catalyst, a capacitor, a pharmaceutical ingredient, a passive electronic component, a solar cell, a 3D printer, a semiconductor device, an integrated circuit, an optoelectronic device, a thermoelectric device, a thermionic device, an electrochemical device, a biomedical device, or an electromechanical device, particle ALD produced powders for the paint, pigment and power systems industries.

The systems, apparatus and methods described herein may be used for synthesis as well as post-synthesis modification of numerous well-defined catalysts known in the art, such as described in PCT/US2010/001689 and PCT/US2012/039343, which are incorporated by reference in their entirety. The systems, apparatus and methods described herein may be used to synthesize nanoparticles or films of nearly any catalytic material. For example, the systems, apparatus and methods described can be used to apply ALD techniques to the synthesis of catalysts, including catalytic coatings (e.g., using catalytically active metals and/or metal oxides as precursors) on a surface of a metal or metal oxide substrates. Such catalytically coated substrates may include for example a cathode including a carbon material with a thin inert material layer on its surface and a catalyst coating the thin layer, which may be used in zinc air and lithium air batteries. The catalyst may include metal or metal oxide nanoparticles which may be coated on inert materials such as metal oxides, non-metal oxides, metal halides, metal phosphates, metal sulfates, or a metal oxyfluorides. The systems, apparatus and methods described herein can provide catalyst materials having improved stability, selectivity and activity due to uniform surfaces having high conformity, improved control and accuracy of thickness, and reproducibility.

The flowable articles can move along a conveyor or the flowable substrate can be extruded through a die to form an extrudate. In at least one embodiment, the flowable article comprises one or more discrete particles, powders, extrudates, granules, flowable objects, or any objects having a largest dimension less than 125 millimeters in size.

An aspect of the present technology is to establish a modular process to synthesize and upgrade materials without having to break the process chain, and provide a means to: i) eliminate additional handling steps, ii) minimize or eliminate interactions between the product(s) and the manufacturing environment(s), iii) automate two or more discrete processes that operate under different conditions, and iv) support vertical integration, cost reduction and overall efficiency, which collectively contribute to enhanced safety, higher profit margins and better end-user products and experiences. The present technology is advantageous in that it may overcome the unexpected challenges that arise when pairing together two process steps, modules, or other distinguishing linkage amongst dissimilar unit operations, and provide a holistic solution to manufacture upgraded materials designed for use in specific applications.

A significant percentage of the particles, powders and flowable objects used across all industries can be enhanced by upgrading or post-treatment processes that alter the surface properties of bulk materials without adversely affecting the properties bulk materials themselves. Upgrading processes can result in a discrete shell, layer, film, or other coating, ranging from sub-nanometer to hundreds of micrometers in thickness, or an inter-diffused layer that is a homogenized region that incorporates a material, function, structure or other physical or chemical property derived from both the bulk and the surface compositions. In the absence of a coating, adjacent particles may fuse, sinter, ripen or other analogous process when subject to a particular post-treatment or set of treatment conditions, and the coating functions as a barrier that inhibits, retards, prevents or otherwise reduces the propensity for such a process to occur. Alternatively, a post-treatment process can be used to remove a native surface through physical or chemical etching, reaction, conversion or other removal process. In most cases, if one post-treatment process can enhance the value of a particular product, multiple post-treatment process can also be expected to synergistically enhance performance, whether by similar processes comprising dissimilar materials, similar materials applied using dissimilar processes, or dissimilar materials applied using dissimilar processes. Sometimes one, two, three or even four post-treatment processes may be useful for one particular market segment application, whereas others, especially high value applications, may further benefit from five, six, seven, eight, nine, ten or more post-treatment processes. Furthermore, some synthesis processes can be implemented in sequence (using similar or dissimilar process conditions or materials or synthesis processes) to provide an enhanced starting powder, which can result in a core-shell material, where the core and shell may be distinguished by composition, crystal structure, geometry, density, physicochemical property, or other pairing to produce a single workpiece known to have better functionality, usefulness or benefit to one or more applications itself, or when used in combination with one or more similarly treated workpieces.

Vapor deposition techniques are sometimes used to deposit the coatings, and can be augmented by the incorporation of plasma, pulsed or non-pulsed lasers, RF energy, and electrical arc or similar discharge techniques. Sometimes liquid-phase techniques are used to synthesize materials and/or deposit the coatings. Examples of liquid-phase techniques include, but are not limited to, sol-gel, co-precipitation, self-assembly, layer-by-layer or other techniques. Liquid-phase techniques share at least one commonality when producing powders: due to the energy intensiveness and cost of mixing, separating and drying materials synthesized or coated using liquid-phase techniques, greater efficiencies and uniformities can be obtained by utilizing gas-solid unit operations. The further benefit of utilizing gas-solid unit operations is the ability to implement solid-state reaction technologies (e.g., annealing, calcining or other thermal treatment in a variety of controlled gaseous environments), in sequence with synthesis or coating steps. The present technology provides a manufacturing system and strategy that fully controls all aspects of the production of targeted materials in one overarching scheme.

One commonality of gas-phase processing systems for producing or encapsulating powders is the need for the chemical reactant precursors to be volatile or otherwise able to be vaporized. However chemical precursors occur in many different physical phases, states and reactivity, depending on the surrounding environment and temperature and pressure. Possible precursor states include gas or gas mixture, including a binary dilution or mixture of a reactive or toxic gas with an inert gas, binary, trinary, quaternary and so on mixtures of one or more reactive elements such as air; a liquid or liquid mixture including a binary dilution or mixture of an unreactive solvent with a reactive liquid, binary, trinary, quaternary and so mixtures of one or more reactive elements such as formalin; a solid that sublimes; a solid dissolved in one or more liquids, solvents or other miscible media; an element that can be evaporated such as sulfur or gallium; plasma or ionized gas of a single element or gas such as Ar; plasma or ionized gas mixture such as oxygen in argon); reaction products such as hydrogen reacting with sulfur to form hydrogen sulfide; transient reaction products (e.g., chemical radicals or ions); decomposition or combustion products such as CO or $CO_2$; and electrons.

Aside from precursors that are already in the gas phase (e.g., $BCl_3$, $NF_3$, $NO_2$, $O_3$, etc.), the volatility of each liquid or solid precursor or class of precursors can vary substantially, ranging from alkylmetal precursors with high vapor pressures (such as trimethylaluminum and diethylzinc) to solid precursors that require sublimation at >200° C. (such as zinc chloride and zirconium chloride).

Vapor deposition processes are usually operated batch-wise in reaction vessels such as fluidized bed reactors, rotary reactors and V-blenders, amongst others. Batch processes have significant inefficiencies when operated at large scale, for several reasons. Synthesis processes are more likely to be continuous in nature but require separation and handling steps that may be operated batch-wise, semi-continuously or continuously, and/or benefit from subsequent treatment and/or coating steps that may be performed in any of the methodologies described herein. Each reactor throughput is a function of the total particle mass or volume loaded into a certain sized vessel for a given process, the total process time (up-time), and the total time between processes (down-time) to load, unload, clean, prepare, etc. Batch processes incur large down-times because at the end of each batch the finished product must be removed from the reaction equipment and fresh starting materials must be charged to the equipment before the subsequent batch can be produced. Equipment failures and maintenance add to this downtime. Process equipment tends to be very large and expensive in batch processes. Any additional requirement to operate these processes under vacuum adds greatly to equipment costs, especially as equipment size increases. Because of all of this, equipment costs for batch processes tend to increase faster than operating capacity, however some approaches that incorporate typical batch unit operations into higher efficiency systems as described herein allows such subsystems to retain sufficient value for certain industries. Another problem that occurs as the process equipment becomes larger is that it becomes more difficult to maintain uniform reaction conditions throughout the vessel. For example, temperatures can vary considerably within a large reaction vessel. It is also difficult to adequately fluidize a large mass of particles, specifically nanoparticles. Issues such as these can lead to inconsistencies and defects in the coated product.

In vapor deposition processes such as ALD and MLD, the particles are contacted with two or more different reactants in a sequential manner. This represents yet another problem for a batch operation. For a traditional batch process, all cycles are performed sequentially in a single reaction vessel. The batch particle ALD process incurs additional down-time due to more frequent periodic cleaning requirements, and the reaction vessels cannot be used for multiple film types when cross-contamination could be problematic. In addition, the two sequential self-limiting reactions may occur at different temperatures, requiring heating or cooling of the reactor between cycle steps in order to accommodate each step. The throughput for a batch process can be increased either by building larger reaction vessels and/or operating identical reaction vessels in parallel. The capital cost-effective tendency to counteract this down-time from a throughput perspective is to build a larger reaction vessel. With larger vessels, localized process conditions, including internal bed heating, pressure gradients, mechanical agitation to break up nanoparticle aggregates, and diffusion limitations amongst others, become more difficult to control. There is a practical maximum reaction vessel size when performing ALD processes on fine and ultra-fine particles, which limits the annual throughput for a single batch reactor operating continually, where the time duration of the process producing a given amount of coated materials equals the up-time plus down-time. There is a practical maximum allowable capital expense to fabricate a particle ALD production facility, which effectively limits the number of batch reactors that operate identical processes in parallel. With these constraints, there are practical throughput limitations that prohibit the integration of some particle ALD processes at the industrial scale. Thus there is a need to develop a high throughput semi-continuous or continuous-flow ALD process in order to meet industrial scale demands, and the presently technology is designed to meet these needs.

In vapor deposition processes such as CVD, the particles can be contacted with two or more different reactants concurrently, or by one or more reactants that do not exhibit the self-limiting behavior characteristic of ALD and MLD processes. For a traditional batch CVD process, the primary methods of controlling reactions are limited to reactant exposure time and operating conditions such as process temperatures and pressures. The batch particle CVD process has limited opportunity to prevent unwanted gas-phase side reactions. There is also a practical maximum reaction vessel size when performing batch particle CVD processes as small variations in the process conditions can lead to large variations in product quality throughout the batch of particles produced. Thus there is a need to develop a high throughput continuous, semi-batch or semi-continuous particle CVD process in order to meet industrial scale demands without sacrificing product quality, and the presently technology is designed to meet these needs.

In any of the vapor deposition processes referenced above, the need and ability to control the flow of vaporous precursors, reactants, contacting agents, products and carrier gas is paramount to be able to effectively control any particular process that is intended to be applied to any particular surface area of solid substrate. The multitude of precursor types, chemistries, states and materials' incompatibilities necessitates a variety of schema for precursor delivery into the reaction chambers. Several methods and instrumentation configurations have been developed to move the precursor or precursors from isolation to where it can be in chemical contact with the deposition substrate or substrates and either simultaneously in a reactive form or subsequently made reactive.

The simplest method of precursor delivery is direct exposure to precursor vapor using a pressure and/or a concentration differential and diffusion to move the precursor to and through the reaction zone. The gaseous precursor has sufficient vapor pressure under the storage conditions or gas phase precursor can be created by heating the storage vessel, reducing the pressure within the vessel or otherwise introducing the precursor into a larger vacuum volume. The storage vessel is isolated from the substrate via a controllable mechanism of isolation. This includes a physical mechanical barrier that separates the precursor gas from fluid contact with the substrate. Alternatively, isolation may be accomplished by application of localized temperature or pressure to reduce the presence of vapor phase precursor or by introduction and subsequent actuation of a countercurrent gas stream that provides a non-diffusible gas barrier between the precursor source and the substrate. The precursor isolation and exposure (lack of isolation) to the substrate is controlled by actuation of the isolation value and the length of time between actuation steps of the isolation valve, mass flow controllers such as a thermal mass flow controllers or Coriolis flow controllers, pressure control meters or orifices to regulate the flow of the precursor into the reaction vessel, temperature ramps, step functions or initiation of heating elements to instigate and increase or decrease vapor generation, gas diverting or bypassing elements such as valves, orifices, mass flow controllers or pressure controllers to regulate the flow of gas counter current to or around the reaction vessel.

Precursors with low vapor pressures, that are slow to diffuse, or have a high degree of van der Waals interactions with other materials and surfaces that stabilize their interaction and therefore make them less likely to stay in the vapor phase or transition to the vapor phase may be pushed through the reaction chamber and accessory manifolds by addition of a carrier stream. The carrier fluid is gas or liquid, inert or otherwise non-participating in the reaction at the reaction conditions in use, can be pushed or pulled through the reactor and sub components by use of pumps, pressure differentials and temperature differentials and can be regulated or controlled by mass flow controllers such as a thermal mass flow controllers or Coriolis flow controllers, pressure control meters or orifices, temperature ramps, step functions or initiation of heating elements to instigate and increase or decrease vapor generation, gas diverting or bypassing elements such as valves, orifices, mass flow controllers or pressure controllers to regulate the flow of gas counter current to or around the reaction and/or precursor containment vessels. Some carrier fluid examples include dry air, nitrogen, argon, helium, methane, and carbon dioxide. Entrainment of the precursor into the carrier stream is accomplished by intersection of a precursor vapor stream with a carrier stream. The carrier gas may be redirected through the precursor containment vessel via an inlet that is the same, concentric with, or separate from the exit port. To maximize contact of the carrier stream with the precursor, in one implementation the inlet of the precursor container may be submerged into the precursor and may be outfitted with one or more spargers or nozzles to reduce the size of bubbles and increase the number of bubbles as the carrier stream moves through a liquid phase precursor, or in another implementation the inlet may redirect the carrier stream across only the surface of a liquid or solid precursor. To contact the carrier stream with the largest possible surface area of the precursor. the size and shape of the precursor containment vessel may be altered into a long tube, a large diameter vessel, or a tortuous path between the inlet and the outlet ports internal to the containment vessel. Alternatively, the precursor may be introduced by spraying, atomizing or nebulizing a liquid precursor or liquid precursor mixture into the gas stream via a pump, spray nozzle, an injection nozzle, or a piezoelectric actuator.

Very low vapor pressure materials, very reactive precursors, precursors that contaminate the surfaces of the reactor and reactor subcomponents, precursors that are not stable in the gas phase, precursors that have a short lifetime or are transient species, or precursors that decompose in the presence of temperature or vacuum, may be introduced into the reaction vessel directly below, adjacent, above, or within the substrate or substrate bed in a gaseous or non-gaseous phase. In one embodiment the precursor is introduced into the reactor though one or more valve, nozzle or tube in a liquid or solid state and the change in pressure or volume expansion changes the phase of the precursor. In another embodiment the precursor is introduced into the reactor though one or more valve, nozzle or tube in a liquid or solid state and the difference in temperature between the reactor and precursor containment changes the state of the precursor. In another embodiment the precursor is introduced into the reactor though one or more valve, nozzle or tube and the dispersion onto the reactor walls or substrate media provides heat transfer and a greater surface area to enhance vaporization. In another embodiment the precursor may be ionized or energized to a plasma. In another embodiment the precursor may be distributed in space inside the reactor by use of a showerhead or distributor plate. A specific quantity of precursor can be metered by use of a mass or liquid flow controller, a regulator, an orifice, a single vale or a series of valves that are actuated together in series or in a specific sequence, a pump or a syringe. Alternatively, the precursor may be metered by filling and subsequently emptying or exchanging the contents of a vessel of known volume, mass, or density. Filling or emptying could be accomplished by, gravity, mechanical movement, applied vibration or impact, a pressure differential from an applied pressurized gas push or vacuum pull or by siphon initiated by a passing fluid stream and/or Venturi effects. During precursor introduction the substrate may be static, moving, fluidized or semi fluidized. Immediately following precursor introduction, the substrate may be static, moving, fluidized or semi fluidized. The environment within the reactor may be an active vacuum, passive vacuum, gas filled, pressurized, flowing gas, liquid filled, flowing liquid, or dissolved, dispersed or otherwise mixed in or with a supercritical fluid, or a process or pulsing sequence combining of any of these may be implemented.

Alternatively, very low vapor pressure materials, very reactive precursors, precursors that contaminate the surfaces of the reactor and reactor subcomponents, precursors that are not stable in the gas phase, precursors that have a short lifetime or are transient species, or precursors that decompose in the presence of temperature or vacuum, may be introduced into a secondary vessel that is neither the precursor containment vessel nor the reactor. This secondary vessel outlet may also connect to a reactor inlet directly below/subjacent, adjacent, above/superjacent, or within a unit volume that comprises the substrate or substrate bed. In one embodiment the precursor is introduced into the secondary vessel though one or more valve, nozzle or tube in a liquid or solid state and the change in pressure or volume expansion changes the phase of the precursor. In another embodiment the precursor is introduced into the secondary vessel though one or more valve, nozzle or tube in a liquid or solid state and the difference in temperature between the secondary vessel and precursor containment vessel and/or secondary vessel and reactor changes the state of the precursor. In another embodiment the precursor is introduced into the secondary vessel though one or more valve, nozzle or tube and the dispersion onto the vessel walls or packed media provides heat transfer and a greater surface area to enhance vaporization. The packing media may be composed of metals such as titanium, aluminum, molybdenum, tungsten, nickel, silver or silicon; alloys such as stainless steel, Inconel, Monel or similar; ceramics or metal oxides (e.g., $Al_2O_3$, ZnO, $SiO_2$, $ZrO_2$, $TiO_2$, etc.), mixed metal oxides such as silicates, aluminates, titanates, zirconates, etc.; nitrides such as TiN, $Si_3N_4$, BN, AlN or similar; carbides such as SiC, WC, ZrC, TiC, etc.; carbons such as graphite, graphene, carbon black, activated carbon, charcoal, and the like; polymers or plastics such as PTFE, PEEK, PET, PEN, PP, LDPE, HDPE, PS, PS-DVB, PI, PEI, co-block polymers, etc.; or may be substrate materials or powders that are the same, similar or different to that currently in use inside the reactor, or what is commonly found useful as distillation packing, vacuum distillation packing materials, in the form of balls, beads, extrudates, fine or coarse milling media, or cut tubing. Ideally, the packed media will have a high surface to volume ratio and is configured in a non-dense packing arrangement or with a high free space ratio, or is fluidized to reduce the pressure drop across it. In another embodiment the packed media could be arranged on a plurality of distributor plates to maximize contact of the liquid precursor with the packing media and gaseous fluid flow with the media and to contain the packing within a specific region of the secondary vessel. The distributor plates could be porous metal, metal screen, laminated metal screen, porous ceramic, conical screen, porous polymer, polymer mesh, a secondary packed media, glass wool, metal wool or ceramic wool. In another embodiment the precursor may be distributed in space inside the secondary vessel by use of a showerhead or distributor plate. A specific quantity of precursor can be metered by use of a mass or liquid flow controller, a regulator, an orifice, a single vale or a series of valves that are actuated together in series or in a specific sequence, a pump or a syringe. Alternatively, the precursor may be metered by filling and subsequently emptying or exchanging the contents of a vessel of known volume, mass, or density. Filling or emptying the vessel of known volume and/or the secondary vessel could be accomplished by, gravity, mechanical movement, applied vibration or impact, a pressure differential from an applied pressurized gas push or vacuum pull or by siphon initiated by a passing fluid stream and Venturi effects. During precursor introduction the packing may be static, moving, fluidized or semi fluidized. Immediately following precursor introduction, the packing may be static, moving, fluidized or semi fluidized. The environment within the secondary vessel may be an active vacuum, passive vacuum, gas filled, pressurized, flowing gas, liquid filled, flowing liquid, or dissolved, dispersed or otherwise mixed in or with a supercritical fluid, or a process or pulsing sequence combining of any of these may be implemented. Additionally, in situ characterization tools such as mass spectrometry, light spectroscopy, electrical conductivity, thermal conductivity, and ultrasound or other acoustic probe of the contents of the secondary vessel may be implemented.

An atomizing or nebulizing assembly may also be implemented to disperse precursors into tiny droplets in the form of a mist or fog to increase the interface area between the precursor and a carrier gas or fluid. A liquid precursor, solvated precursor or precursor dilution, or molten precursor is metered via a liquid flow meter, syringe pump, or peristaltic pump through a rapidly actuating valve or series of valves to create small discrete volumes of liquid this is pulled into a reaction chamber by a pressure differential or pushed into a reaction chamber by a flowing gas which may be pulsed and may be alternately pulsed with the precursor through the same rapidly actuating valve or series of valves. The nebulizing valve assembly may be integrated onto a manifold, onto the reactor itself or into a secondary vessel that is itself in fluid contact with the manifold or reactor. In one embodiment, a vaporizer and dilute a liquid precursor in anhydrous solvent was implemented. The system pulses microvalves to mix the liquid in tiny pulses with gas, using piezoelectric actuators to nebulize at each step into a hot box. The output of the hotbox is entrained into a secondary gas stream. In another implementation, the nebulizing element is not a valve but instead is a piezoelectric or rapidly vibrating element that is integrated on the bottom or side of the precursor containment vessel and in contact with the precursor solution inside the vessel or is in contact with a flexible membrane that is in contact with the precursor solution. The rapid vibration caused by piezoelectric actuation agitates the liquid to drive tiny droplets off the top surface of the liquid.

In addition to transporting a reactive precursor from outside of the reactor to inside of the reactor, reactive secondary precursors may be generated in situ from one or more primary precursors. Many formation methods are possible including decomposition initiated by temperature or pressure in the gas phase inside or prior to the reactor, at the substrate, reactor or manifold surfaces or by passing over an incorporated decomposition element like a hot filament or wire; or reaction with other gas phase precursors, reaction with surfaces inside or prior to the reactor, reaction with charged species, radicals or plasma; from pass through or nearby a plasma source, electron beam or ion beam.

Precursor delivery and utilization are two of the most important aspects of ALD. Recycling unreacted precursor from the exhaust of the system or subsystem back through the system or downstream to another subsystem to allow for greater precursor utilization or longer exposure times/residence times. In one implementation, the exhaust or selective elements of the exhaust from one chamber could be used as a precursor feed for the next chamber. The amount of precursor introduced to the first reaction steps could be in excess and/or additional precursor could be added in later steps. In another implementation the reactive precursors could be collected out of the exhaust from one or more process chambers by condensation or membrane separation and used later as a precursor on the same or different reactors. In one implementation the chamber sizes could be manipulated to drive the precursors downstream. A compressor or pump could be implemented to move the precursors and effluents to the next chamber or back through a chamber. Alternatively, the direction of flow could be reversed through the same chamber.

The methods of the present technology are also useful for producing core shell catalyst particles with high specific mass activity, of the type described in U.S. Patent Application No. 2010/0092841 or for producing size-selected metal nanoclusters as described in U.S. Pat. No. 7,713,907. In some cases, a system or process is configured to produce materials suitable for use in a battery, a fuel cell, a capacitor, a passive electronic component, a solar cell, a 3D printer, a semiconductor device, an integrated circuit, an optoelectronic device, a thermoelectric device, a thermionic device, an electrochemical device, or an electromechanical device. The process of the present technology can be used to perform plasma-based processes such as described in U.S. Pat. Nos. 7,758,928 and 6,428,861, in which particles are functionalized. A benefit of such plasma-based processes in some cases is to reduce the operating temperature of a deposition process. A plasma process in as described in these two patents can be performed in some or all of the individual chambers in which a process of the present technology is performed. The process of the present technology can be used to produce high volumes of products, such as, for example, titanium dioxide-coated particles as described in U.S. Patent Application No. 2010/0326322 or coated lithium metal oxide particles for use as high-performance cathodes in lithium ion batteries, as described in U.S. Pat. No. 9,570,734. A benefit of this continuous, semi-continuous or semi-batch invention over conventional batch fluidized bed reactors is that high annual throughputs can be achieved using reasonably sized equipment and therefore reasonable capital costs. In addition, the rate-limiting step of batch vapor phase deposition processes in fluidized bed reactors is the rate at which the vapor can enter the reactor without elutriating the articles. In some embodiments, the present technology makes the article transport through a semi-continuous or continuous process the rate-limiting step as vapor phase reactants are pre-loaded into chambers independently from the solid articles. In other cases, batch processes or systems may be preferred when a high degree of process precision is required, and spatial segregation and/or high throughput transport may adversely affect one or more properties of the substrate, treatment layer, coating process, synthesis process, delivery mechanism, exhaust abatement, etc.

The present technology can also be used directly in line after a titanium dioxide production process, for example as described in U.S. Pat. No. 7,476,378, to produce particles coated with titanium dioxide. The lithium oxide particles may be made, for example, via a flame spray process described in U.S. Pat. No. 7,211,236 or a plasma spray process as described in U.S. Pat. No. 7,081,267, or similar processes; and the coating process of the present technology can be performed directly in-line after such lithium oxide particles are produced. More generally, particles to be coated in accordance with the invention can be of any type produced using known particle manufacturing processes. The coating process of the present technology can be performed as part of an integrated manufacturing process which includes a manufacturing step to produce the particle followed directly or indirectly by the coating process of the present technology. Another example of such a particle manufacturing process which can be integrated with the coating process of the present technology is a process for producing ultrafine metal particles such as is described in U.S. Pat. No. 6,689,191. Air- and moisture-sensitive powdered materials can be safely transported from the production step in-line to the semi-continuous coating step in accordance with the present technology. The process of the present technology can be integrated into a manufacturing process for producing moisture-resistant phosphors, such as, for example, the ZnS phosphor particle manufacturing process described in U.S. Pat. No. 7,833,437. Using the process of the present technology, a first subset of chambers can be used to dope rare earth elements onto or into the ZnS carrier particles to make them phosphorescent, or can be used to tune the refractive index of the composite article. A subsequent subset of chambers can be employed to perform atomic layer deposition cycles for the desired number of chambers (equaling two times the desired number of ALD cycles) or can alternate between ALD and CVD along the chain of reactors and produce higher precision ALD/CVD multilayers in a semi-continuous fashion.

Molecular layer deposition processes are conducted in a similar manner and are useful to apply organic or inorganic-organic hybrid coatings. Examples of molecular layer deposition methods are described, for example, in U.S. Pat. No. 8,124,179. Of significant interest is the incorporation of one or more Treatment Subsystems before and/or after an MLD coating process, with which to tune or preferentially alter the starting surface, the finished coating, or both. Sometimes one or more subsystem of the present technology can convert a precursor, feedstock or coated article into a composite article which includes an inorganic or graphitic carbon.

Atomic layer and molecular layer deposition techniques permit the deposition of coatings of about 0.1 to 5 angstroms in thickness per reaction cycle, and thus provide a means of extremely fine control over coating thickness. Thicker coatings can be prepared by repeating the reaction sequence to sequentially deposit additional layers of the coating material until the desired coating thickness is achieved.

Reaction conditions in vapor phase deposition processes such as ALD and MLD are selected mainly to meet three criteria. The first criterion is that the reagents are gaseous or have sufficient vapor pressure under the conditions of the reaction. Therefore, temperature and pressure conditions are selected such that the reactants are volatilized when the reactive precursor is brought into contact with the powder in each reaction step. The second criterion is one of reactivity. Conditions, particularly temperature, are selected such that the desired reaction between the reactive precursor and the particle surface occurs at a commercially reasonable rate. The third criterion is that the substrate is thermally stable, from a chemical standpoint and from a physical standpoint. The substrate generally should not decompose or react at the process temperature, other than a possible reaction on surface functional groups with one of the reactive precursors at the early stages of the process. However, some surface treatment processes explicitly undergo a controlled corrosion or etching process, in which case this phenomenon would be preferred. Similarly, the substrate should not melt or soften to a significant degree at the process temperature, so that the physical geometry, especially pore structure, of the substrate is largely maintained. However, in some instances, a controlled collapse or release of the substrate is an objective of the coating process itself (either during the coating process or in an end-use environment), so such phenomena are not explicitly prohibited in such a system. Likewise, a precursor may diffuse into or within the substrate, allowing for the expansion of the substrate by at least the volume occupied by the precursor. The reactions are generally performed at temperatures from about 270 to 1000 K, preferably from 290 to 600 K, more preferably from 370 to 500K, and oftentimes 370 to 460K. The reaction temperature may be decreased by 10, 20, 30, 40, 50, 60, 70, 80, 90, or 100 or more degrees (K) through the incorporation of a plasma.

Between successive dosing of the reactive precursors, the particles can be subjected to conditions sufficient to remove reaction products and unreacted reagents. This can be done, for example, by subjecting the particles to a high vacuum, such as about $10^{-5}$ Torr or greater, after each reaction step. Another method of accomplishing this, which is more readily applicable for industrial application, is to sweep the particles with an inert purge gas between the reaction steps. This sweep with inert gas can be performed while the particles are being transported from one reactor to the next, within the apparatus. Dense- and dilute-phase techniques, either under vacuum or not, are known to be suitable for the pneumatic conveying of a wide variety of industrially relevant particles that would be well-served by the functionalization process described herein.

In CVD processes, two or more reactive precursors are simultaneously brought into contact with the powder particles. The reactive precursors typically react in the gas phase to form a reaction product that deposits onto the particle surfaces to form the coating. The precursors in this case can all be introduced into the reactive precursor reservoir and brought together into the powder reservoir. Alternatively, it is possible to introduce one of the reactive precursors into the powder reservoir in the form of a vapor, together with the powder. The second reactive precursor is introduced into the reactive precursor reservoir as described above, at a higher pressure than that established within the powder reservoir. The valve unit separating the reservoirs is opened as before, allowing the second reactive precursor to escape into the powder reservoir, at least partially fluidizing the particle, and reacting with the first reactive precursor to form a reacting product which deposition on the powder particles and forms a coating thereon.

The applied coating may be as thin as about 1 angstrom (corresponding to about one ALD cycle), and as thick as 100 nm or more. A preferred thickness range is from 0.5 angstroms to about 25 nm, which varies widely by end-use application.

Any of the particles made in any preliminary particle-manufacturing step can be directly produced in a particle production process using any convenient continuous flow process, can be delivered into a weigh batching system with a metering valve (rotary airlock or similar), and can then enter into the process described in the present technology. Generally, when combining processes and/or subsystems having different residence times, precursor usages, pressures, temperatures or other parameters, it is useful for a control system to be configured for machine learning. In such a case, one method of incorporating machine learning into a composite article production system is by way of one or more algorithms that calculate a subprocess deviation from modeled or empirical data with information derived from one or more of a direct in-situ signal, an indirect in-situ signal, a direct ex-situ signal or an indirect ex-situ signal. Over time, one or more machine learning algorithms can be optimized to increase the relative efficiency, or reduce the operational costs, by about 1%, 5%, 10%, 15%, 20% or ideally upwards of 30-50%, depending on the type of process and the criticality, measurability and/or repeatability of end point determination.

For the purpose of clarity and a concise description, features may be described herein as part of the same or separate aspects or embodiments of the present technology. It will be appreciated by the skilled person that the scope of the present technology may include embodiments having combinations of all or some of the features described herein as part of the same or separate embodiments.

The invention will be explained in more detail in the following, non-limiting examples. The examples are provided to illustrate coating processes applicable to making the particles of the present technology. These examples are not intended to limit the scope of the present technology. All parts and percentages are by weight unless otherwise indicated.

EXAMPLES

Example 1

Manufacturing of Superior Li-Rich, Mn-Rich and/or Ni-Rich Materials for High Energy, Low Voltage-Fade Cathode Powders Five batches of $Li_xMn_yO_z$ are synthesized by flame spray pyrolysis and five additional batches of $Li_xMn_yO_z$ are synthesized by plasma spray pyrolysis using solutions of lithium and manganese mixed at appropriate ratios. Using SEM, primary particle sizes ranging from 50 nm to 500 nm are observed. Prior to synthesis of the batches, initial screening is performed using different stoichiometric ratios of Li:Mn (x:y) in the salt solutions, which led to direct control over the Li:Mn ratio in the final powder. An exemplary useful target ratio of x:y can be 2:1 or higher. Some applications utilize excess lithium e.g., 1%, 2% and 5% for a powder that does not undergo a subsequent synthesis step, and sometimes 10% to 15% to 25% for powders that do undergo a subsequent synthesis step to make a composite powder. The Li:Mn ratio is highly tunable down to a precision of 0.1% on an atomic basis, which can be critical to the performance of the final product. The average specific surface area of the powders may range from 2 $m^2$/g to 50 $m^2$/g, depending on flame vs. plasma spray technique, and subsequent processing steps. For fast-charging battery materials, higher surface areas are desirable, but require additional interfacial tailoring using one or more pre-treatments, surface coatings or post-treatments described herein. Flame spray materials tended to form lower tap density (0.2 g/cc to 1.5 g/cc) and plasma spray materials tended to form higher tap density (0.5 g/cc to 2.5 g/cc) powders. Although various examples are described herein in the context of $Li_2MnO_3$, it will be understood that materials can beneficially have different elemental ratios that enhance subsequent processing steps or produce a final material.

Some of the $Li_2MnO_3$ powders are subjected to pre-treatment which includes e.g., an annealing step or exposure to a molecular species that improves the intrinsic properties of the starting core powder (e.g., crystallinity, purity, homogeneity, atomic ratios), or the extrinsic properties (e.g., metal:oxygen ratio) of the surfaces, or treatment for formation of atomic gradients throughout the outer layers of the powders, morphology, secondary aggregation. These treatments can be conducted in an inert environment (e.g., $N_2$, Ar, He), beneficially include reducing species such as $H_2$, CO, alkylaluminum, alkyllithium, alkylboron, $NaBF_4$, formic acid, thiosulfates, oxalic acids, and the like, and carried out in a gaseous or liquid state. In some batches, solid state reactions were deployed by blending the $Li_2MnO_3$ powders with a solid inorganic or polymeric powder (e.g., $Li_2S$, $Na_2S$, PVDF, PTFE, ULTEM, PEI) to allow for the beneficial transfer of elements from one species to the other, at elevated temperature and in the appropriate gaseous environment.

The synthesized and pre-treated $Li_xMn_yO_z$ powders are introduced into the appropriate surface modification chamber designed to apply coatings onto powders using gas solid reactions. Fully-continuous, semi-continuous and batch fluidized bed atomic layer deposition systems are deployed to deposit nanoscale inorganic coatings. Any of the suitable precursors described herein can be used to deposit a metal center, which can further be converted into an oxide, nitride, sulfide/sulfate, phosphide/phosphate, halide or simply be reduced to a metallic species. In the present examples, ZnO, $Al_2O_3$, $TiO_2$, $Nb_2O_5$ and $WO_3$ are applied to the five batches synthesized from each production method. These materials are selected for their intrinsic properties, known utility for use in combination with battery materials, as well as to explore a range of atomic radii and oxidation state materials (e.g., ranging from +2 through +6).

$Li_{2.25}MnO_3$ nanopowder having a specific surface area of 25±5 $m^2$/g is synthesized and annealed at a temperature of 375° C. for 4 hours in a dry air environment. The powder is subsequently transported into a semi-continuous ALD reactor equipped for $TiO_2$ deposition. Alternating exposures of $TiCl_4$ and $H_2O_2$ are used to deposit between 200-5,000 ppm of $TiO_2$ directly onto the surfaces of primary nanoparticles. The material is then transported into another system configured for synthesizing materials, and mixed with salts containing Ni, Mn and Co in an appropriate metal ratio to produce material that is commonly referred to as lithium manganese rich NMC (LMR-NMC). The materials having appropriate stoichiometry (ranging from 30-50 atomic percentage of $Li_2MnO_3$ to NMC) are used to synthesize composite materials, which when produced using conventional co-precipitation techniques, exhibit both substantial voltage fade with cycling (i.e. an intrinsic property) and capacity fade with cycling (i.e. an extrinsic property). It has been discovered that the ALD layers that effectively become immobilized 'inside' the powders homogeneously are sufficient to reduce the intrinsic degradation of the composite materials (about 10% lower, about 50% lower or about 100% lower). The actual or projected voltage fade trend may fall to 20% after 50 cycles, after 250 cycles, and with some tailored compositions, after 1,000 to 3,000 cycles.

The powders are then transported to an atomic layer deposition reactor designed to apply $Al_2O_3$ coatings onto the surfaces of the internally-modified LMR-NMC powders. Depending on the final free lithium content, between 2-20 ALD cycles can be used to apply highly uniform coatings ranging from 0.1 nm to 20 nm. Thicker coatings are observed in cases where there is substantial free lithium with which the ALD precursors can react beyond a traditional surface site limited model. With ALD post-treatments, it has been discovered that the ALD layers that effectively immobilize the surface layers homogeneously are sufficient to reduce the combined intrinsic and extrinsic degradation of the composite materials (about 10% lower, about 50% lower or about 100% lower). The actual or projected voltage fade trend may fall to 20% after 50 cycles, after 250 cycles, and with some tailored compositions, after 1,000 to 3,000 cycles. The immobilized surface layers can be the outermost atomic surface or a shell comprised of 10 to 100 atoms that penetrate inward into the secondary aggregated particle species. Initial capacities may exceed 300 mAh/g, sometimes 275 mAh/g, commonly 250 mAh/g and typically always above 235 mAh/g.

The synthesized composite particles can be produced in discrete unit operations or directly connected for in-line processing for efficient and streamlined manufacturing. Some of the powders are subjected to post-treatment step, e.g., humidification, annealing (in oxygen, dry air or 20% oxygen with balance nitrogen), post-lithiation (via exposure to a lithium-containing precursor to produce a lithiated ALD coating), or exposing a precursor source designed to apply a capping layer of a fluoride, phosphate or sulfate species (that effectively prevents moisture migration during operation).

Different 'inside' ALD cations can be used to further modulate the initial capacity, crystallite size, power density, conductivity or resistivity when measured in powder or electrode form, the fade rate, or other critical measurable aspects of the powders that relegate materials for applicability into different types of batteries, applications or markets (by 5%, 10%, 20% or 35%). The 'internal' ALD layers can be used to completely and homogeneously deliver a beneficial inorganic dopant to the powders; on another hand, or they can be employed to directly tune any intrinsic feature of a battery material (e.g., anode, cathode, electrolyte, conductive additive, separator, binder, and the like), or modify any powder with an intrinsic degradation mechanism that is deployable in any application. The method can be used to produce engineered composite particles designed for high energy, maximum operational efficiency and ultra-low cost. Using the method, analogous battery materials which include starting materials of $Li_2S$, elemental sulfur, lithium, silicon and other materials can be synthesized and used to produce powders for superior lithium-sulfur batteries. Analogous materials in using Na or K in place of lithium-based precursor or material can be to produce high performance powders for sodium-ion and potassium-ion batteries. High performance, air/moisture stable solid electrolyte materials (e.g., LPS, LXPS where X could be a Group 14 metal, garnets, LLTO, LLZO, LiPON, etc.) can also be synthesized using this sequential process, thus allowing cost-effective manufacture of emerging solid-state batteries.

Example 2

Manufacturing of High Performance Oxidation-Resistant Metal Powders

Three batches of copper nanoparticles and three batches of nickel nanopowders were synthesized using a plasma spray process, producing spherical metal powders with a d50 in the 50-80 nm range. Each batch of synthesized powder was transported in an inert environment to an ALD system without exposing the metal powders to ambient conditions. Between 5 and 50 ALD layers of $TiO_2$ (or $ZrO_2$) were applied to each powder using precursors selected from the aforementioned list. In one embodiment, in order to avoid sintering issues the initial process cycles comprised alternating exposures of $TiCl_4$ and $H_2O_2O$ (or $H_2O_2$ or $O_3$) at temperatures ranging from 60-120° C. After 5 or sometimes 10 of these $TiO_2$ cycles, the temperature was increased to be able to transition from an oxide coating to a nitride coating. This was carried out by using $TiCl_4$, TEMAT, TDMAT or TDEAT alternating with either $NH_3$ or $N_2H_4$ or a nitrogen-containing plasma. However typically when $TiCl_4$ and $NH_3$ are used as precursors, the presence of residual chlorine can approach 1-2 wt % depending on processing conditions. Alternative to TiN, $ZrO_2$ or $Zr_3N_4$ are also produced to test the effect of the various coatings have on an end-use system such as for co-fired inner electrodes in a multi-layered ceramic capacitor. After production of each 'core-shell-shell' powder (i.e. one that comprises a TiN shell coated onto a $TiO_2$ shell coated onto Ni or Cu), a post-treatment step was found to be beneficial to minimize the presence of residual halide species in the coating (or carbon byproducts if alkylamine precursors are used). One post-treatment option was to thermally treat the powders in an inert environment or in a weakly or strongly reducing environment. Annealing temperatures from 300-500° C. for 1-10 hours helped to reduce the residual chlorine content below 1%, sometimes below 0.5%, typically below 0.25%, and occasionally down to an undetectable level. Depending on the time and temperature used, the powders sometimes began to sinter slightly, increasing the d50 particle size to 100 nm, 200 nm, and sometimes up to 500 nm, which can begin to be undesirable for end-use functionality. Rather than conventional annealing processes, some powders were subjected to an ultra-fast plasma spray process that is operated at a material flux that is able to promote the purification and cleansing of the shell(s), without a sufficient energy flux to melt or otherwise degrade the core substrate materials. The resulting materials were produced with an undetectable amount of impurity present in the coatings. The performance was further verified using thermogravimetric analysis, which proved that the materials are resistant to oxidation in air to at least 400° C., typically 500° C., sometimes 600° C., occasionally 850° C., and for certain combinations of relatively thick, conductive shells, up to 1,000° C.

Example 3A

Effective Delivery of Challenging Precursors to Powder Surfaces in a Saturating Regime $TiO_2$ particles (10 kg) having a surface area of approximately 5.0 m²/g is transported into a reservoir of coating subsystem 301 after a pre-treatment process carried out in a treatment subsystem 201, which prepares the approximate 50,000 m² of surface area for an Atomic Layer Deposition coating process. The intended coating process is Palladium, comprising exposures of a Palladium hexafluoroacetylacetonate (Pd-HFAC) and Formalin. Pd-HFAC is loaded into a chamber 810 of one embodiment of a transport enhancer 800. Extruded 0.16" packing previously pre-treated with Atomic Layer Deposition coating cycles is used as packing media 808. The large surface area is made more effective by the enhanced wettability and/or increased adsorption capacity due to the ALD coatings, which allows for efficient mass transfer between the liquid and vapor phases. The surface area is approximately 576 square feet per cubic foot for the 0.16-inch size (which is optionally replaced with a 372 square foot per cubic foot, 0.24-inch size packing material in a subsequent experiment). The packing factor is 693 for the 0.16-inch size (and 420 for the 0.24-inch size). High free space is especially important in vacuum distillation (for reduction of pressure drop) and in extractive distillation and absorption (where high liquid or vapor loading is common), which is the system that is emulated by this particular embodiment of transport enhancer 800. This particular packing material is selected for its high free space (94% for the 0.16-inch size (and 96% for the 24-inch size). To effectuate efficient precursor delivery, coating chamber 302a is pumped down to rough vacuum conditions (<10 Torr), synchronously with the automated filling of precursor vessel 801 with a solution comprising a sufficient quantity of Pd-HFAC to saturate the surfaces of the powder to be coated in coating subsystem 301, for which the properties are delivered from electronic database server 363 through common signal hub 360 to the control ports 315 and treatment enhancer 800. Vaporizer chamber 810 is subsequently evacuated and purged by passing an inert gas through valve 802b and distributor plate 809, while valved delivery assembly 805 is configured to accommodate the appropriate levels of flow. Valved Delivery Assembly 805 is subsequently configured to create an appropriate voidage space in Precursor Volume Controller 804, for which the common signal hub 360 sets the target point based on the contents and objectives (e.g., saturation level, amongst other considerations) of coating subsystem 801 and transport enhancer 800. Once common signal hub 360 identifies that the conditions and criteria are suitable to achieve the objectives, via one or more of Signal Connectors 806 and 807, Valved Delivery Assembly 805 is configured to allow the appropriate volume of precursor to flow from 804 into Vaporizer Chamber 810, which allows the precursor to adsorb onto some of the surfaces of Packing Media 808. common signal hub 360 then actuates a first actuation mechanism on coating subsystem 301 (or 302, 302a, 302b, 401, 402, 402a, 402b, etc.), synchronously with actuation mechanisms on one or more of 802a, 802b, 803 and 812, which in aggregate can be configured for use as either a valve assembly or a Pump Assembly controlled by common signal hub 360, thus allowing the efficient delivery of Pd-HFAC to saturate a predetermined percentage (in this example, 100%) of the 50,000 $m^2$ of powder surface area loaded into coating subsystem 301.

Example 3B

Effective Delivery of Challenging Precursors to the Surfaces of Flowable Objects in a Sub-Saturating Regime In a separate series of trials, the $TiO_2$ powder from Example 3A is replaced with catalyst pellets (or extrudates) comprising aluminum oxide, having a surface area of ~150 $m^2/g$. The volumes of the chambers within coating subsystem 301, precursor vessel 801, precursor volume controller 804, vaporizer chamber 810 are configured appropriately based on information stored within database 363. Packing media 808 is exchanged for a larger quantity of higher surface area substrate, to account for the increased total surface area in this example. In these trials, target loadings of 200, 400, 600, 800 and 1,000 ppm of Pd are desirable to achieve, down-select and/or optimize the end-use properties of the composite materials being produced. The synchronous procedure of Example 3A is again followed, allowing for time-constant adjustments based upon the differences in volumes and surface areas contained within the entire system. During each sub-saturating exposure, the appropriate amount of Pd-HFAC is again delivered to the surfaces of the substrate within coating subsystem 302, via the synchronous actuation of valve mechanisms on both coating subsystem 301 and transport enhancer 800. After each trial, the material is removed and evaluated for Pd ppm content using an inductively coupled plasma system, which is then entered into electronic database server 363, and defining a trial series. The five trials within trial series 1 are completed and evaluated for loading at the same time. For each target loading, the experimental results for actual Pd deposited is shown in the Table 1 below. The subprocesses executed (369) in Trial Series 1 resulted in loadings that are higher than the target loadings for these materials, as shown in Table 1, which exemplifies one of many potential direct, ex-situ signal monitoring subprocess outcomes 372, which are inserted into subprocess model deviation calculator 374. These results are fed into critical signal setpoint calculator 365, via machine learning algorithm 376, while selecting one or more critical setpoints to adjust (typically further benefitting from additional historical processes on a wide array of materials). Trial Series 2, comprising subprocesses with different critical set points, is then carried out based in part upon the outcome of Trial Series 1. The outcome of Trial Series 2, also shown in Table 1 below, yielded loadings that fell within the targets at low loadings, but progressively increased in measured loading with increased target loadings, which exemplifies the unexpected challenges associated with delivering difficult precursors to the surfaces of high surface area powders or flowable materials. Clearly there is a non-linear adjustment that is required when designing processes for sub-saturating regimes, which can include modulation of two or more of volumes, masses, total surface areas, pressures, temperatures, actuation mechanism rates, exposure/dwell times, etc. Fortunately, it has been determined that though complex, machine learning can effectively become predictive of methods and mechanisms to overcome this unexpected non-linear behavior, which leads to minimizing processing times (or maximizing production rates) for composite materials that achieve a functional end-use property. To exemplify this, Trial Series 3 is carried out in which the critical signal setpoints are adjusted non-linearly, allowing the higher loading samples to fall within the specified loading targets, thus achieving the objectives of the overall system.

TABLE 1

Pd Loading (parts per million) over three series of trials, for each target loading point

| Target Pd Loading (ppm) | Trial Series 1 (Pd ppm) | Trial Series 2 (Pd ppm) | Trial Series 3 (Pd ppm) |
|---|---|---|---|
| 200 | 261 ± 35 | 181 ± 27 | 180 ± 31 |
| 400 | 455 ± 16 | 397 ± 21 | 395 ± 17 |
| 600 | 647 ± 32 | 615 ± 30 | 599 ± 21 |
| 800 | 859 ± 26 | 822 ± 17 | 802 ± 9 |
| 1,000 | 1,068 ± 19 | 1,041 ± 28 | 1,011 ± 15 |

Example 3C

Effective Delivery of Challenging Precursors to the Surfaces of Flowable Objects In another series of trials, the $TiO_2$ powder from Example 3A was replaced with lithium ion battery cathode powders comprising lithium, nickel, cobalt, aluminum and oxygen, having a surface area of ~0.7 $m^2/g$. The desired coating was an aluminum phosphate (AlPO) material, where the ratio between the aluminum and phosphorous (Al:P) was measurable and controllable, and one or more precursors comprises an alkoxide-like ligand. The volumes of the chambers within coating subsystem 301, precursor vessel 801, precursor volume controller 804, vaporizer chamber 810 were configured appropriately based on information stored within database 363. Packing media 808 was selected to align with the total surface area in this example. Approximately 2,200 grams of powder was loaded into coating subsystem 301, while trimethylaluminum (TMA) and trimethylphosphate (TMPO). In these trials, target loadings of adding ~50 to 300 ppm of aluminum, and Al:P ratios from 1:1 to 4:1 were desirable to achieve, down-select and/or optimize the end-use properties of the composite materials being produced. The synchronous procedure of Example 3A was again followed, allowing for time-constant adjustments based upon the differences in volumes and surface areas contained within the entire system. During each exposure, the appropriate amount of TMA was delivered to the surfaces of the substrate within coating subsystem 302, via the synchronous actuation of valve mechanisms on both coating subsystem 301 and transport enhancer 800 maintained at a delivery temperature of 30° C. Subsequently and synchronously, the appropriate amount of TMPO was delivered to the surfaces of the substrate within coating subsystem 402, via the synchronous actuation of valve mechanisms on both coating subsystem 401 and transport enhancer 800 maintained at a delivery temperature of 90° C. After each run, the material was removed and evaluated for Al and P ppm content using an inductively coupled plasma system, which was then entered into electronic database server 363, and defining a trial series. Four runs within Trial Series 1 were completed and evaluated for loading at the same time, using a set of four cycle numbers (2, 4, 6 and 8) and an operating pressure of ~15 Torr. Four runs within Trial Series 2 were completed and evaluated for loading at the same time, using the same set of four cycle numbers (2, 4, 6 and 8), but an operating pressure of ~20 Torr. For each target loading, the experimental results for actual Al and P deposited are shown in the Table 2 below. The subprocesses executed (369) in Trial Series 1 resulted in aluminum loadings that achieved the linear target loadings for these materials (Table 2), which demonstrates that subprocess model deviation calculator 374 can function properly even when the difference between the target loadings and actual loadings were very close. These results were again fed into critical signal setpoint calculator 365, via Machine Learning Algorithm 376, while selecting one or more critical setpoints to adjust (typically residence time and/or one or more actuation mechanism parameters). Trial Series 2, comprising subprocesses with different critical set points, was then carried out based in part upon the outcome of Trial Series 1. The outcome of Trial Series 2, also shown in Table 2 below, demonstrated the ability for the system to maintain the loadings of aluminum from Trial Series 1, while decreasing the Al:P ratio, which demonstrates how machine learning can be used to overcome challenges associated with delivering one difficult precursor to the surfaces of high surface area powders or flowable materials, while not disrupting or adversely affecting the delivery of one or more less difficult precursors to the surfaces. It has been determined that though complex, machine learning can effectively become predictive of methods and mechanisms to overcome this unexpected non-linear behavior, which leads to minimizing processing times (or maximizing production rates) for composite materials that achieve a functional end-use property. The materials were prepared into full coin cells to evaluate their electrochemical performance. In some cases, materials with an Al:P ratio from 1.1 to 1.3 exhibited more than a 20% increase in cycle life, rate capability and/or calendar life. In other cases, Al:P ratios from 1.5 to 2.2 exhibited more than a 20% increase in cycle life, rate capability and/or calendar life of at least 10° C. above room temperature, 0.1 V over standard operational potential (typically 4.2 Volts), or both. In some cases, increasing the number of ALD cycles (6, 8, 10, 12, 14 or 16 cycles) while maintaining a low Al:P ratio of aluminum phosphate (0.9:1 to 1.2:1) provided for at least 30% improvement, often times 50% improvement, and sometimes 80% improvement or more. Each of these results was stored in electronic data server 363, such that future materials that were designed for superior rate capability, temperature performance, cycle life, calendar life, etc., can begin the design process with an advanced parameter space as determined by Machine Learning Algorithm 376.

TABLE 2

| Al and P Loading (parts per million) over two series of trials of 2-8 ALD cycles | | | | |
|---|---|---|---|---|
| Number of Cycles | AlPO Trial Series 1 | | AlPO Trial Series 2 | |
| | Al ppm | Al:P ratio | Al ppm | Al:P ratio |
| 2 | 62 ± 5 | 1.8:1 | 66 ± 4 | 1.1:1 |
| 4 | 130 ± 8 | 2.1:1 | 141 ± 11 | 1.3:1 |
| 6 | 177 ± 9 | 2.2:1 | 193 ± 8 | 1.2:1 |
| 8 | 244 ± 11 | 1.9:1 | 284 ± 15 | 1.3:1 |

Example 3D

Effective Delivery of Precursors to the Surfaces of Flowable Objects Using Liquid Injection In another series of trials, the same lithium ion battery cathode powders comprising lithium, nickel, cobalt, aluminum and oxygen of Example 3C were used, having a surface area of ~0.7 $m^2/g$. The desired coatings were a titanium dioxide material, using the alkylamide precursor tetrakis-dimethylamido titanium (TDMAT). The volumes of the chambers within coating subsystem 301, precursor vessel 801, precursor volume controller 804, vaporizer chamber 810 were configured appropriately based on information stored within Database 363, which was pre-optimized based on the results of Example 3C. Packing media 808 was also the same as was used in Example 3C. Transport enhancer 800 was also modified to accommodate the delivery of a liquid into coating subsystem 302, which can accommodate the phase change of the liquid to a vapor, to utilize as an alternative to vaporizer chamber 810. Two Trial Sets each consisting of four runs (1-4 TDMAT+$H_2O$ cycles each) were carried out using two different precursor delivery strategies. After each run, the material was removed and evaluated for Ti ppm content using an inductively coupled plasma system, which was then entered into electronic database server 363. For the direct liquid injection approach, a two-foot heating tape was attached to the delivery line on transport enhancer 800, which was further outfitted with a syringe pump to deliver a controlled amount of material into coating subsystem 302. The precursor system was allowed to preheat to the desired set point temperature for at least one hour. The set point temperature, tubing size, syringe parameters and precursor tare weight were loaded into Machine Learning Algorithm 376. Prior to injection of the liquid into transport enhancer 800, the system was pumped down to full vacuum. A predetermined amount of liquid was administered into coating subsystem 302, using one or more injection periods to accommodate the total surface area to be coated in the process. Synchronous actuation of the delivery pump and the control valve(s) was required to properly maintain control over the molar quantities delivered to coating subsystem 302. The actual pressure of coating subsystem 302 was monitored in real time, which provides visibility to the effect of the vaporizing liquid within the coating subsystem. Once the pressure has equilibrated, the process proceeds as normal. The overall loading results from the two different approaches were similar (~90-100 ppm of Ti per cycle), although the overall process time per cycle was typically lower for the direct liquid injection process approach. The overall process time was similar when the volume of the chambers in Coating System 301 were 10-20% filled, whereas further benefits could be observed when the chamber was filled to 30% or greater. Process time reductions of 10-36% were achieved with different combinations of total surface area and chamber volume.

Example 3E

Effective Delivery of Nitrogen-Containing Precursors to the Surfaces of Flowable Objects In another series of trials, the same lithium ion battery cathode powders comprising lithium, nickel, cobalt, aluminum and oxygen of Example 3C are used, having a surface area of ~0.7 m²/g. The desired coatings are an array of various metal oxide and nitride materials being derived from alkylamine precursors from amongst the non-limiting list of precursors described herein, and the coatings or the substrate/surrogate particles used herein. Precursors that could be delivered effectively in the vapor phase are delivered using either the vapor phase or a direct liquid injection approach; precursors that could not be delivered effectively in the vapor phase are delivered using a direct liquid injection approach only in these trials. Tris(diethylamido) aluminum and anhydrous ammonia are used to deposit AlN coatings; Tris(dimethylamido)antimony(III) and $H_2O$ (or alternatively $O_3$) are used to deposit antimony trioxide coatings; tris(dimethylamido)gallium and ammonia or $H_2S$ are used to deposit gallium nitride and gallium sulfide, respectively; tetrakis(diethylamido) hafnium (IV) and water are used to deposit hafnium oxide coatings; TDMAT, $H_2O$ and either triethylboron ("TEB") or triisoproyplborate are used in a sequence to produce a boron-doped $TiO_2$ coating (with a B:Ti ratio of 0.1:1, 0.2:1, 0.3:1, 0.4:1, 0.5:1, 0.6:1, 0.7:1, 0.8:1, 0.9:1 and 1:1, by varying the number of moles controllably administered to Coating Systems 301 and 401); lithium trimethylsilylamide is used alternately with an array of precursors including TMPO, TDMAT, TMA, niobium isopropoxide, and TEB, to produce lithium phosphate, lithium titanate, lithium aluminate, lithium niobite, and lithium borate, respectively, as well as combinations thereof; tris(ethylmethylamido)tert-butylimido) tantalum(V), TDMAT and $H_2O/O_3$ are used to produce Tantalum-doped titanium oxide coatings; tetrakis(dimethylamino)tin(IV) and $H_2O$ or $H_2S$ are used to deposit tin oxide and tin sulfide, respectively; and tetrakis(dimethylamido)zirconium (IV) and $H_2O$ are used to deposit zirconium oxide coatings on battery materials.

Example 4

Composite Material Synthesis in the System of FIG. 5

A composite powder is produced using the system analogous to that depicted in FIG. 5, at a target capacity of 5 kilotons per year. A micron-sized metallic powder substrate having a tap density of 2 kg/L is fed continuously into a hopper 104, which then feeds powder first into a pretreatment subsystem 201 executing a thermal treatment in a reducing environment (here 4% $H_2$ in $N_2$), followed by a coating subsystem 301 executing a sequential vapor phase molecular grafting process to apply a two-member block co-polymer coating. A production rate of 694 kilograms per hour is suggested by the common signal hub 360, for a stream time of 300 days per year and a residence time per chamber of 15 minutes. For this particular process, an inner diameter of 36 inches filled to a 4.0% V/V fill ratio of a 2,170 L tube is used, configured for processing an equivalent of 0.8 supersacks per hour. In the first Pretreatment Subsystem 201, the reducing gas is administered continuously to a rotating bed moving at an average rate of 10 kg/hr for a treatment time of approximately 2.0 hours, which is found to be sufficient in previous runs to minimize and/or remove a native oxide from the surfaces of a similar metallic powder having a similar surface area. Subsequently, the material is moved into a coating subsystem 301 such that a first precursor could be grafted onto the surfaces of the metallic powder in coating subsystem 302a, followed by a second precursor grafted onto the first polymer through a chemical process. In this example, a cyclic olefin copolymer (COC) is produced as a moisture barrier and to render the surfaces of the metallic particle to be biocompatible, having a high purity with low extractable content. Not shown in FIG. 5 are additional coating subsystems with which to apply additional coating layers, which results in a coated particle having a COC shell of tunable coating thickness. COC coating thicknesses of 1.0, 2.0, 3.0, 5.0. 7.5 and 10.0 nm are applied to metallic particles, to produce chemically-resistant metal powders with unaffected optical properties, however alternate substrates can be easily coated in this system with one or more COCs, alternative polymeric coatings, or non-polymer coatings. Additionally, a subsequent treatment subsystem 501 can be deployed to tailor the properties of one or more deposited coating layers.

Example 5A

Composite Material Synthesis in the System of FIG. 7

A flowable composite material is produced using the system analogous to that depicted in FIG. 7, in which a mixed metal oxide nanopowder is synthesized in a synthesis subsystem 101, followed by a pretreatment subsystem 205, and coated with a first ALD coating (302) followed by a second ALD coating (402). In this system, sized for a 5 kiloton per year capacity, the continuously synthesized substrate is pre-treated with a silane-based molecule at elevated temperature in a weigh batching system, prior to entering coating subsystem 302a via valve assembly 311. A first actuation mechanism in valve assembly 311 is in electrical communication with at least one pressure sensor in pretreatment subsystem 205, which indicates when the pretreatment subprocess is complete. The common signal hub 360 controls the first release of the vapor phase, followed by the transport of the solids phase into the coating subsystem. A pretreatment time of 20 minutes is used for this material, followed by a 20-minute purge and/or drying step. The flowable material is charged into chamber 302a, upon which a mechanical fluidization process is administered using mixing internals 321. The chambers in this particular embodiment can be operated in batch/static, semi-continuous/intermittent or pulse-wise, or in a fully continuous mode. In this case, a static option is selected with a direct liquid injection precursor administration system, based on the particular physiochemical nature of the substrate and the coating materials. Upon flash evaporation of the precursor, the powder and reactive precursor is mixed in an aerated state with constant mechanical fluidization for 20 minutes. Subsequently, after a 10-minute evacuation and 5-minute powder transport step, the nanopowder is subjected to a second precursor for a 55-minute static exposure period in Subsystem 302b. The coated powder is then conveyed into a holding/surge tank at the top of coating subsystem 401. At this point, this sub-batch of material is situated and prepared for charging into coating subsystem 402a via valve assembly 411, and a second identically-sized sub-batch of material is prepared for charging into coating subsystem 302a via valve assembly 311, defining two consecutive subsystems of the present technology. A first actuation mechanism in valve assembly 411 is actuated synchronously with a first actuation mechanism in valve assembly 311, upon which precursors are administered to subsystems 302a and 402a, via 704a and 704b, respectively. Common signal hub 360 monitors and controls each step of each subprocess being carried out within each subsystem simultaneously, while able to continuously monitor all in-situ signals and predict subprocess model deviations accordingly.

Example 5B

Scaled Up Composite Material Synthesis in the System of FIG. 7

With a demonstrated process capability at a 5 kiloton per year capacity as described in Example 5A, this process is also emulated at a 50 kiloton per year capacity in a similar layout and configuration using the model predictive controls associated with the machine learning algorithm 376. 50 kilotons of powder are simulated in a system configured for synthesizing and coating materials to produce composite articles, at a production rate of 6,944 kg/hr in a reactor size of 4,416 gallons. Machine learning algorithm 376 receives critical inputs 364 for this material set and sets the scheduling/frequency and rate of valve actuation mechanism X (367) and valve actuation mechanism X+1 (368) for subsystem 301 and subsystem 401. Based on the critical parameters, a powder loading time of 60 minutes is emulated, having a sequence (with calculated step times) for: evacuation/pre-heating (45 min), drying (20 min), first precursor exposure (20 min), first precursor purge (20 min), transport (30 min), second precursor exposure (100 min), second precursor purge (20 min) and a final pressurization and transport (75 min) to the subsequent subsystem.

Comparative Example 1

Composite Material Synthesis in the System Described by King et al. (U.S. Pat. No. 9,284,643, "the '243 Patent")

A semi-continuous vapor-phase coating system similar to one taught by the '243 patent was used to apply an aluminum oxide coating onto boron nitride particles having a surface area of ~3.0-3.4 $m^2/g$, at various sub-batch quantities. In such a system, a valve unit with only one actuation mechanism was interposed between the powder reservoir and the reactive precursor reservoir, the valve unit operable between an open and a closed position such that the powder reservoir was isolated from the reactive precursor reservoir when the valve unit was in the closed position but when the valve unit was in the open position, the powder reservoir was in communication with the reactive precursor reservoir such that a reactive precursor contained within the reactive precursor reservoir can flow into the powder reservoir and a powder contained within the powder reservoir can fall into the reactive precursor reservoir. This valve unit also establishes a constricted flow path of reactive precursor(s) from the reactive precursor reservoir to the powder reservoir, creating a spouted fluidized bed for a time period that was based upon the geometry of the system, the physicochemical properties of the substrate materials, and the properties of the reactive precursor(s). With boron nitride, a solid lubricant, the ability to create and sustain a spouted fluidized bed can be challenging, as pockets of reactive precursor can slip past pockets of boron nitride powders without adequately exposing all surfaces. This unexpectedly resulted in a limitation to the quantity of material that could be processed and reduced the overall throughput. One way to overcome this issue was to incorporate mixing internals 321 into chamber 302a and 302b, which provides enhanced gas-solids mixing at the constricted flow path, such as what has been incorporated into the subsystems of FIG. 9. However, it was discovered that by incorporating a second actuation mechanism in each valve assembly, where a first actuation mechanism that largely controls the transport of the gas phase, and a second actuation mechanism that largely controls the transport of the solids phase, each could be individually actuated in such a manner to maximize mixing in each region of a subsystem. Not only was this beneficial to maximizing the process efficiency within a particular subsystem, but unexpectedly, there were particular efficiencies (one or more of precursor delivery, exhaust capture, separation or reclamation, pump/vacuum throughput, process time reductions, etc.) that could be leveraged when actuating at least one actuation mechanism from one subsystem, synchronously with at least one actuation mechanism from a different subsystem, which benefits from a control system that is in electronic communication with all actuation mechanisms via a common signal hub, to ensure synchronous actuation. ICP data is shown for the measured aluminum content in Table 3 below. Based on these results, when processing between 2-10 kilograms of materials, the resulting loadings obtained from the two systems fell within the standard error of one another. However, when increasing the sub-batch size to 50 and 100 kilograms, the measured deposition content reduced with increasing batch sizes, which demonstrates that having more than one actuation mechanism can improve processing efficiencies. Additional data points are generated using this process.

TABLE 3

Aluminum content applied to a range of sub-batch sizes of Boron Nitride particles in the system of the present technology having a valve assembly with two actuation mechanisms, versus a comparative system having a valve assembly with only a single actuation mechanism.

| | ICP-OES Aluminum Content | |
|---|---|---|
| Processing Quantity (kg) | Current System (two actuation mechanisms) | Comparative System in the '243 patent (one actuation mechanism) |
| 2 | 926 | 910 |
| 5 | 936 | 923 |
| 10 | 917 | 907 |
| 50 | 941 | 825 |
| 100 | 963 | 761 |

Comparative Example 2

Composite Material Synthesis in the System Described by Liebsch et al. (WO2018019627, "the '627 Application")

A semi-continuous vapor-phase ALD coating system is constructed based on the teachings of the '627 application. Such a system is identical to one taught by the '243 patent, apart from the requirement to have at least one buffer device located between the first and second reactors. Operating such a system without the use of the buffer device is deemed to be sufficiently analogous to the apparatus and process described in Comparative Example 1. The system of the '627 application was used to apply an aluminum oxide coating onto lithium metal oxide battery materials having a surface area of 0.7 m$^2$/g, and at various sub-batch quantities. The '627 application also teaches particles can be conveyed from a first reactor to a second reactor through a first valve assembly, wherein the valve assembly includes a first valve unit (gas lock) having only one actuation mechanism, and a second valve unit (gas lock) having only one actuation mechanism, are interposed between the first and second reactors. The '627 application and the '243 patent teach that particles can be recirculated back through the semi-continuous ALD coating apparatus to increase the number of ALD cycles that can be provided in a given tool footprint. The only difference being a buffer device, the valve assembly of the '243 patent was modified to include the buffer device of the '627 application and a diverter valve. This apparatus was operated in accordance with the process of the '243 patent (without diverting powder to a buffer device) and the '627 application (with diverting powder to a buffer device). The apparatus of both the '243 patent and the '627 application were found to have a practical limit to the fraction of the coating chamber volume that could be filled with powder, which is attributed to reduced mixing efficiency with the valve assembly with a first and second valve (or gas lock) having only one actuation mechanism. The larger valve assembly of the '627 application, which further required a similarly sized diverter valve and buffer device was able to achieve a slightly higher volume fill fraction, solely due to the extended mixing region in the larger valve assembly. However, the capital cost of such a larger valve assembly having an additional diverter valve and buffer device was approximately three times larger than the apparatus of the '243 patent. Furthermore, though the fill fraction was larger for the apparatus of the '627 application, the additional time required to fill and empty the buffer device led to a substantial reduction in net particles coated per time. At increased production weights, the single actuation mechanism of the diverter valve was insufficiently strong to divert 100% of the material to the buffer device, and as such, sometimes between 5-20% of the material bypassed the buffer device and was delivered to the subsequent chamber prematurely (however this fraction effectively continued to follow the process of the '243 patent rather than the '627 application). Two further drawbacks of the apparatus of the '627 application are a) the inefficient purging of material from the buffer device once the process was resuming; and b) the loss of the spouted fluidized bed action (due to the presence of the additional diverter valve and buffer device in or adjacent to the flow path) when the material was transported through the valve assembly of the '243 patent. The inefficient purging became evident after passing the particles through 20 times, to apply 20 ALD cycles. Typically, between 2-15% of the material being process was held up in the buffer device after each ALD cycle. Since ALD is a sequential process, material that is held up in such a buffer device will not receive the subsequent coating treatment, and the effective growth rate suffers. Additionally, subsequent apparatus conditioning is required to remove the final material from the buffer device, which reduces up-time and overall production rates. The loss of the spouted fluidized bed action reduced the ability for mixing to occur efficiently, which was exacerbated when the fill volume of the apparatus of the '627 application was less than 50%. This was overcome to some degree by increasing the amount of reactive precursor delivered to the powder in the first reactor, however this led to an increase in precursor costs by 100-150%. The material produced using the apparatus of the '243 patent, relative to the material produced using the apparatus of the '627 application, had i) less variability in aluminum loading; ii) higher precursor efficiency; iii) reduced maintenance and downtime; and iv) substantially lower operating and capital costs.

However, relative to the apparatus of the present technology having valve or pump assemblies with two or more actuation mechanisms (which do not substantially increase the capital costs relative to valve assemblies with one actuation mechanism), overcame the deficiencies of each apparatus of the '243 patent the '627 application. The materials produced in the apparatus of the present technology are superior in production rate, quality and cost, and the apparatus of the present technology has higher uptime, lower maintenance costs and higher attainable throughput. Furthermore, the apparatus of the present technology can be configured to operate in a semi-continuous or continuous mode, as desired and/or recommended by machine learning algorithm 376. Furthermore, batch recirculation strategies can be more uniformly deployed without risking a reduction in production rate and quality as was observed in the apparatus of the '627 application.

What is claimed is:

1. A method, comprising:
   providing a target quantity, mass, or unit volume of a plurality of flowable articles having a specific surface area to a first chamber of a surface treatment system via a first valve fluidly coupled to a first solids phase inlet of the first chamber, the first valve
       configured to effectuate a first surface treatment reaction by contraction, and
       configured to sequentially cause transport of the plurality of flowable articles by rotation;
   first, entering the specific surface area into at least one control system of the surface treatment system;
   second, entering a nominal target for a quantity, a mass, or a unit volume of the plurality of flowable articles to be processed into the control system, thereby defining a first total surface area target;
   third, providing a reactive precursor with which to treat the surfaces of the plurality of flowable articles, and entering into the control system a specific number of moles of a reactive precursor required to saturate, react with or treat the entirety of the first total surface area target using empirical or estimated process conditions, thereby defining a complete saturation quantity;
   fourth, selecting a target saturation ratio, which is a ratio of moles of the reactive precursor to the complete saturation quantity, to obtain a process recipe for a batch, semi-batch, semi-continuous or continuous surface treatment process, wherein said process recipe comprises at least one target pressure level provided by the control system associated with said target saturation ratio;
   fifth, administering the vapor phase comprising the target pressure level of the reactive precursor to the first chamber and through the first valve to effectuate the first surface treatment reaction by contraction, and sequentially cause transport of the plurality of flowable articles by rotation; and
   wherein the sequence has no time lapse between contraction and rotation, or a time constant between contraction and rotation that scales with the first total surface area target.

2. The method according to claim 1,
wherein the contraction effectuates the transport of said vapor phase, under conditions suitable to effectuate the first surface treatment reaction, while preventing the solids phase from entering said first chamber prior to rotation.

3. The method according to claim 1, further comprising:
prior to providing the plurality of flowable articles into the first chamber, administering a vapor phase comprising a target number of moles of one or more reactive or non-reactive gases or precursors to the first chamber through one or more first vapor phase inlets.

4. The method according to claim 1, further comprising:
synchronously with providing the plurality of flowable articles into the first chamber, administering a vapor phase comprising a target number of moles of one or more reactive or non-reactive gases or precursors to said first chamber through one or more first vapor phase inlets having one or more vapor phase actuation mechanisms, wherein a first vapor phase actuation mechanism effectuates the transport of said vapor phase, under conditions suitable to effectuate a surface treatment reaction, while preventing the solids phase from exiting said first chamber.

5. The method according to claim 2, further comprising:
monitoring the signals from one or more pressure measurement sensors; and
incorporating a unit operation to increase the residence time, allowable mixing time and/or the interdiffusion rate of the gas phase and solids phase of the plurality of flowable articles, until said target pressure level is achieved.

6. The method of claim 1, further comprising:
sixth, transporting the solids phase through a first solids phase outlet of the first chamber to a second chamber of a surface treatment system comprising a second valve assembly configured to cause a first surface treatment reaction by contraction, and configured to sequentially cause transport of the plurality of flowable articles by rotation;
seventh, initiating a second surface treatment process by administering the first surface treated plurality of flowable articles into the second chamber of the surface treatment system; and
wherein the second surface treatment process in said second chamber utilizes one or more of a different reactive precursor, a different operating pressure, a different operating temperature, a different residence time, or different other process parameter than was used for said first surface treatment process.

7. The method of claim 6, further comprising:
characterizing the second surface treated plurality of flowable articles for one or more of: a surface treatment loading, a specific surface area after treatment, or a particle size or size distribution after treatment; and
entering the surface treatment loading, the specific surface area after treatment, and/or the particle size or size distribution into the control system to incorporate machine learning.

8. The method according to claim 1, wherein the first surface treatment process comprises one or more of an atomic layer deposition process, a molecular layer deposition process, a chemical vapor deposition process, a physical vapor deposition process, a molecular layering process, an atomic layer chemical vapor deposition process, an epitaxial deposition process, a chemical grafting process, an atomic layer etching process, an atomic layer corrosion process, an atomic layer combustion process, or a combination thereof.

9. The method according to claim 1, wherein the surface treatment system further comprises a subsystem configured to carry out one or more of a flame spray process, a combustion spray process, a plasma spray process, a spray drying process, or combinations thereof;
wherein the one or more of the flame spray process, combustion spray process, plasma spray process, spray drying process, or combinations thereof occurs prior to the application of the first surface treatment, or after the application of the second surface treatment.

10. The method according to claim 1, wherein the surface treatment system further comprises a subsystem configured to control the nominal value and the rate of change of one or more of i) a treatment pressure, ii) a treatment temperature, iii) a gas phase composition or flow rate, iv) a liquid phase composition or flow rate, v) a solute or solvent composition or flow rate, and vi) a solid phase composition or flow rate.

11. The method according to claim 1, wherein the plurality of flowable articles comprise one or more discrete particles, powders, extrudates, granules, flowable objects, or an object having a largest dimension less than 125 millimeters in size, and wherein the surfaces of at least 75% of said composite articles are coated or treated upon exiting the system.

12. The method according to claim 1, wherein at least one reactive precursor comprises phosphorous, sulfur, nitrogen, carbon, fluorine, chlorine, bromine, or iodine.

* * * * *